(12) United States Patent
Pagani

(10) Patent No.: US 8,479,066 B2
(45) Date of Patent: Jul. 2, 2013

(54) PROCESS FOR MAKING AN ELECTRIC TESTING OF ELECTRONIC DEVICES

(75) Inventor: Alberto Pagani, Nova Milanese (IT)

(73) Assignee: STMicroelectronics S.r.l., Agrate Brianza (IT)

(*) Notice: Subject to any disclaimer, the term of this patent is extended or adjusted under 35 U.S.C. 154(b) by 260 days.

(21) Appl. No.: 13/027,617

(22) Filed: Feb. 15, 2011

(65) Prior Publication Data

US 2011/0202799 A1 Aug. 18, 2011

(30) Foreign Application Priority Data

Feb. 17, 2010 (IT) .............................. MI2010A0238

(51) Int. Cl.
*G01R 31/28* (2006.01)

(52) U.S. Cl.
USPC ............................ 714/726; 714/736; 714/742

(58) Field of Classification Search
USPC .................. 714/726, 727, 736, 733, 742, 43, 714/715
See application file for complete search history.

(56) References Cited

U.S. PATENT DOCUMENTS

| | | | |
|---|---|---|---|
| 5,295,079 A * | 3/1994 | Wong et al. | 714/715 |
| 5,307,290 A * | 4/1994 | Raviglione et al. | 701/29.2 |
| 6,988,228 B2 | 1/2006 | Paglieri | |
| 6,988,232 B2 * | 1/2006 | Ricchetti et al. | 714/736 |
| 7,137,053 B2 | 11/2006 | Khoche et al. | |
| 7,397,235 B2 * | 7/2008 | Harjung | 324/756.04 |
| 7,408,358 B2 * | 8/2008 | Knopf | 324/426 |
| 7,428,678 B1 | 9/2008 | Berndt et al. | |
| 8,289,039 B2 * | 10/2012 | Breinlinger et al. | 324/750.03 |
| 2005/0055617 A1 | 3/2005 | Wang et al. | |
| 2006/0100812 A1 | 5/2006 | Sturges et al. | |
| 2006/0170435 A1 | 8/2006 | Granicher et al. | |
| 2006/0236180 A1 | 10/2006 | Ong | |
| 2006/0242504 A1 | 10/2006 | Kadota | |
| 2006/0273809 A1 | 12/2006 | Miller et al. | |
| 2009/0100305 A1 | 4/2009 | Jan et al. | |

\* cited by examiner

*Primary Examiner* — Fritz Alphonse

(74) *Attorney, Agent, or Firm* — Seed IP Law Group PLLC

(57) ABSTRACT

A process for electrically testing electronic devices includes connecting at least one electronic device to an automatic testing apparatus suitable for testing digital circuits, and sending, through the apparatus, control signals for electrically testing the electronic device. The process further includes electrically testing the electronic device through at least one reconfigurable digital interface connected to the apparatus through a dedicated digital communication channel and comprising a limited number of communication or connection lines strictly appointed to the exchange of the testing information. Response messages are sent from the electronic device to the apparatus through the digital communication channel in response to the control signals. The response messages contain mesaurements, failure information, and data.

26 Claims, 53 Drawing Sheets

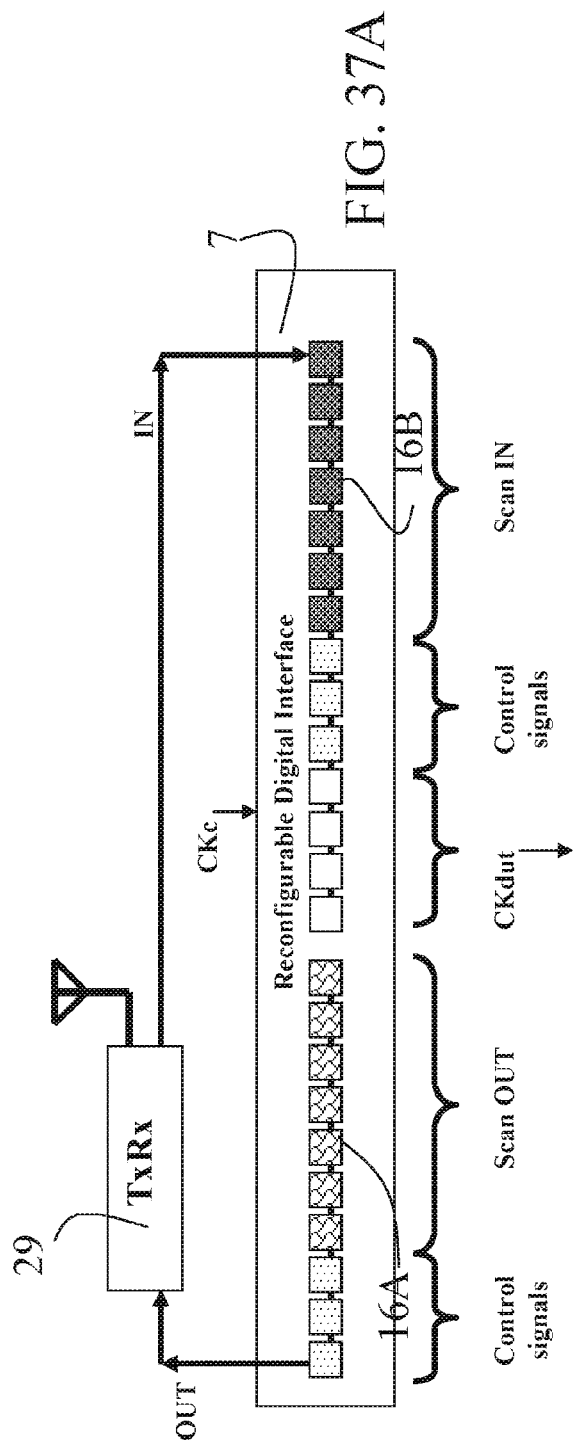
FIG. 37A
FIG. 37B
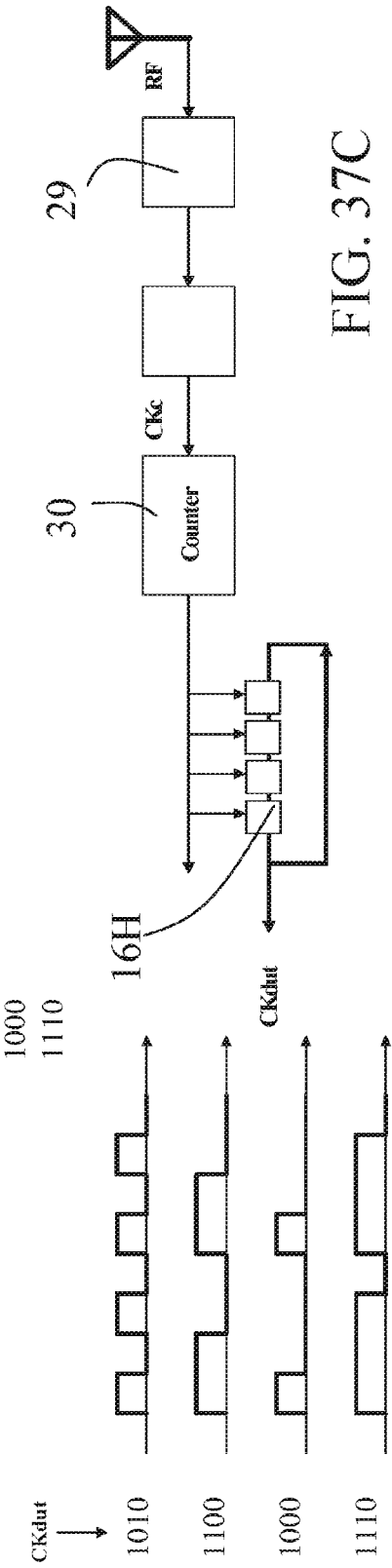
FIG. 37C

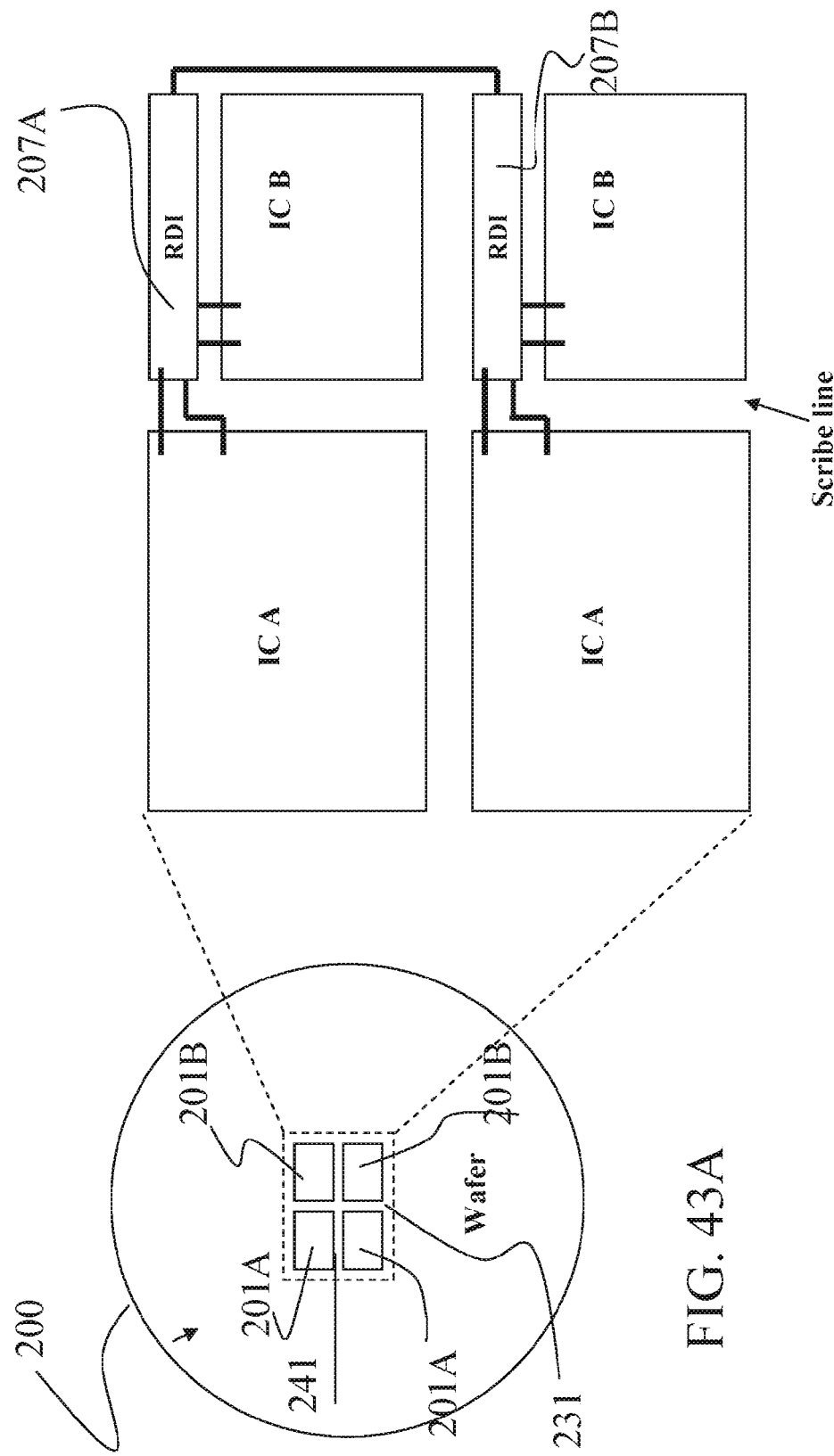

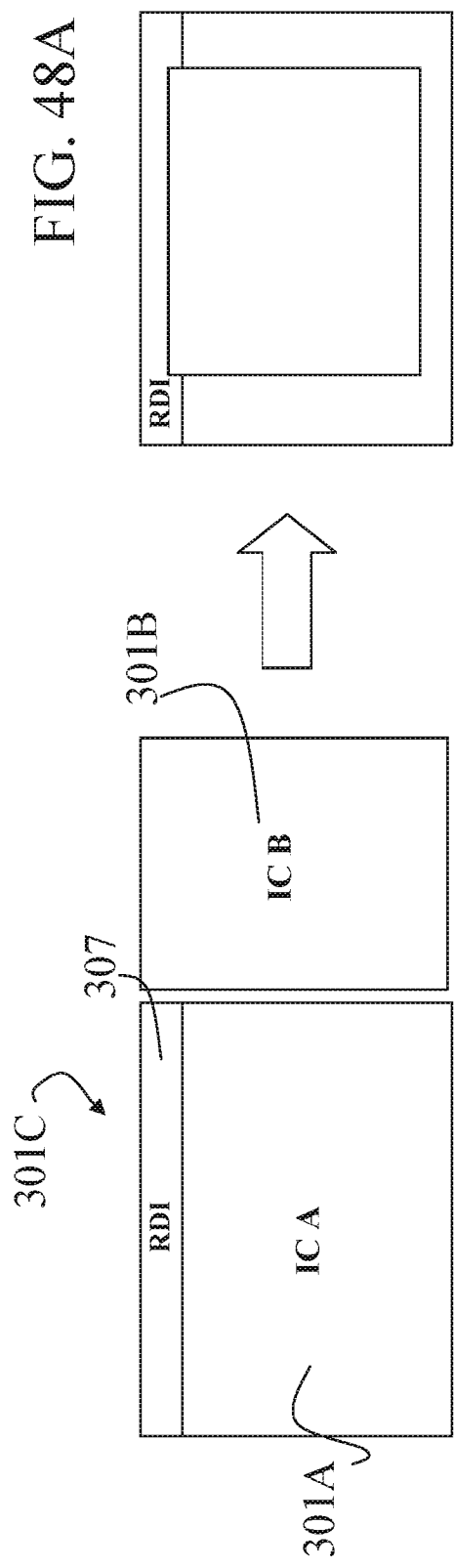
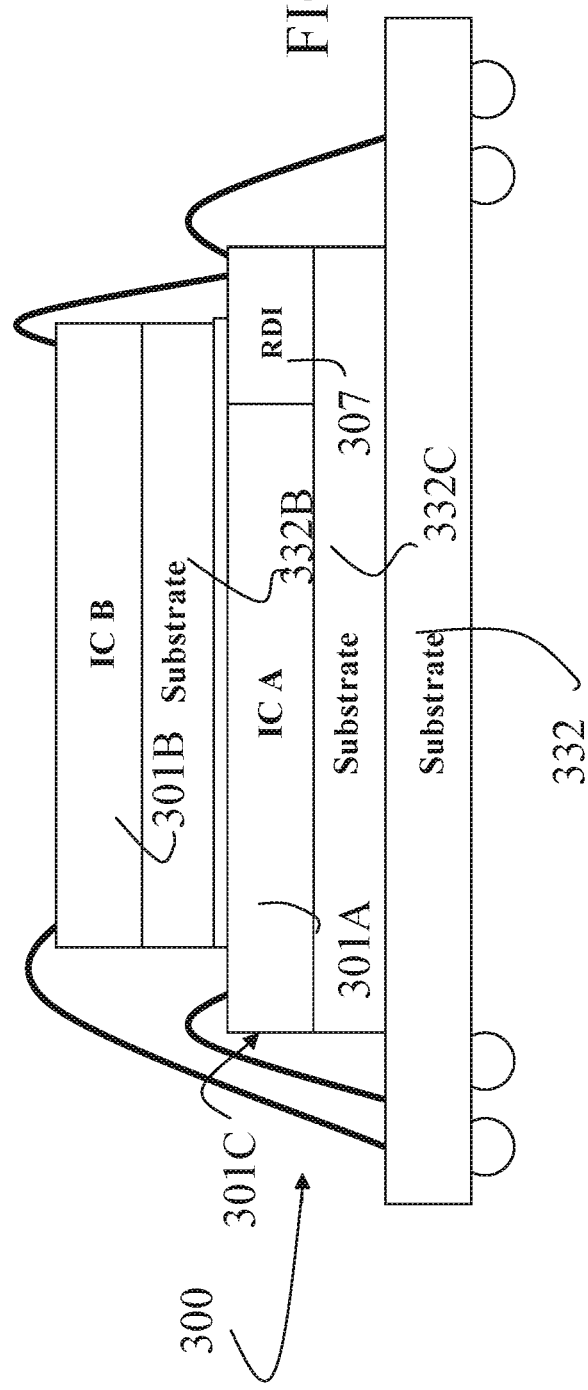
FIG. 48A
FIG. 48B

PROCESS FOR MAKING AN ELECTRIC TESTING OF ELECTRONIC DEVICES

BACKGROUND

1. Technical Field

The present disclosure relates to a process for making an electric testing of electronic devices.

The present disclosure also relates to a system for making the electric testing of electronic devices.

The present disclosure also relates to a reconfigurable digital interface for making the electric testing of electronic devices.

The disclosure particularly, but not exclusively, relates to a process for making an electric testing of electronic devices, of the type comprising at least one wafer electric selection step chosen among: for example a testing of the electric type on wafer or Electrical Wafer Sort (EWS) or of the Final Test type or even testing of incorporated devices System in Package (SiP), or testing of the Wafer Level Burn-In (WLBI) type too, made under stress and when the temperature varies, or again testing of complex electronic systems, and the following description is made with reference to this field of application by way of illustration only.

2. Description of the Related Art

As it is well known, at present for making an electric testing on wafer or EWS on an electronic device to be tested or Device Under Testing (DUT), a testing apparatus or tester, such as an Automatic Test Equipment (ATE), is electrically connected to the wafer whereon a plurality of electronic components are present to be subjected to the test which are, as it is usually said, selected or tried out by the test. In particular, a probe card is used associated with at least one probe or, more in general, with a plurality of probes, that serves as interface between the ATE and the wafer. The probe card substantially is a board comprising a Printed Circuit Board (PCB) and different tens (often also different hundreds) of probes that electrically connect the ATE to most of the electric terminations or pads, of the device to be tested. In fact, the ATE comprises resources of measure or of testing that are connected to all the pads for making the testing, and the number of pads for making the testing can be smaller or identical to the number of pads of the device. The resources through which the ATE executes measures or tests are made for example of suppliers, signal generators, measure instruments, calculation and processes instruments, etc.

This type of methodology is adopted also for making a Final Test of an electronic device DUT, for which one or more chips are incorporated in a single package, that will be connected for example to a plurality of pogo pins of a socket so that an ATE executes the Final Test thereof.

Similarly, for testing a generic, complex electronic system through the use of an ATE, the resources of this latter are connected to the circuits of the electronic system to be tested through pads, in case chips on wafer are to be tested, or through bumps or leads, in case the chips are also incorporated in a package or in case the chips are on a wafer whereon the bumps are present (for example created on the pads), or, in general, through suitable connectors already present in the circuits being realized according to the prior art.

However, the disadvantages of this type of methodology are multiple. In particular, the testing of complex devices on wafer using this type of methodology is very complicated since more testing operations are executed and thus to contact the wafer more times.

Moreover, the use of probes that connect the ATE to the wafer often implies the damaging of the pads of the selected devices, complicating the successive assembly of the devices themselves.

Moreover, making the testing of more devices connected in parallel requires the use of probe cards with a very high number of probes, increasing the problems of contacting and, thus, of electric continuity between the probes of the probe card and the pads of the DUT and causing also problems of electric performance loss. It is also to be said that the number of resources of the ATE to be used increases according to the number of pads to be contacted on the DUT to be tested and, in consequence, the number of DUT that can be tested in parallel decreases, increasing the costs of the testing.

Within this domain, it is also worth reminding that a generic device to be tested can be made of at least one generic and however complex electronic device or of a group of integrated electronic circuits incorporated in a package, or of a so called System in Package (SiP), or again of a generic electronic system however complex. Moreover, a device DUT can comprise analog and radiofrequency (RF) circuits, digital circuits and one or more different types of memories. By way of example, a generic, complex device DUT comprising a memory block (for example a Flash memory), an analog circuit block, a digital circuit block and an RF circuit block is in general defined with mixed signal since there are both analog and digital signals and also radiofrequency signals.

At present, especially for DUT used in the automotive field, the execution of the testing of devices DUT of such a complex type requires two or more testing operations and, thus, the use of at least two different types of ATE, also under different temperature conditions. In consequence, the process of electric selection is remarkably complicated. In fact, for the testing of complex DUT, ATE of different type and of high cost have to be available and, besides, production problems due to the presence of analog and RF circuits in the DUT have to be solved. For example, for making the testing of a memory block an ATE specific for the memory testing is used, connecting it to a specific portion of the same DUT. It is also possible to make the testing of digital circuits and of memory circuits with a same ATE, connecting a portion of the DUT, in particular the digital and memory blocks, to the corresponding resources of the ATE. Similarly, for making the testing of digital and analog circuits an ATE specific for the testing of mixed signal circuits, i.e., both analog and digital signals, is used connecting a portion of the DUT, in particular the digital and analog blocks, to the corresponding resources of the ATE. Instead, for the testing of the radio-frequency (RF) circuits a specific ATE may be used, connecting another portion of the DUT, in particular the radio-frequency circuits, to the corresponding resources of the same ATE. It is also known that it is possible to make together the testing of the digital, analog and RF circuits by using an ATE specific for the testing of mixed signal circuits that has inside also instruments specific for the testing RF, connecting a part of the DUT, in particular the analog, digital and RF blocks to the resources of the ATE. However, a disadvantage of this type of testing is that the mixed signal ATE have a cost that is in general very high and in any case higher with respect to the other types of ATE, besides being remarkably complex. Moreover, the presence of analog and RF circuits in the DUT makes it difficult the testing due to the various parasite phenomena in the electric measure chain between the DUT and the instruments inside the ATE.

In particular, for making the testing of a digital block an ATE specific for the digital testing is connected to a corresponding digital portion of the resources of the same DUT. For this testing scanning techniques are usually implemented, i.e., the device is provided with scan cells on board of the device for making the boundary scanning (for the input and output pins) and/or internal scan cells (for the internal nodes), connected in series to form scan chains.

In particular, the scan chains are created by modifying, suitably and in a per se known way, the Flip Flops, comprised in a given logic network, for example by arranging at their input a circuit that can be a multiplexer, and thus creating scan Flip Flops being useful during the testing step, or test mode, of the digital circuit. These scan Flip Flops receive at the input a control signal called Scan Mode, or Scan Enable or Scan Selection, useful for making the circuit pass from the test mode configuration to the normal operation configuration, or user mode.

A scan chain consists, thus, in a shift register, that groups together at least part of the memory elements, the flip flops, of the digital circuit. By way of example, the annexed FIG. 1 shows a generic device DUT 101 comprising a digital block 102 comprising at least one scan chain or more in general a plurality of scan chains 103 provided with input terminals, or scan chain inputs or pseudo-primary inputs, and with output terminals, or scan chain outputs or pseudo-primary outputs while the other input and output terminals that are not connected to scan chains will be respectively primary inputs and primary outputs.

For the testing through scan chains suitable software Advanced Test Pattern Generator (ATPG) generate test patterns at the input of the DUT. These patterns, called test vectors or scan vectors or input test vectors, are the values that the memory elements, i.e., the flip flops, of the digital circuit take and they are shifted in serially along the chains for stimulating the internal circuits of the device according also to the value that the primary inputs will take. In response, the values of the primary outputs and the values generated of the output test vectors, or signatures or responses are observed, these values being captured by the scan cells and then shifted out for comparing them with the testing awaited results, or awaited signatures. The single scan vector is thus a sequence of bits having value 0 and 1 that are charged in a scan chain.

As shown in FIG. 2, the test vectors are supplied at the input of the circuit and charged onto the scan chains by the tester ATE 104, that, at the end of the test, discharges the signatures at the output and analyses them. Under steady conditions, while the signatures are shifted out, the new scan vectors are shifted in. Since the number of flip flops arranged in cascade in the scan chains determines the time for charging the vectors and discharging the signatures, it is clear that the less deep the scan chains are, the more reduced the testing time is. Moreover, the testers ATE have a limited number of digital channels or resources to connect the scan chains to, and this number of resources determines the number of scan chains that can be created in the digital block 102 incorporated in the DUT 101. Thus, usually, very expensive and complex resources are available in the ATE for introducing and storing the input test vectors and operating then a comparison with the awaited results.

At present, a frequently used technique being efficient for reducing the depth of the scan chains is the scan compression, that reduces by a factor also higher than 10 the number of scan chains that are connected to the digital tester. In particular, as shown in FIG. 3, this technique provides to connect at the input of the scan chains of the DUT 101 a decompression circuit 105 of the test vectors at the input of the same scan chains and at the output a compression circuit 106 of the signatures at the output of the scan chains.

In consequence, the ATE supplies at the input the compressed test vectors and collects at the output the compressed signatures.

In general the test vectors, generated by the ATPG, are charged by the ATE in the scan chains, for example 10 MHz, while the digital channels of the tester ATE have band often higher than 10 MHz, for example 100 MHz, in accordance with the specifications of the ATE being considered. Thus, to better exploit the characteristics of the ATE, such shift registers and/or multiplexers and/or demultiplexers can be inserted in the digital block of the DUT so as to reduce the number of inputs and of outputs of the digital block to be connected to the ATE. A solution of this type is described, for example, in the US patent application no. 2005/0055617 to Tatung Co LTD.

Hence the frequency of the signals at the input and at the output of the digital signal, and thus at the output and at the input of the ATE, is increased reducing the number of resources of the ATE connected to the single digital circuit. In consequence, the scan chains of the device could operate at a lower frequency, for example 10 MHz, with respect to the frequency of the input signals, for example 80 MHz.

A similar measure allows to increase the execution frequency of the test on the scan chains, as described in U.S. Pat. No. 7,137,053 to Khoche A., Rivoir J., Armstrong D.

To this aim, U.S. Pat. No. 7,428,678 to Cypress Semiconductor Corp., describes a technique for using a single input channel and a single output channel used for the test signals, during the testing step, and for the data signals during the normal operation.

It is also known to modify the connections between the various scan chains according to the used tester, as described in U.S. Pat. No. 6,988,228 to Texas Instruments Inc.

However, a lot of the known solutions reduce the number of channels for making the scanning without reducing the other channels of the DUT that are not used.

Moreover, the digital testing can be made using Low Pin Count (LPC) interfaces useful to reduce the number of pins to be contacted for making the testing and, thus, of signals that an ATE sends to the DUT to be tested.

Moreover, since for making the testing an external clock is used for synchronizing the various parts of the system to be tested, it is suitable to create an interface as much standard as possible and adaptable to the different devices and for different test needs.

Moreover the testing of a specific device is very often linked to the particular type of used ATE and to the specific characteristics of its test resources, and thus it would be suitable to find such a new standard approach as to use for the testing of a same device also ATE of different type or with resources having different characteristics, increasing the flexibility of the productive process with a consequent reduction of the costs.

BRIEF SUMMARY

One embodiment is a process of electric testing of electronic devices, having such structural and functional characteristics as to reduce the costs and improving the functionality of the testing.

One embodiment is a process of electric testing of at least one electronic device through a Reconfigurable Digital Interface (RDI), incorporated or partially incorporated in the at least one electronic device to be tested and suitable for connecting the at least one DUT with one digital ATE. The digital ATE is structured for sending control signals and software instructions to the DUT, that executes inside these commands and instructions and sends to the same ATE response messages comprising measures, data representing error codes and other information relative to possible failures.

In one embodiment the reconfigurable digital interface is completely external or mainly external with respect to the DUT.

One embodiment is a process for making an electric testing of electronic devices DUT, of the type comprising the steps of:
- connecting at least one electronic device DUT to an automatic testing apparatus ATE suitable for making the testing of digital circuits;
- sending through said ATE apparatus control signals for the electric testing to said electronic device DUT;
- said process being characterized in that it further comprises the steps of:
  - providing at least one reconfigurable digital interface RDI connected to said ATE apparatus through a dedicated digital communication channel and comprises a limited number of communication or connection lines strictly appointed to the exchange of the auto-testing information; and
  - making the electric testing of said at least one electronic device DUT (1) through said reconfigurable digital interface RDI (7);
  - sending by said at least one electronic device DUT to said ATE apparatus response messages containing measure, failure information and data in response to said control signals and through said digital communication channel.

Advantageously, in one embodiment said interface is totally or partially incorporated in said electronic device DUT.

Advantageously, in one embodiment said interface is totally or partially external with respect to said electronic device DUT.

Advantageously, in one embodiment part of the circuits already present in the DUT are used to form the circuit portion appointed to the testing.

Advantageously, said communication or connection lines are chosen in the group made of:
- wired lines;
- wireless lines;
- partially wired and partially wireless lines.

Suitably, said communication or connection lines are a plurality of the internal lines of said electronic device DUT, and possibly transmit and receive data chosen in the group made of:
- 4 bit data (nibbles);
- 8 bit data (bytes);
- 16 bit data (words), said communication lines are input and output gates of said electronic device DUT.

Furthermore, the process according to one embodiment also comprises a generation step of a clock signal inside said electronic device DUT for establishing a synchronism between said electronic device DUT and said ATE apparatus.

Advantageously according to one embodiment, the process is used for an electronic device DUT on a wafer, or on an electronic device DUT incorporated in a package.

Advantageously according to one embodiment, the process is used for a complex electronic device DUT comprising a plurality of devices DUT each comprising a reconfigurable digital interface RDI.

Advantageously, said reconfigurable digital interface RDI can comprise a group or a subgroup of:
- at least one wired communication line;
- at least one wireless communication line;
- at least one wired communication line and at least one wireless communication line
- at least one communication line different from those previously cited.

Furthermore, said reconfigurable digital interface RDI can possibly comprise at least one wireline or wireless line comprising an electromagnetic or optoelectronic interface, and including a group or subgroup of:
- at least one reception circuit;
- at least one transmission circuit;
- at least one antenna;
- at least one optoelectronic device;

and said wireline or electromagnetic or optoelectronic line is suitable for exchanging information with another wireline or electromagnetic or optoelectronic interface connected to said ATE apparatus.

Furthermore, said reconfigurable digital interface RDI comprises a state machine or Finite State Machine (FSM) comprising:
- at least one coding circuit or Encoder;
- at least one decoding circuit or Decoder;
- at least one test controller circuit or Test Controller;
- at least one configuration register;
- at least one shift register of programmable and configurable length;
- at least one counter circuit or frequency divider possibly programmable;
- possibly at least one circular shift register;
- possibly at least one circuit different from those previously cited.

Advantageously, the buses being used for the communication can be:
- data buses;
- address buses;
- control buses;
- multiplexed address and data buses;
- buses dedicated to the connection to peripheral apparatuses.

Advantageously, the interface RDI can comprise:
- at least one analog line, or analog pass through, useful to connect to each other two or more electronic devices DUT;
- at least one high speed input/output serial gate.

Advantageously, the control signals sent by the ATE apparatus are analyzed inside the digital interface RDI already divided into Header and Body.

Advantageously, the decoder circuit interprets the Header of the message, so that its content Body can be sent to the Test Controller, or alternatively to at least one DUT or alternatively copied in at least one register or in one volatile or non volatile memory.

Advantageously, the response messages sent to the ATE apparatus comprise a Header created by the coding circuit or Encoder and a Body that is sent by the Test Controller, or alternatively by at least one device DUT or alternatively copied by at least one register or by a volatile or non volatile memory.

Advantageously, the reconfigurable digital interface RDI can comprise a Configuration Register suitable for modifying the configuration of the interface RDI according to the different needs or operation modes.

Advantageously, the content of the Header can give indications on the fact that in the Body of the message there is at least one command, or at least one datum, or at least one request or question, or at least one response, or at least one part of the configuration of the RDI, or at least one part of a scan vector, or at least one part of a signature, or at least one part of the shape of a clock signal (clock shape), or at least one part of description of the error occurred, or at least part of the information to be sent or received by at least one internal interface of at least one device DUT.

Advantageously, the process further comprises the steps of:
  making the reset of the interface RDI;
  programming the configuration of the interface RDI for making the testing thereof;
  making the testing of the interface RDI;
  programming the configuration of the interface RDI for the testing of at least part of a DUT;
  making the testing, at least partial, of a DUT being connected to the interface RDI;
  programming the configuration of the interface RDI for the testing of at least part of a second DUT;
  making the testing, at least partial, of a second DUT being connected to the interface RDI through the Test Controller;
  programming the configuration of the interface RDI for its use in the final application.

The technical problem is also solved by an electronic device DUT to be electrically tested and of the type susceptible of being connected to an automatic testing apparatus or ATE apparatus suitable for making the testing of digital circuits, and receiving from said ATE apparatus control signals for the electric testing, the device being characterized in that it is connected to a reconfigurable digital interface RDI suitable for digitally interfacing with said ATE apparatus through a dedicated digital communication channel and comprising a limited number of communication or connection lines for sending to said ATE apparatus possible response messages containing measures, failure information and data in response to said control signals and through said digital communication channel.

Advantageously, the device according to one embodiment can also comprise:
  at least one first electronic device DUT and
  at least one second electronic device DUT
  each comprising at least one reconfigurable digital interface RDI,
  said at least one first and one second device DUT being connected to a circuit network internal to the electronic device DUT suitable for connecting it to an ATE apparatus.
  Furthermore, said ATE apparatus is digital.

Advantageously, the interface RDI comprises a plurality of shift registers made of a plurality of flip flops and connected to each other and to an ATE apparatus through switches chosen in the group made of:
  solid state switches;
  buffers;
  logic gates;
  multiplexer circuits;
  demultiplexer circuits.

Advantageously, the plurality of the flip flops internal to the interface RDI creates at least one scan chain inside the interface RDI.

Advantageously, the length of at least one shift register of the interface RDI depends on the specific programming of the Configuration Register.

Advantageously, for making the testing of the interface RDI, this can be configured in such a way as to comprise at least one scan chain.

Advantageously, the interface RDI can comprise a redundant shift register able to substitute a shift register of the scan chain that does not correctly operate.

Advantageously, the interface RDI can comprise a control shift register or dedicate a part of at least one shift register to control signals.

Advantageously, the group of shift registers of the interface RDI creates an interface Low Pin Count (LPC), suitable for transmitting the stimuli and the test responses, as the scan vectors and the signatures, and for exchanging control signals between the ATE apparatus and the interface RDI.

Advantageously, the interface RDI can be partially or completely incorporated in a digital block of a device DUT and connected to the scan chains, or to the compressed scan chains comprised therein.

Advantageously, the interface RDI can be connected also to other interfaces of the DUT, for example an interface JTAG, or to a Test Access Port (TAP), or to at least one resource of the DUT necessary for the test of the same DUT.

Advantageously, the frequency of the scan vectors coming from the ATE apparatus and/or the frequency of the signatures, that are sent to the ATE apparatus, is suitably increased by suitably configuring the length of at least one shift register incorporated in the interface RDI, and this will require a mixing/demixing of the scan vectors and/or of the signatures.

Advantageously, the supervised testing methodology can be applied also during the execution of the at-speed testing of the device DUT.

Advantageously, it is possible to reduce the number of shift registers comprised in the interface RDI by using the channels of the ATE apparatus in a bidirectional way.

Advantageously, it is possible to use the interface RDI for making the testing of at least one device DUT if the interface RDI is external with respect to the device DUT.

Advantageously, the use of the resources of the interface RDI and the number of channels being used by the ATE can be optimized if two identical devices DUT are simultaneously tested.

Advantageously, the interface RDI can be connected and exchange messages, through one or more line buses connected to at least one receiving circuit and/or at least one transmitting circuit realized through at least one transceiver and/or at least one transponder, connected to at least one antenna or suitable for transmitting and/or receiving the data on at least one wired line, that can coincide with the supply line.

Advantageously, said transceiver/transponder circuit can be internal or external to a digital block of a DUT.

Advantageously, a PLL circuit internal to the chip can be used for synchronizing the DUT and the ATE.

Advantageously, a generic shift register of the interface RDI can contain at least one among:
  a part of at least one scan vector;
  a part of at least one signature;
  a part of at least one control signal;
  a part of the shape of the clock Ck;
  at least one part of a message sent by the ATE apparatus to the interface RDI;
  at least one part of a message sent by the interface RDI to the ATE apparatus;
  at least one part of a message sent by the interface RDI to at least one DUT;
  at least one part of a message sent by at least one DUT to the interface RDI;
  at least one part of the configuration of the RDI;
  at least one part of a datum;
  other information.

Advantageously, the process according to one embodiment is applied also to devices DUT to be tested on wafer.

Advantageously, the interface RDI can be internal or external to a wafer comprising a plurality of devices.

Advantageously, the interface RDI can be internal or external or partially internal and partially external to at least one device DUT to be tested on wafer.

Advantageously, the interface RDI can be positioned in the areas of the wafer wherein an active circuitry is not present, i.e., in the scribe lines of the wafer.

Advantageously the interface RDI can be used also in the final application for interfacing with each other at least two systems, for example two different chips.

Advantageously, the supervised testing methodology according to one embodiment can be applied also to incorporated systems or System in Package (SiP) or to electronic systems comprising different types of circuits.

Advantageously, it is possible to assemble a first device DUT comprising an interface RDI and a second device DUT.

Advantageously, it is possible to assemble a first device DUT, a second device DUT and an interface RDI.

Advantageously, one device DUT can be rotated by 90° with respect to the other.

Advantageously the interconnections internal to the SiP, can be realized through wire bonding, or, alternatively, through bumps, or, alternatively, Through Silicon Vias (TSV), or, alternatively, through Magnetic TSV.

Advantageously, the interface RDI can be realized in part on the probe card and/or in part on the test board.

Further characteristics and the advantages of a process and of a device according to various embodiments will be apparent from the following description given by way of indicative and non limiting example with reference to the annexed drawings.

BRIEF DESCRIPTION OF THE SEVERAL VIEWS OF THE DRAWINGS

In these drawings:

FIGS. 37A-37C show a schematic representation of a configuration of the interface RDI, possible shapes of a clock signal of a DUT 1 comprising the interface RDI and a generation circuit of this clock signal, according to one embodiment;

FIGS. 42A-42B, 43A-43B, 44A-44B, 45A-45B and 46A-46B shows a first, second, third, fourth and fifth schematic representations from above and its enlargements of a wafer comprising a plurality of devices DUT and a first and a second digital interface RDI positioned in the non active areas of the wafer, according to one embodiment;

FIGS. 47A-47B, 48A-48B, 49A-49B and 50A-50B show a first, second, third ad fourth schematic representations from above and in section of a System in Package (SiP) comprising two devices DUT, one of which comprising a digital interface RDI, according to one embodiment;

DETAILED DESCRIPTION

With reference to these figures, the steps are now described of a process of electric testing of electronic devices according to one embodiment. In particular, as it will be clear hereafter in the description, one embodiment describes a testing process of the supervised type.

Figure 1:
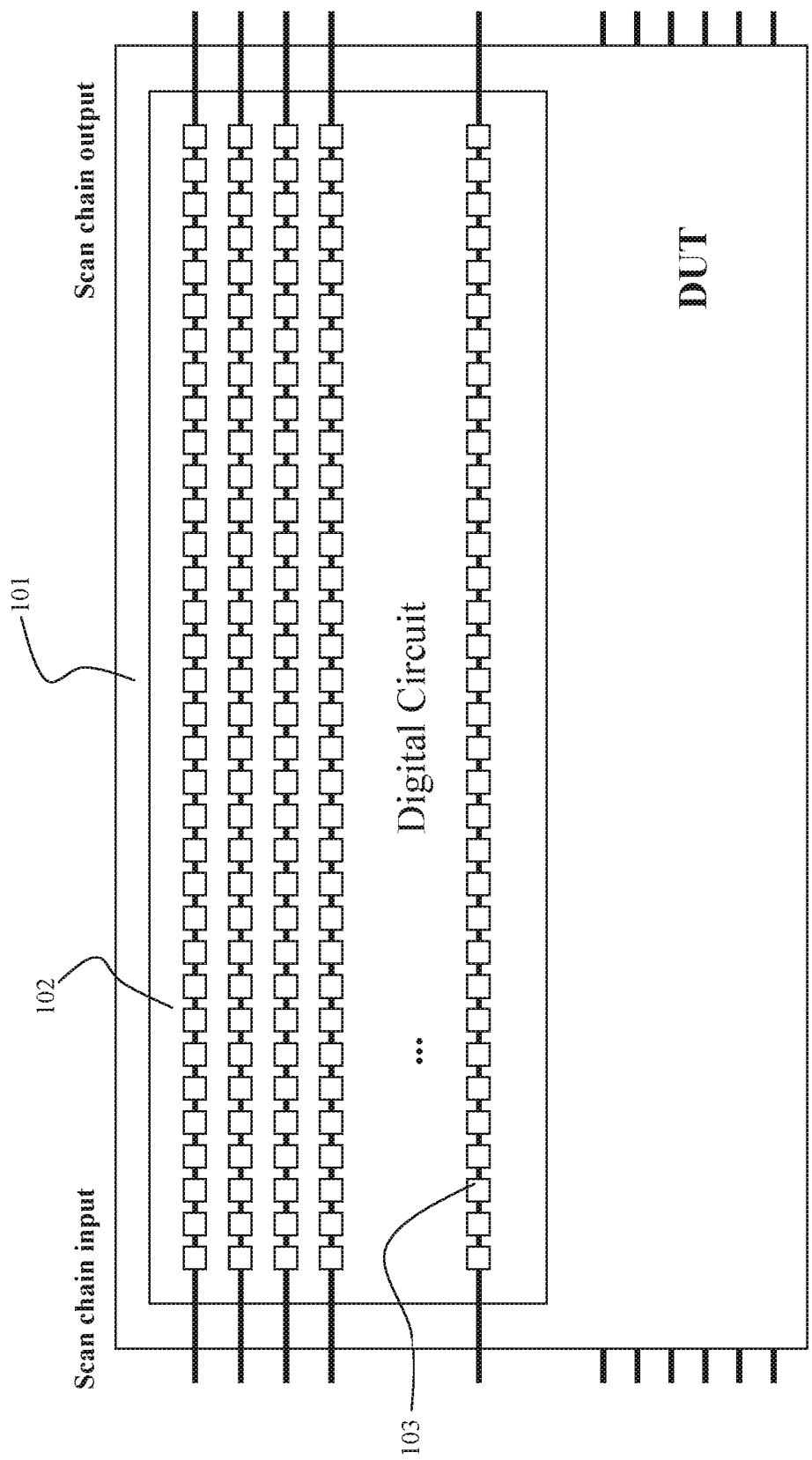
FIG. 1 shows a view from above of a device DUT comprising a digital block to be tested through scan chains, according to the prior art.
Figure 2:
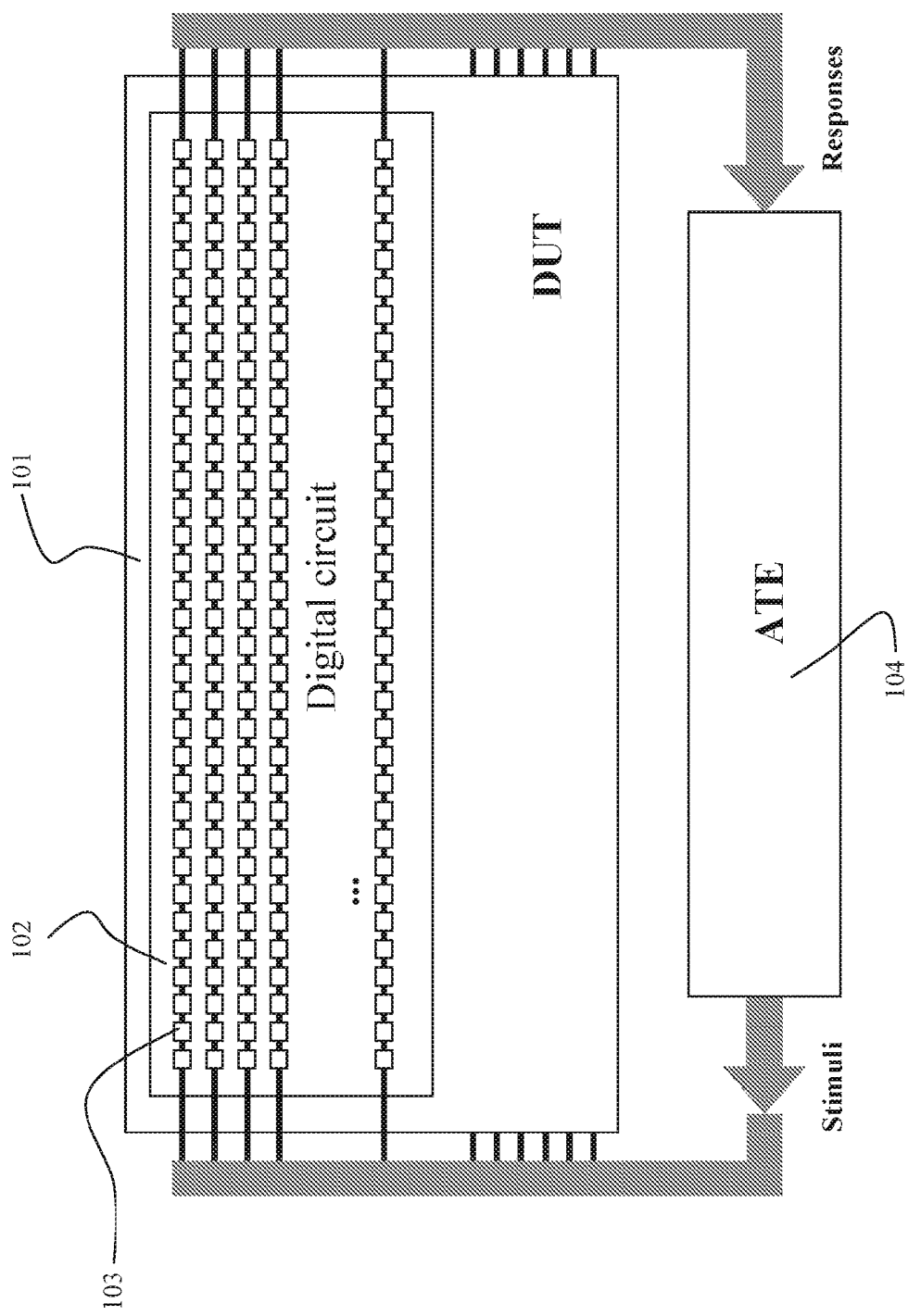
FIG. 2 shows a schematic representation from above of a device DUT comprising a digital block connected to a digital ATE, according to the prior art.
Figure 3:
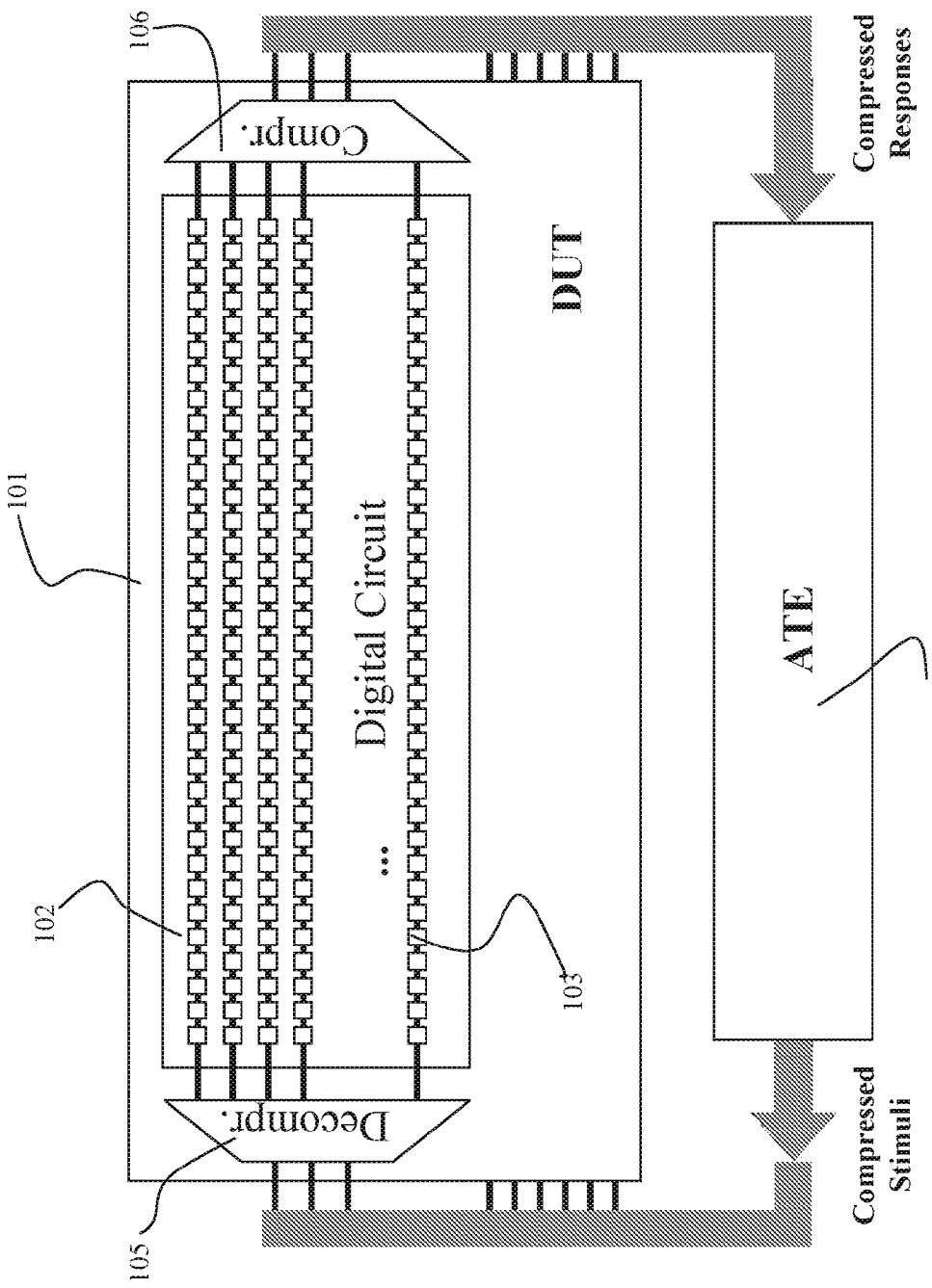
FIG. 3 shows a schematic representation from above of a device DUT comprising a digital block connected to a digital ATE, to be tested through scan compression, according to the prior art.
Figure 4:
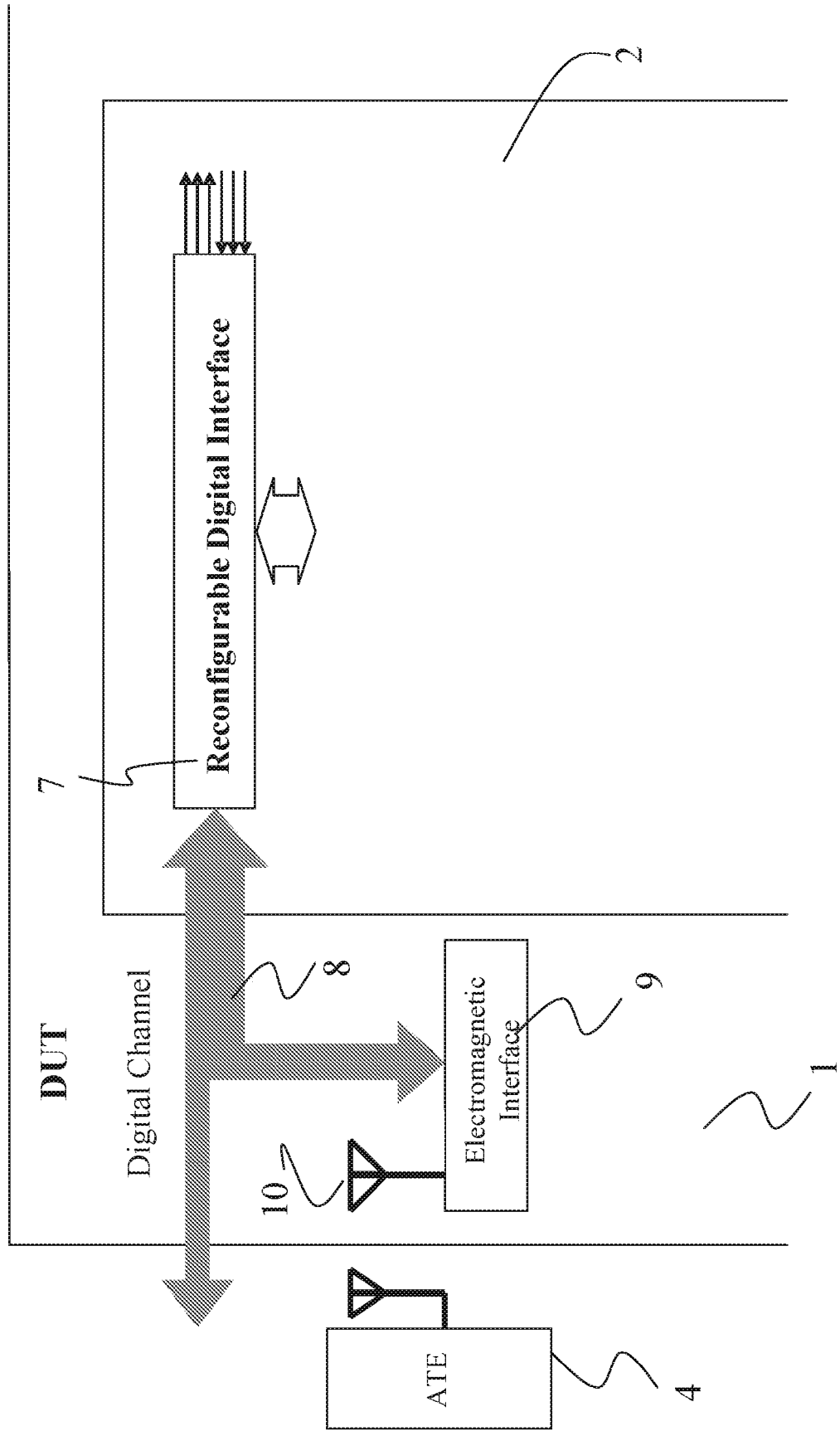
FIG. 4 shows a schematic representation of a digital ATE communicating, through a wireless interface, with a generic device DUT comprising a reconfigurable digital interface RDI, according to one embodiment.

In particular, FIG. 4 shows a schematic representation of a digital ATE 4 connected to the device DUT 1 wherein a reconfigurable digital interface RDI 7 is integrated suitable for creating, between the DUT 1 and the digital ATE 4, a mainly digital communication channel ChD 8 that, advantageously, can comprise multiple wired or wireless, or in part wired and in part wireless, communication lines. In particular, at least one part of the digital channel (and at most the whole digital channel) of the digital interface RDI 7 of the DUT 1, indicated with 8 in the figure, instead of being connected directly to the ATE 4, is connected to at least one further wireless or wireline interface. According to the embodiment in FIG. 4, this at least one further wireless interface is, for example, an electromagnetic interface 9, that can comprise at least one receiving circuit and/or at least one transmitting circuit realized through at least one transceiver and/or at least one transponder being connected to at least one antenna 10 that will exchange information through electromagnetic waves with a further analog interface, in particular an electromagnetic one, being connected to the ATE 4.

Advantageously, the digital interface RDI 7 can comprise a decoding circuit and a coding circuit connected to the wireless interface, the decoding circuit decoding the messages coming from the exterior of the DUT 1, and the coding circuit coding the messages sent from the DUT 1 outwards. By applying, then, a suitable transmission protocol, it will be possible to verify the presence of errors in transmission or reception and to repeat the message.

In case of a wired transmission line, it will connect the tester ATE or any system external to the at least one transmission circuit and/or at least one reception circuit.

Furthermore and advantageously, it is possible to consider an exchange of information through at least one wireline interface (not shown in the drawings) that can comprise at least one receiving circuit and/or at least one transmitting circuit being realized through at least one transceiver and/or at least one transponder suitable for transmitting and/or receiving data on at least one wired line, that can coincide with the supply line.

Furthermore and advantageously, it is possible to consider an exchange of information through at least one optical or optoelectronic interface (not shown in the drawings).

Furthermore and advantageously, it is possible to use in the final application this at least one electromagnetic and/or optoelectronic interface.

Furthermore and advantageously, it is possible to consider an exchange of information through at least one digital interface Low Pin Count (LPC) (not shown for sake of simplicity).

In its most general form, the process for making an electric testing of electronic devices DUT 1 according to one embodiment comprises the steps of:
  connecting at least one DUT 1 to an automatic testing apparatus ATE 4 suitable for making the testing of digital circuits; and
  sending through the ATE 4 control signals for the electric testing to the DUT 1.

Advantageously the process further comprises the steps of:
  making the electric testing of the DUT 1 through at least one reconfigurable digital interface RDI 7 connected to the ATE 4 through a dedicated digital communication channel ChD and comprising a limited number of communication or connection lines strictly appointed to the exchange of the testing information; and
  sending from DUT 1 to the ATE 4 response messages containing measures, failure information and data in response to the control signals through the digital communication channel ChD.

Advantageously, the buses used for the communication can be some buses internal to the device DUT 1 and transmit and receive data with nibbles (4 bit) or bytes (8 bit) or words (16 bit) or serially or in other ways per se know.

Advantageously, some input and output gates being internal to the DUT 1 can be used as communication lines.

Advantageously, the supervised testing methodology according to one embodiment can be applied also to a generic complex electronic system comprising a plurality of subsystems, for example devices DUT each provided with an interface RDI. In this case, it is possible to create a circuit network internal to the electronic system useful for connecting it to a digital ATE 4 for making its testing, using the respective testing resources of the various devices DUT incorporated in the system.

Figure 5:
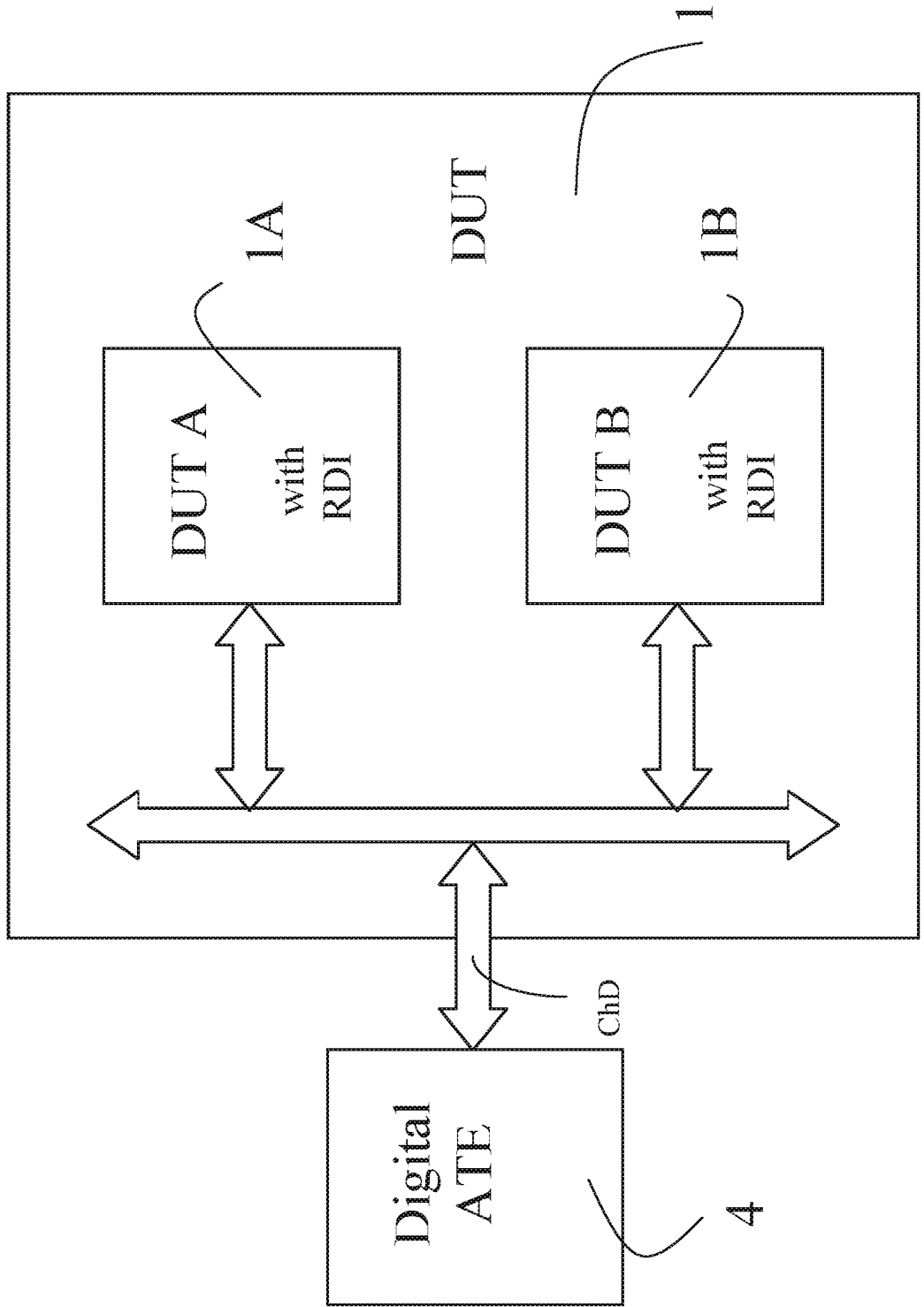
FIG. 5 shows a schematic representation of a digital ATE connected to a complex device DUT comprising a first DUT with interface RDI and a second DUT with interface RDI, according to one embodiment.

FIG. 5 shows, for example, an electronic system to be tested, indicated again as DUT 1 and a first device DUT 1A and a second device DUT 1B, each comprising its own interface RDI, both connected to an internal circuit network useful for the connection to an external digital ATE 4.

Advantageously, the interfaces RDI being internal to the DUT 1A and the DUT 1B can be configured for testing respectively the DUT 1A and the DUT 1B, or, alternatively, used in the final application or, alternatively, reconfigured on the real application according to the user's needs.

Figure 6:
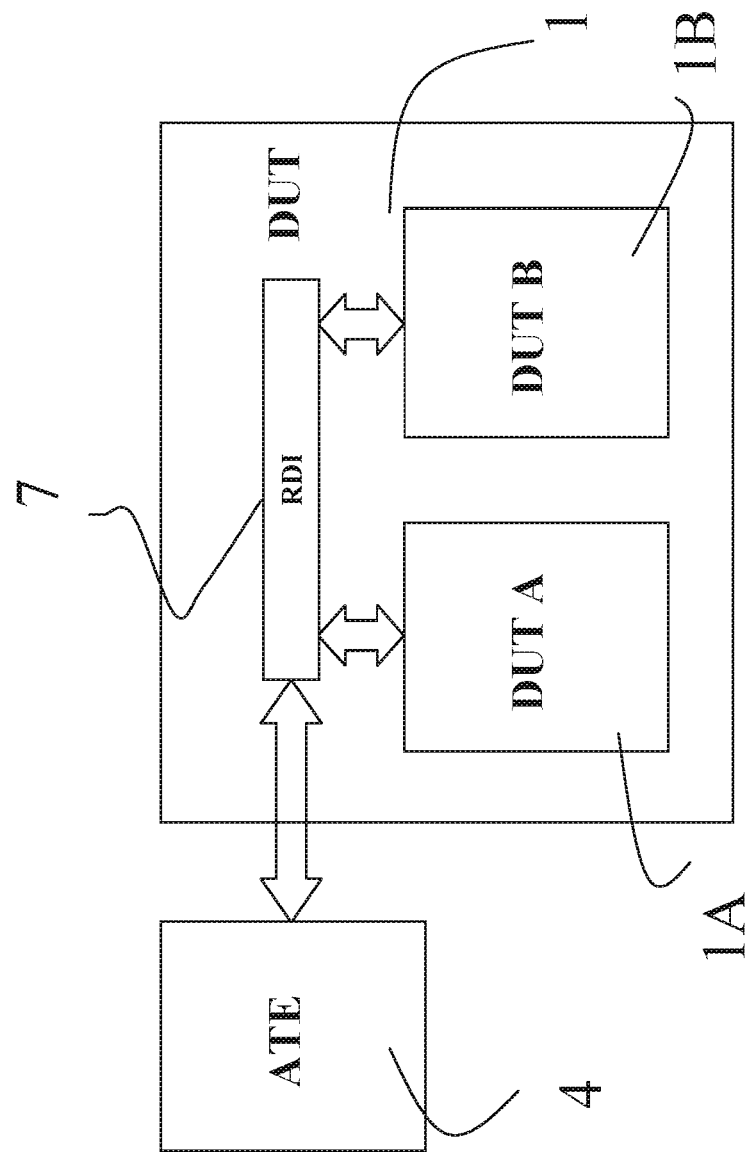
FIG. 6 shows a schematic representation of a digital ATE connected to a complex device DUT comprising a first DUT, a second DUT and an interface RDI external to them and connected to both, according to one embodiment.

In another aspect of one embodiment, the process is also applied to devices or complex systems DUT wherein the digital interface RDI 7 is totally or partially external to more devices DUT and connected to them. By way of example, as shown in FIG. 6, a complex system DUT, indicated with 1, comprises a first DUT 1A and a second DUT 1B, both connected to a digital ATE 4 through a single digital interface RDI 7 totally external to both of them.

Figure 7:
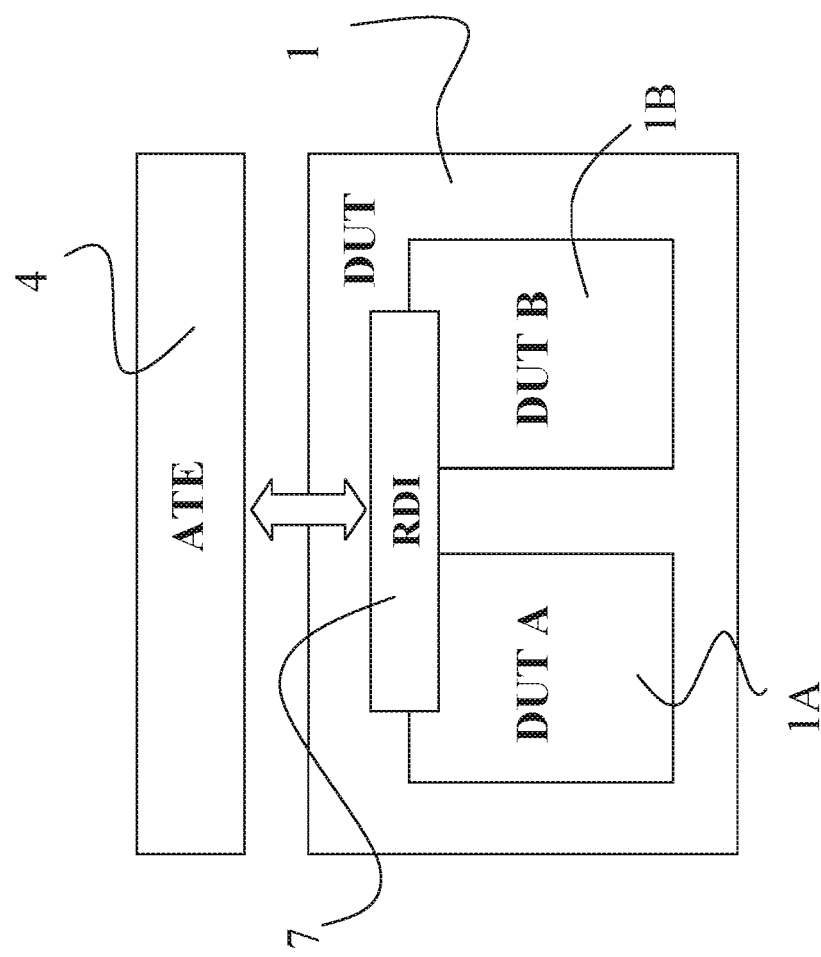
FIG. 7 shows a schematic representation of a digital ATE connected to a complex device DUT comprising a first DUT, a second DUT and an interface RDI partially external to them and connected to both, according to one embodiment.

In one embodiment, the digital interface is partially external to the DUT. For example, FIG. 7 shows the complex system DUT, indicated with 1, comprising a first DUT 1A and a second DUT 1B, both connected through a single digital interface RDI 7 partially external to the two devices DUT 1A and 1B. In this case, the interface RDI 7 uses a part of the circuits of the DUT 1A and a part of the DUT 1B, that can be used at least in part also in the final application.

Therefore, the word external to a DUT means a portion of interface making part of a system or of an environment that cannot be completely identified with the same DUT or with the group of the DUT incorporated in a more complex system. Advantageously for the operation of the interface RDI also additional circuits can be inserted in the DUT 1A and in the DUT 1B that can also be not used in the final application.

Figure 8:
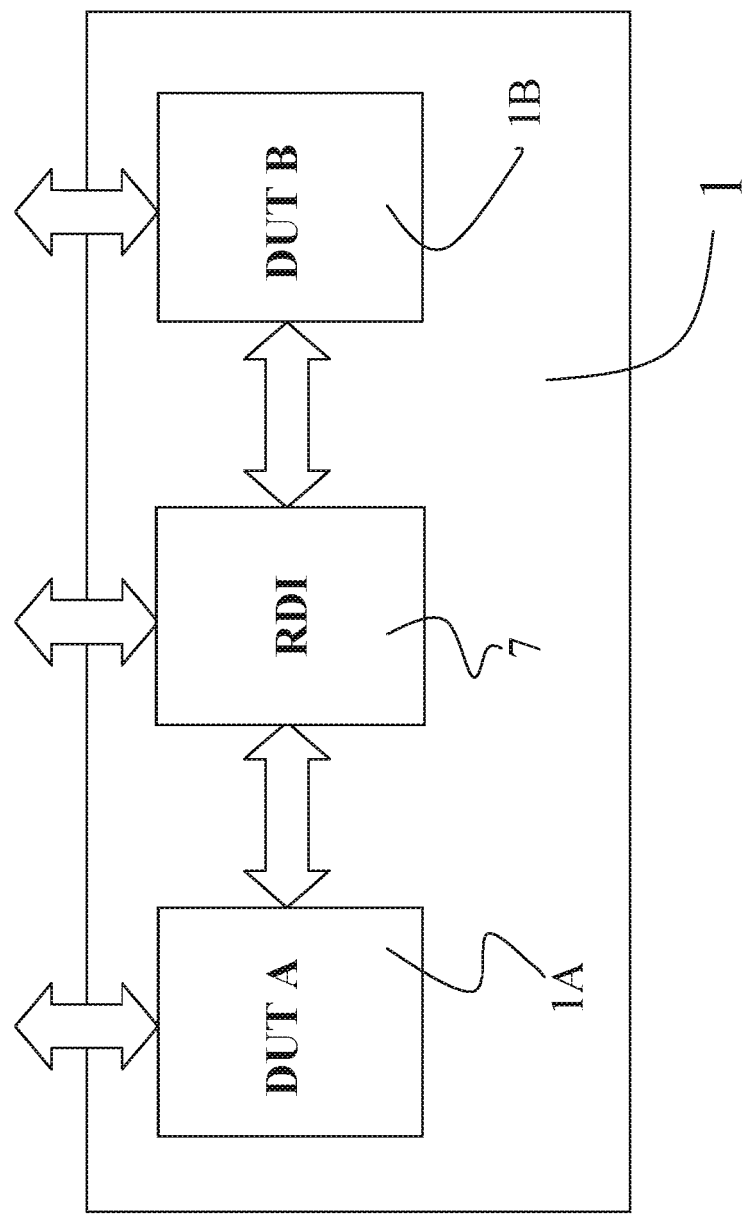
FIG. 8 shows a schematic representation of the connection, through wireless interface, between an interface RDI and a first and a second device DUT, according to one embodiment.

In a further aspect of one embodiment, the process is also applied to devices or complex systems DUT wherein the digital interface RDI 7 is connected to a further wireless interface. As shown in FIG. 8, a complex system DUT, indicated with 1, comprises a first DUT 1A, a second DUT 1B and a digital interface RDI 7 connected to at least one wireless interface (not shown) integrated in the device DUT 1A, or, alternatively, in the DUT 1B, or, alternatively, to a wireless interface (not shown) external to both the devices DUT 1A and 1B.

Advantageously, the interface RDI 7 can be configured for testing the DUT 1A and, afterwards, reconfigured for testing the DUT 1B; or, alternatively, configured for simultaneously testing the DUT 1A and the DUT 1B; or, alternatively, configured for testing the DUT 1A and partially the DUT 1B and then reconfigured for completing the testing of the DUT 1B; or, alternatively, configured for testing the DUT 1A and, afterwards, for testing the DUT 1B only changing the interconnections of the interface RDI from the DUT 1A to the DUT 1B; or, alternatively, configured for its use in the final application; or, alternatively, reconfigured on the real application according to the user's needs.

Figure 9:
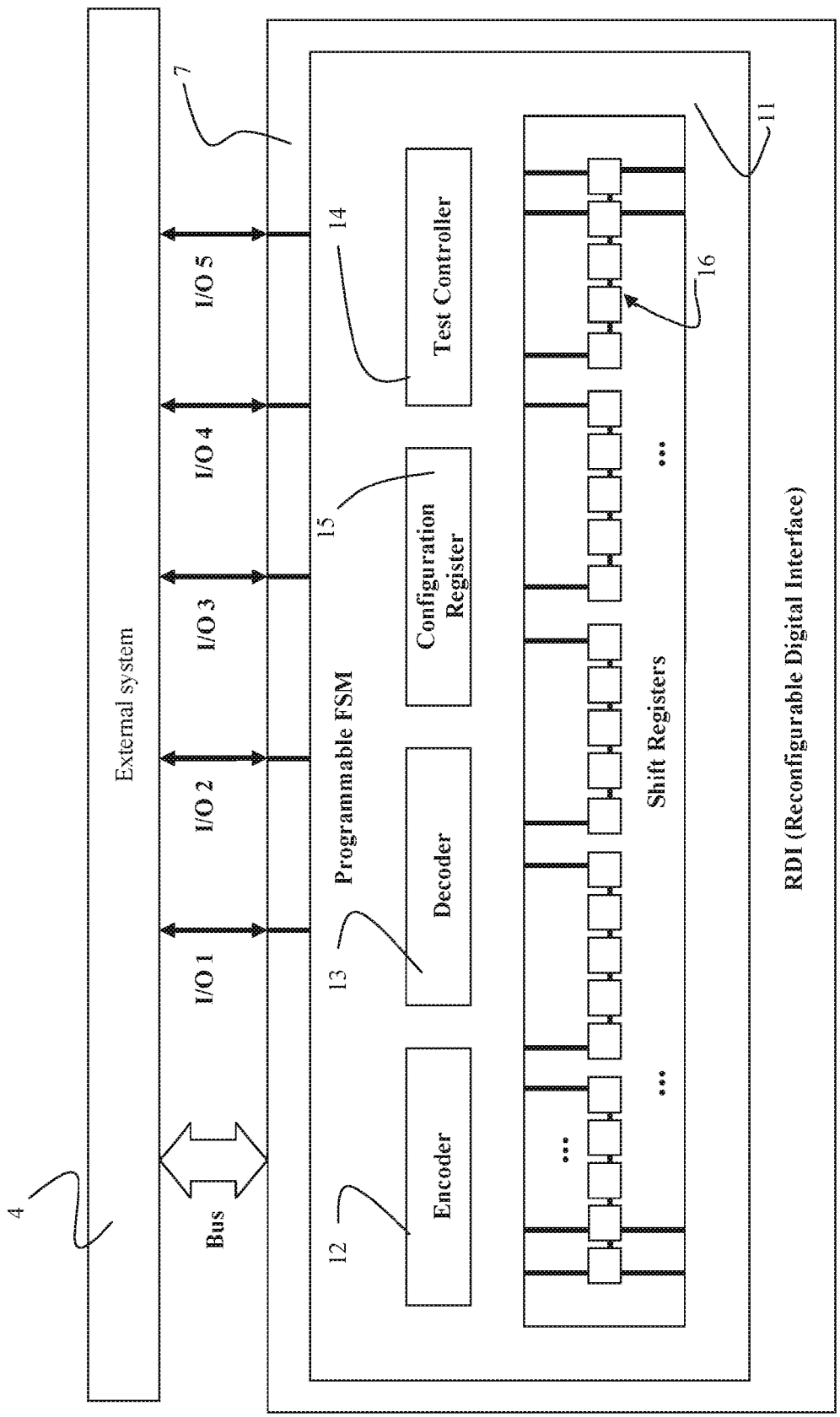
FIG. 9 shows a schematic representation from above of a reconfigurable digital interface RDI connected to an external system, for example an ATE, according to one embodiment.

More in detail, FIG. 9 shows a schematic representation of a reconfigurable digital interface RDI 7, that comprises a Finite State Machine (FSM) 11 comprising combinatorial and sequential circuits, for example a coding circuit or Encoder 12, a decoding circuit or Decoder 13, a controller circuit of the testing or Test Controller 14, possibly programmable, that serves as supervisor (master) of the system during the testing by synchronizing with each other the various parts of the system, a configuration register 15, at least one or more in general a plurality of shift registers 16 of programmable and configurable length, and other circuits not shown in the figure, for example a possibly programmable counter block or frequency divider, a circular shift register, other registers and other types of circuits. Each element of the shift registers 16 is substantially a flip flop that is shown only schematically.

The interface of FIG. 9 can be connected to one or more chips or to an external system, such as an ATE 4, through one or more input and output gates I/O, or, alternatively, through one or more communication lines or buses. Advantageously, the buses used for the communication can be data buses, and/or address buses, and/or control buses, or alternatively the data buses are multiplexed (i.e., they share connection lines) with the address buses, or, alternatively, they can be buses dedicated to the connection to peripheral apparatuses. Moreover, the interface RDI 7 can possibly comprise at least one or more in general a plurality of analog lines, or analog pass through, useful to connect to each other two or more chips or systems, and at least one high speed input/output serial gate. For example the analog pass through can be used by the ATE to make analog measures of at least one circuit contained in the DUT. For example one of the shift registers 16 can be part of the circuits of the high speed input/output serial gate.

Figure 10B:
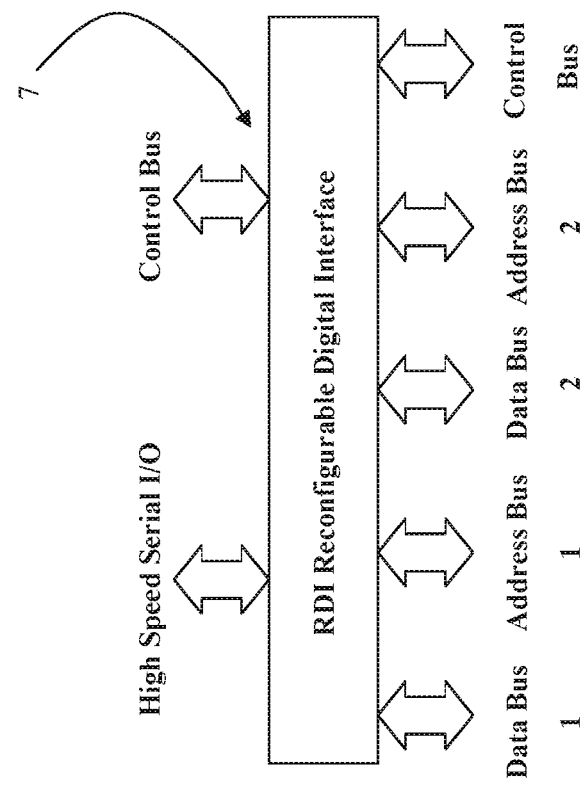
FIGS. 10A-10B show a first schematic representation from above of a first and of a second configuration of a reconfigurable digital interface RDI, according to one embodiment.
Figure 10A:
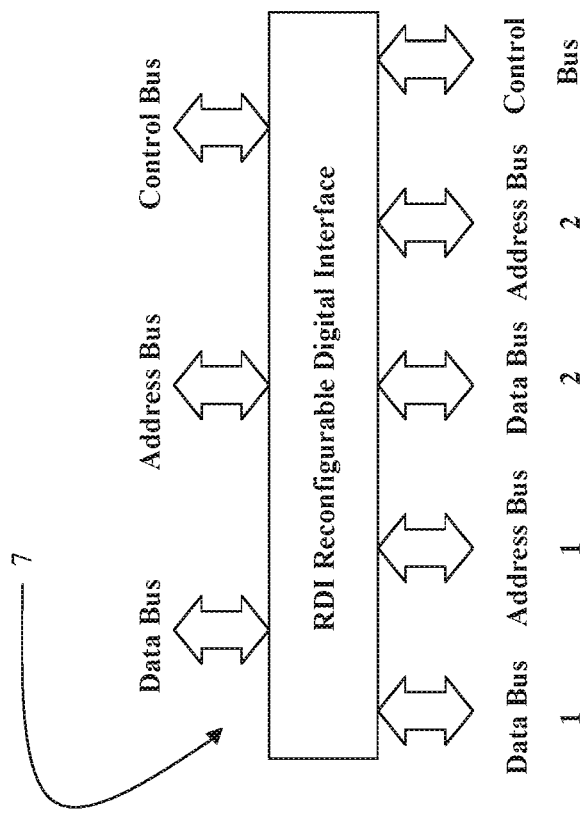

By way of example, FIG. 10 shows two different configurations of the interface RDI 7 simultaneously connected to two devices DUT, not shown in the figure, that can be identical or different from each other. In the configuration shown in FIG. 10A, the interface RDI 7 comprises data buses 1 and address buses 1 of connection to the first device DUT; data buses 2 and address buses 2 of connection to the second device DUT and, moreover, a control bus. Moreover, the interface RDI comprises a data bus, an address bus and a control bus that go to an external system, for example an ATE, not shown in the figure. Alternatively, in the configuration shown in FIG. 10B, the interface RDI 7 is provided with a high voltage serial input/output I/O gate for the communication with an external system or ATE.

A generic message received by the ATE or by any external system is made of a group or sequence of bits divided into at least one first part, called Header, that expresses the meaning of the message and a second part, called Body, that expresses the content of the message. Advantageously, the message can contain also other bits, such as, for example, a cyclic redundancy control bit or Cyclic Redundancy Check (CRC) or a parity bit, or also employ other known techniques that are useful to ensure the accuracy of the message.

Advantageously, the message can be coded in a suitable code and use a suitable protocol, that do not however limit the idea.

Figure 11:
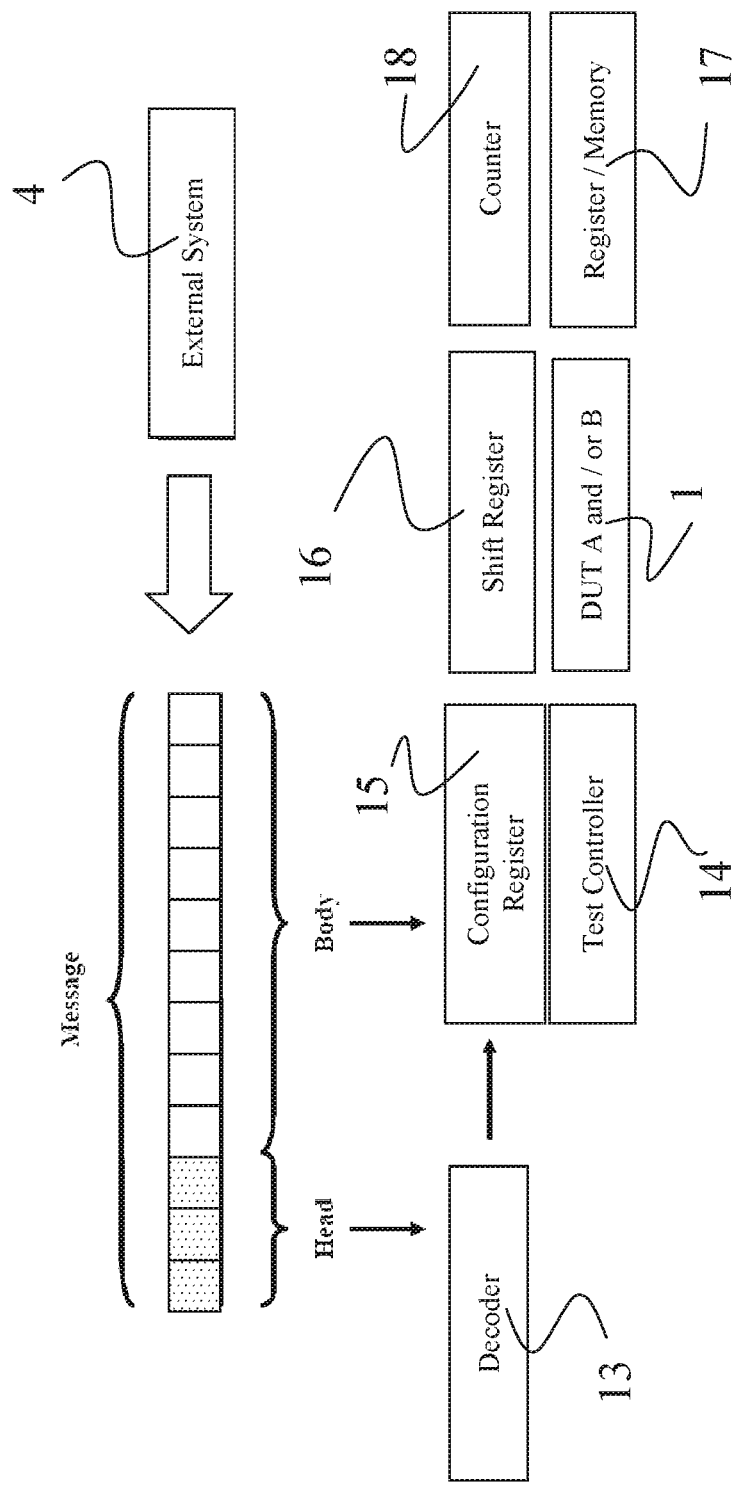
FIG. 11 shows a schematic representation of a message coming from a digital ATE, or from a generic system external to a device DUT, and received by an interface RDI, according to one embodiment.

By way of example, FIG. 11 schematizes the step of sending through a generic external system, for example the ATE 4, control signals for the electric testing to at least one DUT 1. These signals or messages, divided into Header and Body are received by the interface RDI 7. The Decoder 13 interprets, in its interior, the Header of the message, so that its content Body can be sent to the Test Controller 14, or alternatively be sent to at least one between a first DUT 1A and a possible second DUT 1B or alternatively be copied in at least one register or in a volatile or non volatile memory both indicated with 17.

Figure 12:
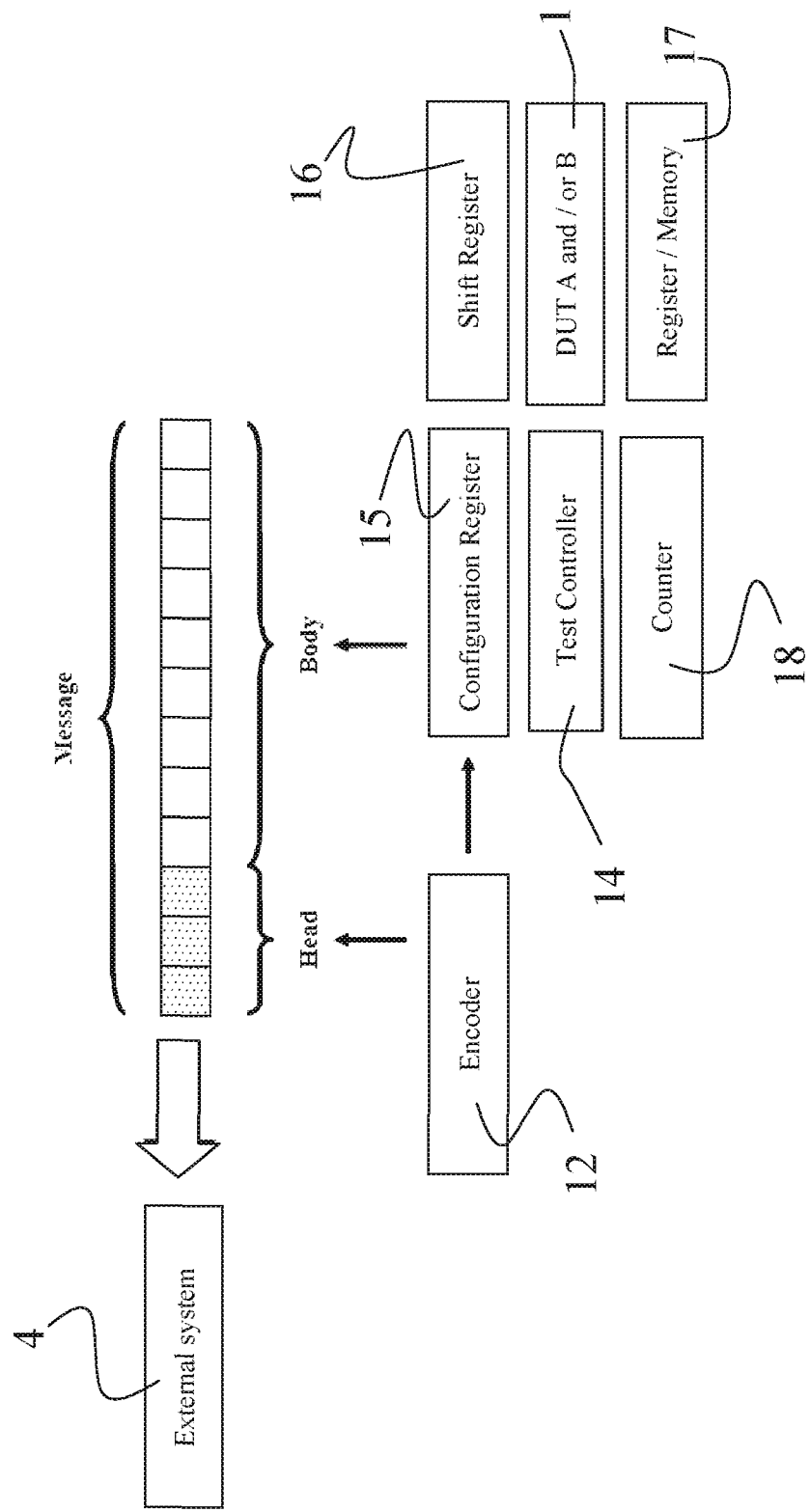
FIG. 12 shows a schematic representation of a message sent from an interface RDI to a digital ATE, or to a generic system external to the device DUT, according to one embodiment.

Similarly, FIG. 12 schematizes the step of sending from at least one DUT 1 to a generic external system, for example the ATE 4, response messages through the interface RDI 7. In this case, the Encoder 12 creates the Header of the message that is sent to the ATE 4, while its content Body is collected by the Test Controller 14, or alternatively by at least one between a first DUT 1A and a possible second DUT 1B or alternatively collected by at least one register or by a volatile or non volatile memory both indicated with 17.

The digital interface RDI 7 can, moreover, comprise also a Configuration Register 15, that has the function of modifying the configuration, or better the architecture of the interface RDI 7 according to the different needs or operation modes, and at least one counter block 18.

Advantageously, the content of the Header can give indications on the fact that in the Body of the message there is for example at least one command, or at least one datum, or at least one request or question, or at least one response, or at least one part of the configuration of the RDI, or at least one part of a scan vector, or at least one part of a signature, or at least one part of the shape of a Clock signal (clock shape), or at least one part of description of the error occurred.

Further advantageously, at the first turn-on of the interface RDI 7, the process comprises for example the steps of:
  making the reset of the interface RDI 7;
  programming the configuration of the interface RDI 7 for making the testing thereof;
  making the testing of the interface RDI 7 possibly through the Test Controller 14;
  programming the configuration of the interface RDI 7 for the testing of at least part of a first DUT 1A;
  making at least in part the testing of the at least one first DUT 1A connected to the interface RDI 7;
  programming the configuration of the interface RDI 7 for the testing of at least part of a second DUT 1B;
  making at least in part the testing of the at least one second DUT 1B connected to the interface RDI 7 through the Test Controller 14;
  programming the configuration of the interface RDI 7 for its use in the final application.

Figure 13:
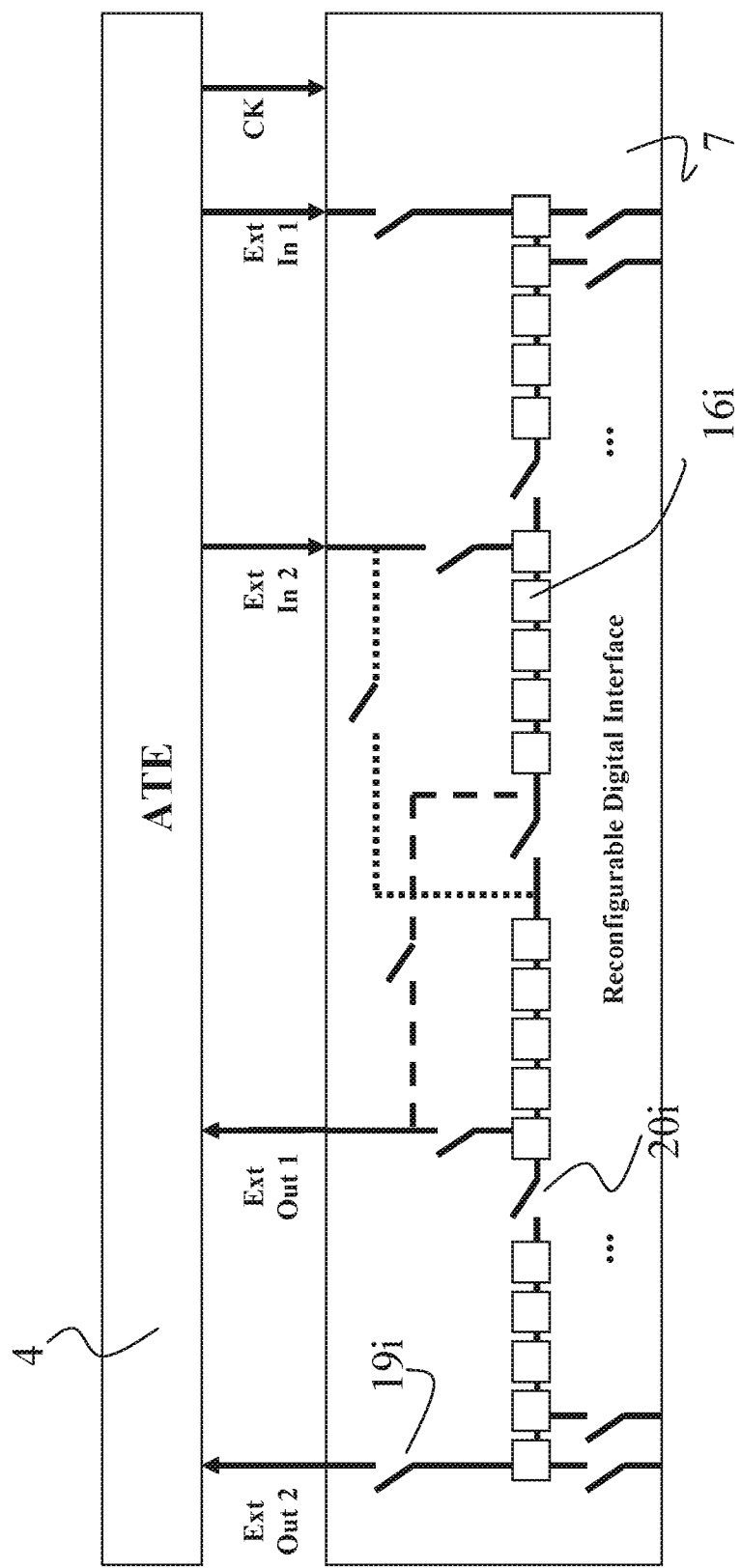
FIG. 13 shows a second schematic representation from above of a reconfigurable digital interface RDI connected to an ATE, according to one embodiment.

By way of example, FIG. 13 schematizes the interface RDI 7 to the aim of understanding its operation. In particular, the interface RDI 7, which is connected to the ATE 4, comprises at least one or a plurality of shift registers 16$i$ (with i comprised between 1 and N), each connected, through switches 19$i$ (with i comprised between 1 and N), to the ATE 4 and, through switches 20$i$ (with i comprised between 1 and N−1), to the adjacent shift register. By varying the length of at least one shift register 16$i$ (with i comprised between 1 and M), it is possible to reconfigure the interface RDI 7 for then connecting it to at least one device DUT and to an external system that can be the ATE.

Advantageously, the switches for example can be solid state switches, such as for example MOS transistors, or buffers or logic gates or multiplexer circuits or demultiplexer circuits.

Figure 14:
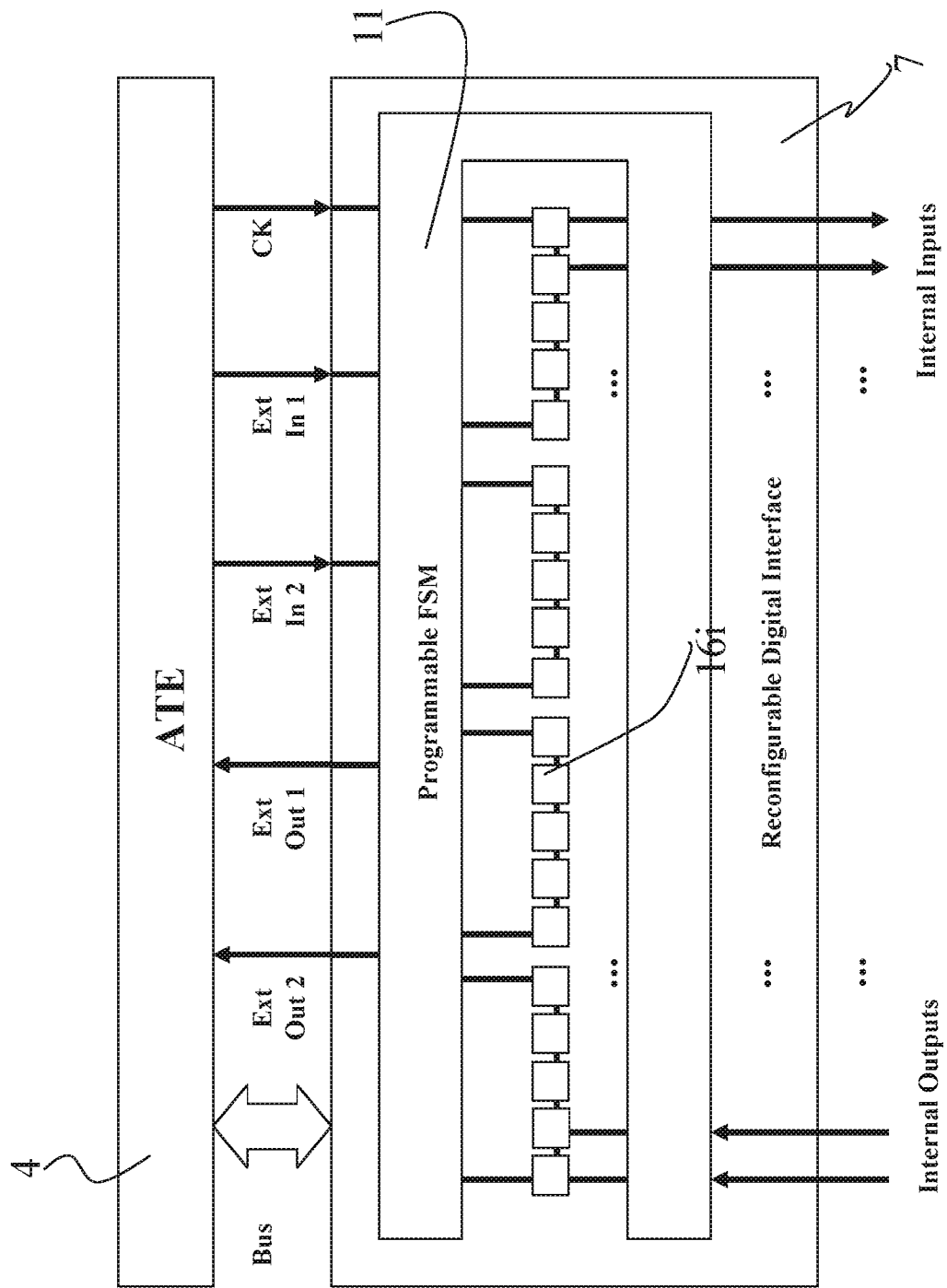
FIG. 14 shows a third schematic representation from above of a reconfigurable digital interface RDI connected to an ATE, according to one embodiment.

By way of mere example, FIG. 14 shows an interface RDI 7 being connected to an external system, for example the ATE 4, through a first and a second input terminal In1ext and In2ext, a first and a second output terminal Out1ext and Out2ext, a Bus and a clock signal CK. The interface comprises internal input terminals and output terminals and a programmable finite state machine (FSM) 11 that comprises a plurality of flip flops and some of them are grouped to form a plurality of shift registers 16$i$. The various flip flops of the interface RDI 7 can create at least one scan chain inside the interface RDI 7.

Figure 15:
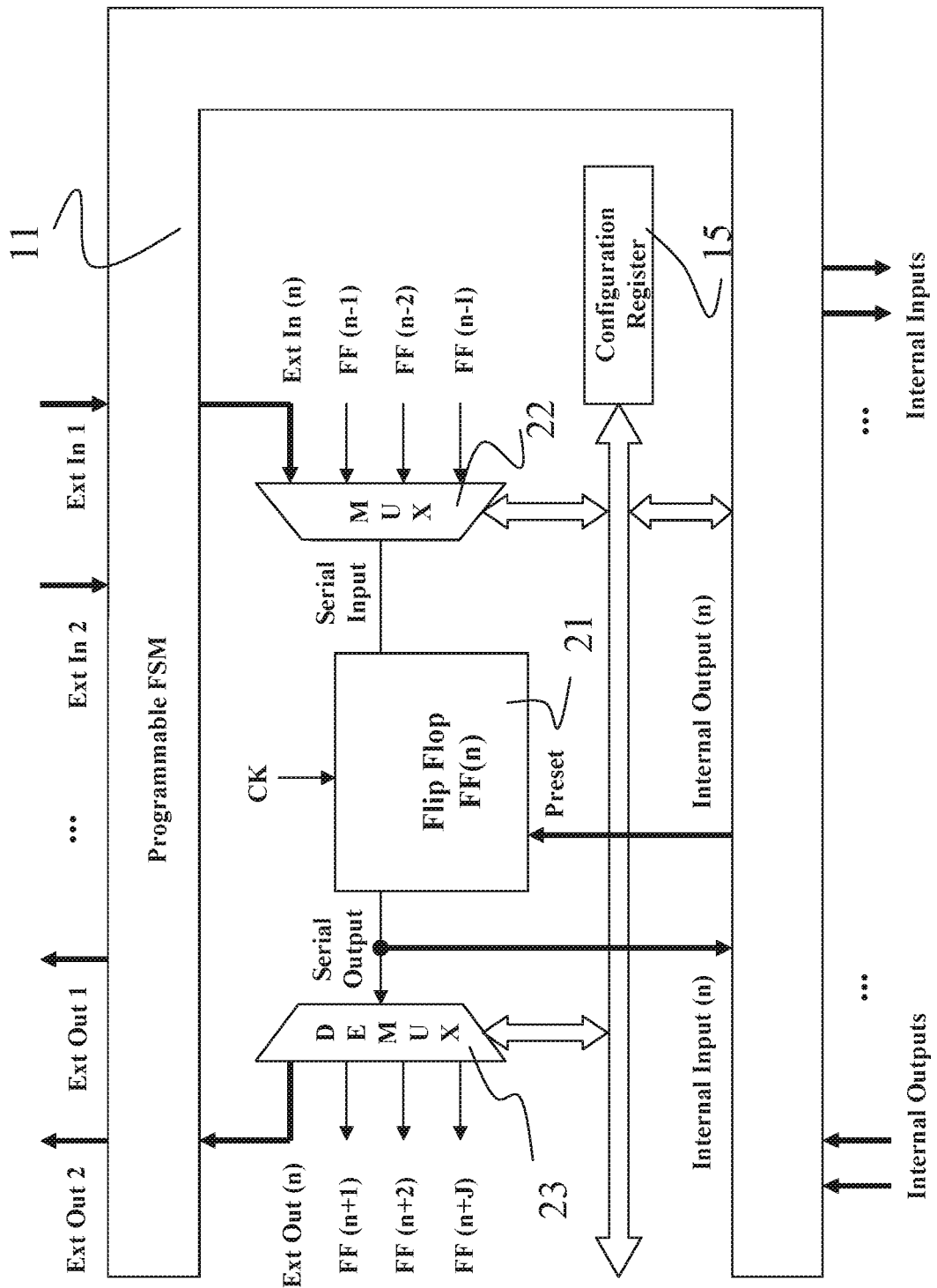
FIG. 15 shows a schematic representation from above of a flip flop being part of a finite state machine (FSM) incorporated in an interface RDI, according to one embodiment.

FIG. 15 shows, for example, part of the whole internal architecture of the interface RDI 7. In particular, in the finite state machine (FSM) 11 a generic flip flop 21 is connected to the preceding flip flops N−1 . . . N−I through a multiplexer circuit 22, to the successive flip flops N+1 . . . N+I through a demultiplexer circuit 23, said multiplexer 22 and demultiplexer 23 circuits interfaced with a Configuration Register, again indicated with 15. In this way it is possible to realize a generic shift register 16 of the interface RDI 7 whose length depends on the specific programming of the Configuration Register 15 or of at least a part thereof.

Figure 16:
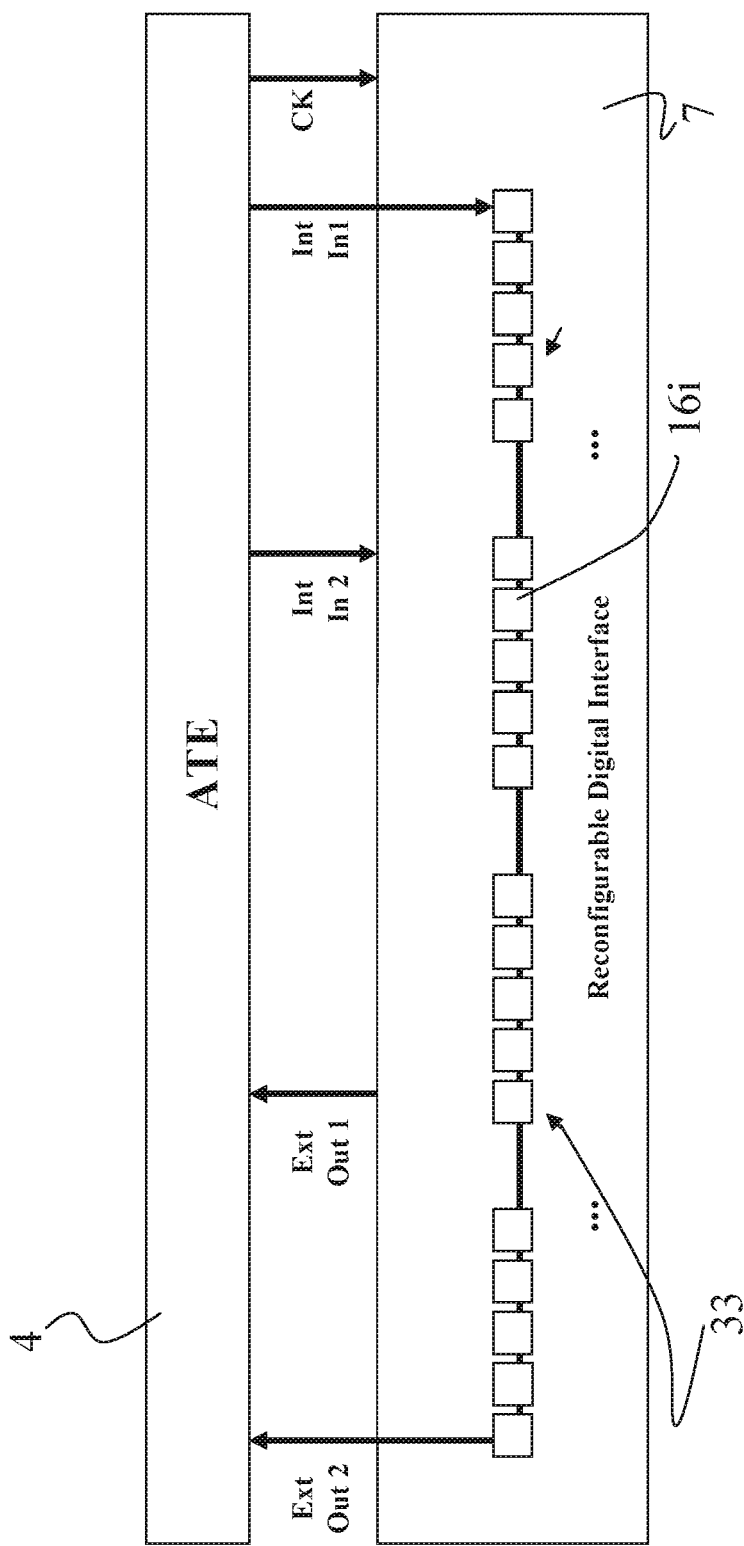
FIG. 16 shows a fourth schematic representation from above of a reconfigurable digital interface RDI connected to an ATE, according to one embodiment.
Figure 17:
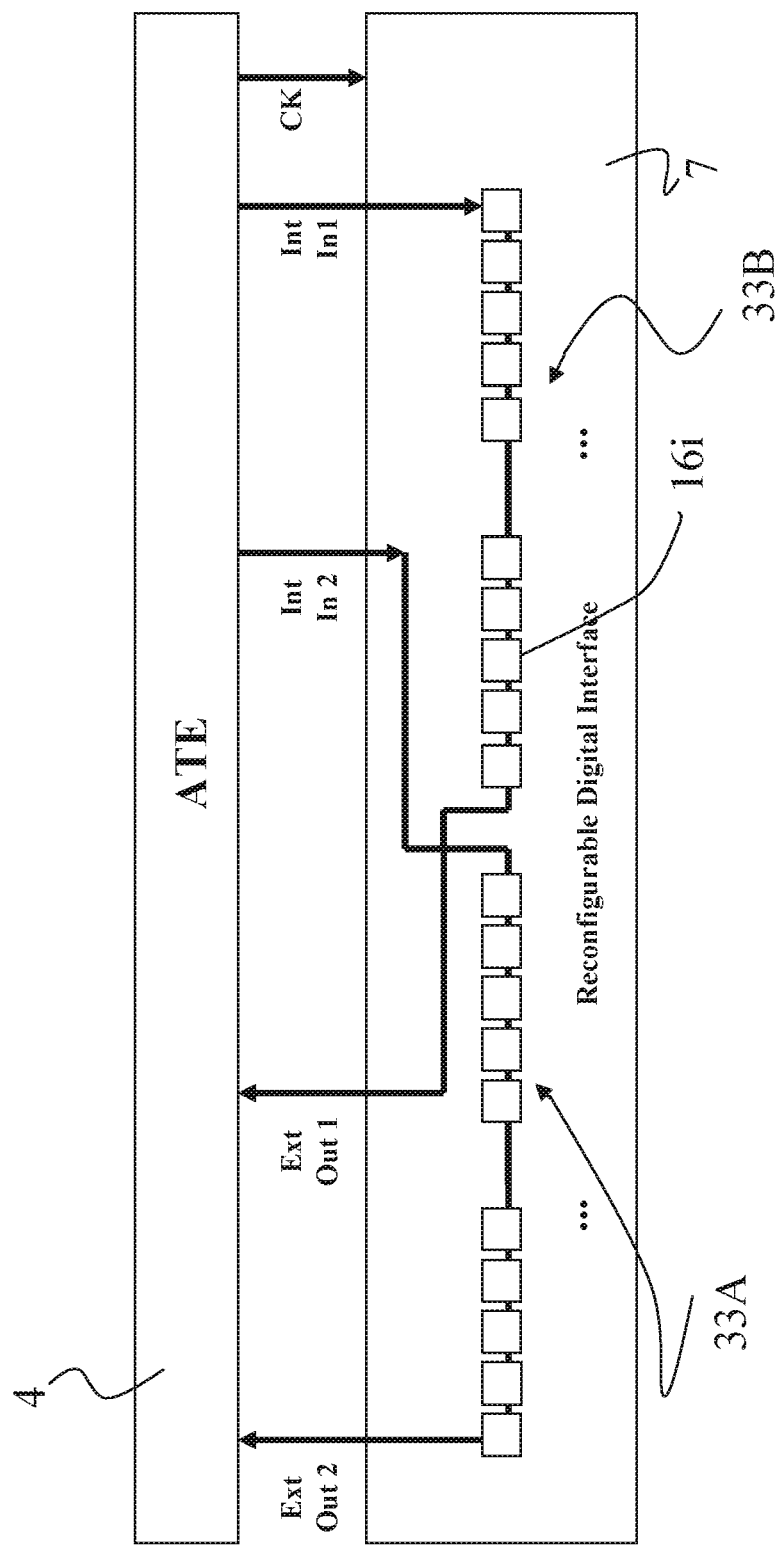
FIG. 17 shows a fifth schematic representation from above of a reconfigurable digital interface RDI connected to an ATE, according to one embodiment.

Advantageously, for making the testing of the same interface RDI, this can be configured in such a way as to comprise a single scan chain 33 for the testing of the digital circuits comprised in the RDI, as shown in FIG. 16, or a plurality of scan chains, for example two scan chains 33A and 33B of FIG. 17.

Figure 18:
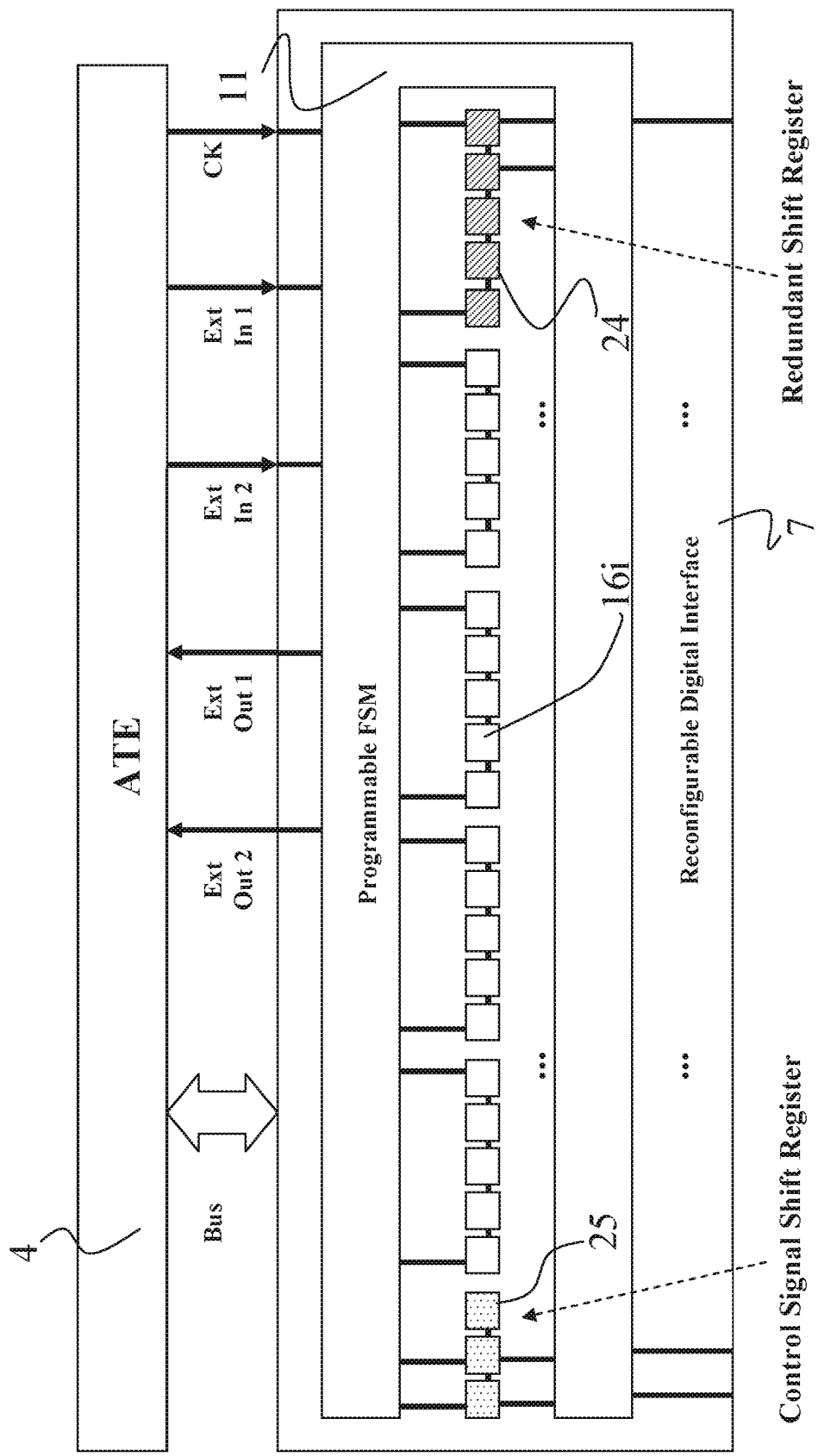
FIG. 18 shows a sixth schematic representation from above of a reconfigurable digital interface RDI connected to an ATE, according to one embodiment.

Advantageously, as shown in FIG. 18, the interface RDI 7 can comprise a redundant shift register 24, or at least one redundant flip flop, able to substitute a shift register that does not correctly operate, to the aim of reducing the loss of electric performance.

Advantageously, the interface RDI shown in FIG. 18 can also comprise a shift register 25 of the control signals, or alternatively a dedicated part of one of the shift registers 16$i$, containing control signals coming from at least one device DUT or both entering at least one device DUT and coming from at least one external system like the ATE.

Advantageously, the group of the shift registers 16$i$, 24 and 25 creates an interface Low Pin Count (LPC), suitable for transmitting the stimuli and the test responses, like the scan vectors and the signatures, and for exchanging control signals between the external system and the interface RDI, connected to a device DUT, and possible other information such as for example the value of the digital inputs of the DUT not connected to scan chains or test interfaces with scan chain.

The digital communication between the DUT and the ATE occurs, then, by using a minimum number of lines of the digital channel Chd, i.e., an extremely reduced subgroup of connections put at disposal by the DUT, that are connected to the resources of the ATE.

Figure 19:
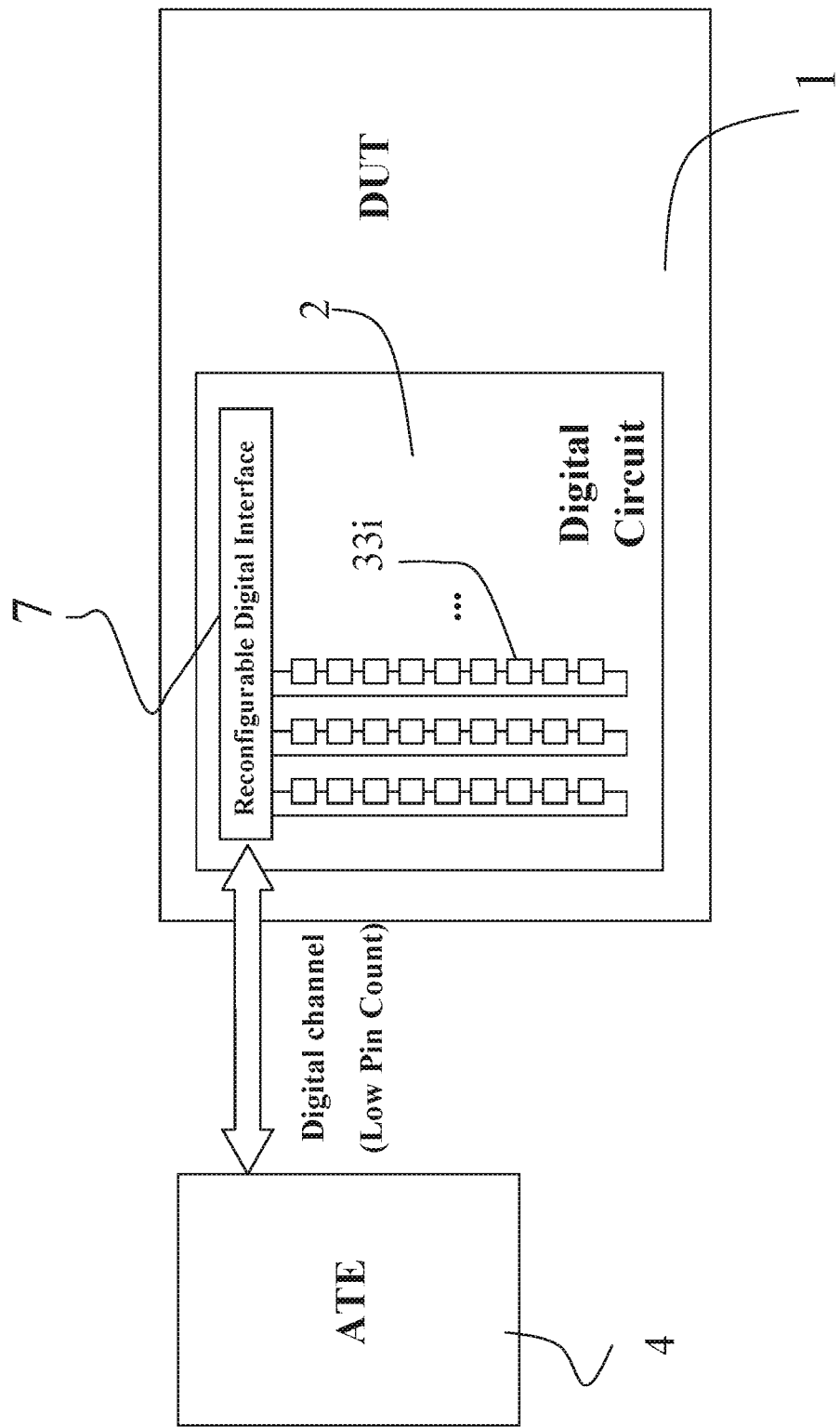
FIG. 19 shows a schematic representation from above of a digital ATE connected to a device DUT comprising a digital block comprising an interface RDI connected to scan chains, according to one embodiment.

According to an aspect of one embodiment, the interface RDI 7 can be incorporated in a digital block 2 incorporated in a DUT 1 and connected to the scan chains 33$i$ (with i=1 . . . N) also comprised in the digital block 2, as schematized in FIG. 19.

Figure 20:
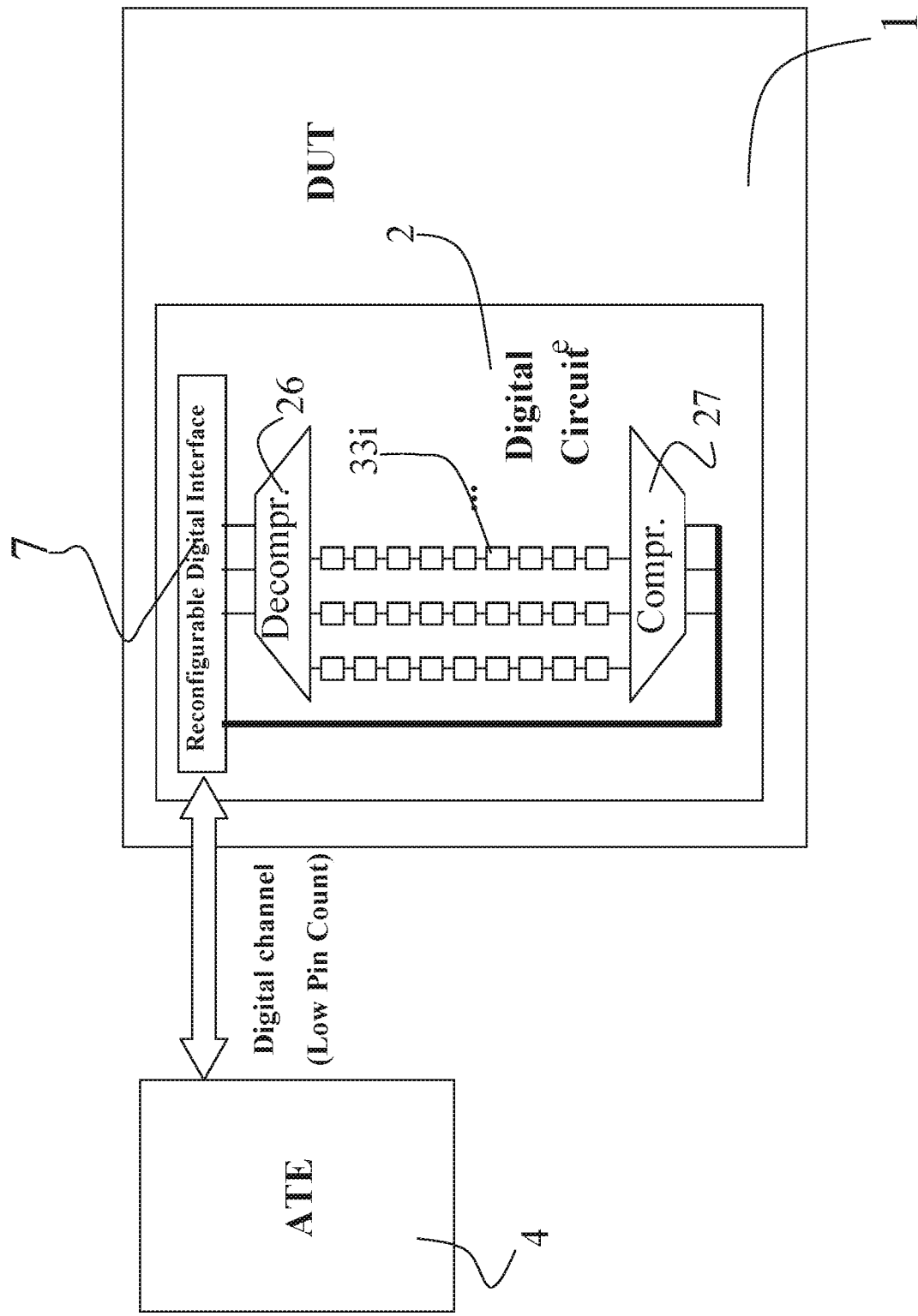
FIG. 20 shows a schematic representation from above of a digital ATE connected to a device DUT comprising a digital block comprising an interface RDI connected to compressed scan chains, according to one embodiment.

In another aspect of one embodiment, the interface RDI 7 can be connected to a decompression circuit 26 and to a compression circuit 27 between which the scan chains 33$i$ are interconnected, as shown in FIG. 20.

Advantageously, the interface RDI can be also connected to other interfaces of the DUT, for example an interface JTAG, or to a Test Access Port (TAP), or at least one resource of the DUT necessary for the test of the same DUT. In this sense the interface JTAG can be used for forcing and/or catching the values of the digital inputs and outputs of the DUT not connected to the RDI 7, in fact these inputs and outputs can be the primary inputs and primary outputs.

Figure 21:
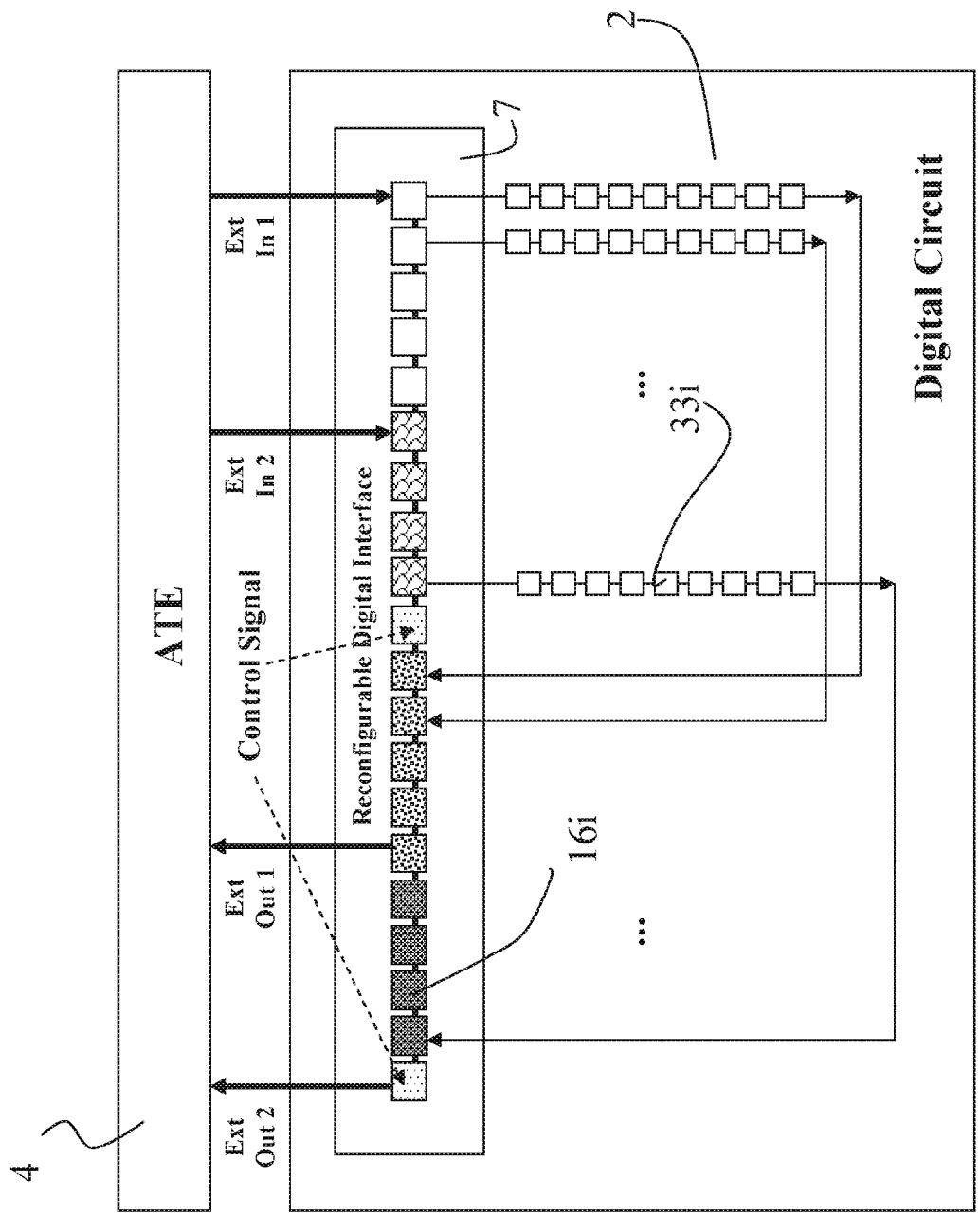
FIG. 21 shows a first schematic representation from above of a digital ATE connected to a digital block of a device DUT comprising an interface RDI and scan chains, according to one embodiment.
Figures 22A, 22B:
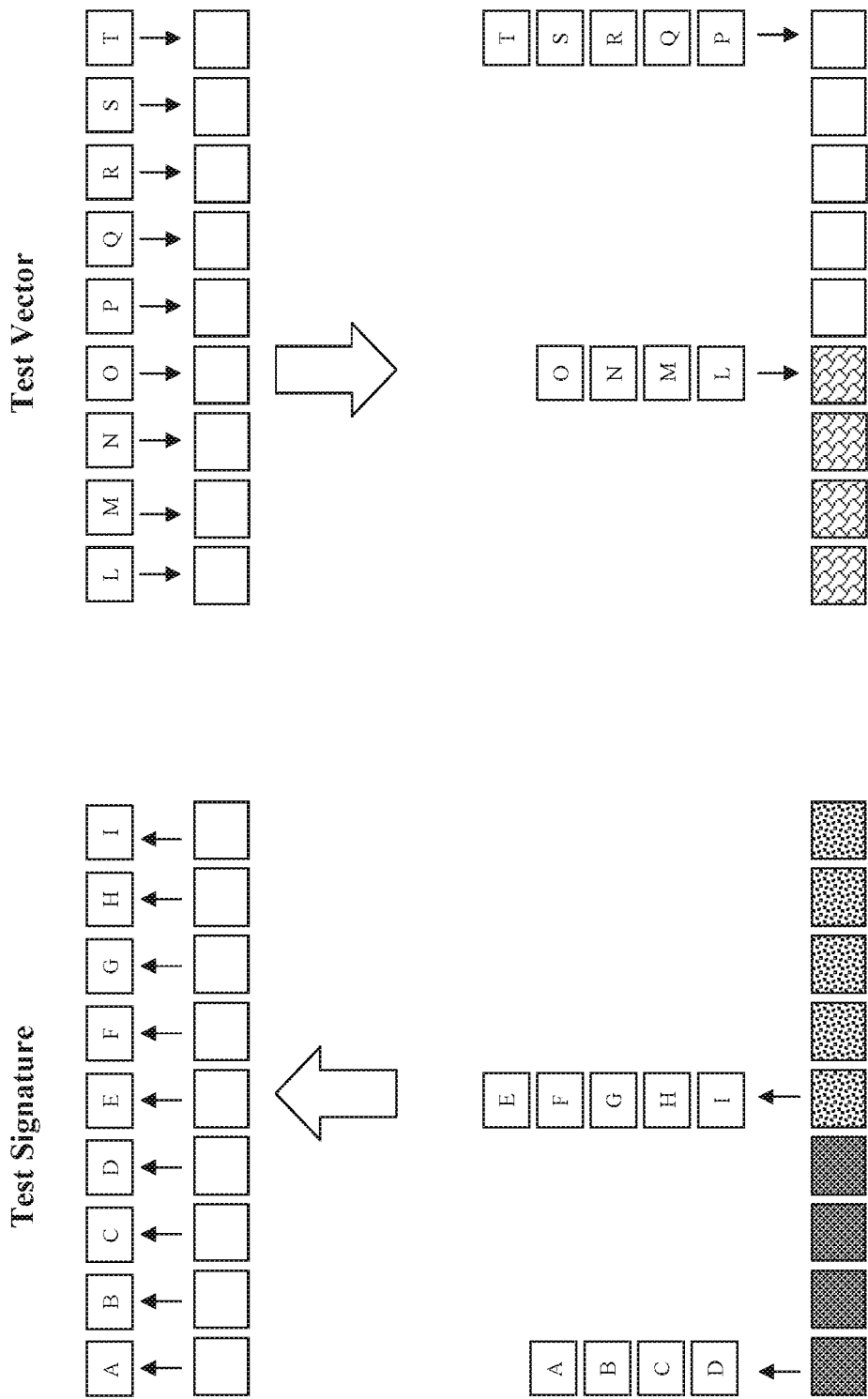
FIGS. 22A-22B and 23A-23B show a schematic representation of the mixing step of the scan vectors sent by the ATE at the input of an interface RDI incorporated in a digital block of a device DUT, not shown, to a digital ATE connected thereto, and the demixing of the signatures at the output of the interface RDI, according to one embodiment.
Figures 23A, 23B:
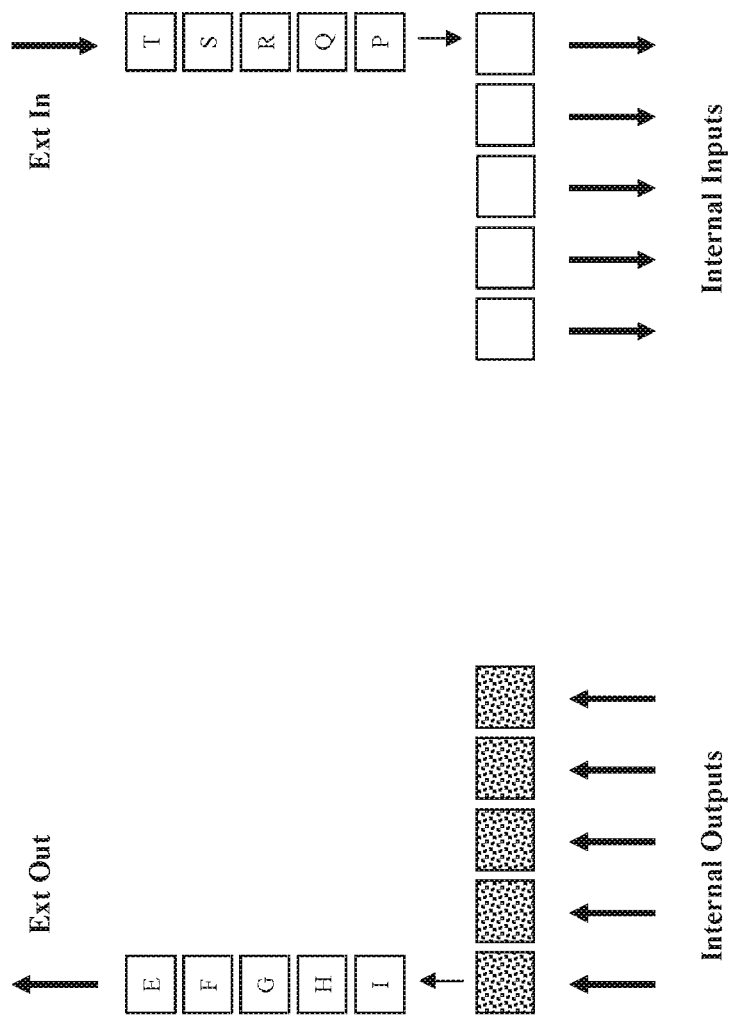

FIG. 21, by way of mere example, schematizes the step of the testing of exchange of scan vectors, signatures and of control signals between the ATE 4 and the interface RDI 7. According to the configuration of the interface RDI 7, the bits of the scan vectors coming from the ATE 4 and of the signatures that are sent to the ATE 4 are suitably adapted or mixed, as, for example, it is schematized in FIG. 22. In particular, FIG. 22B schematizes an example of mixing process of the bits of the scan vectors at the input of the interface RDI 7 by the ATE 4 and FIG. 22A shows the mixing of the bits of the signatures at the output of the interface RDI 7 to the ATE 4. More in detail, considering FIGS. 21 22 A and B the presence of a control signal requires that the bits of the original scan vectors are mixed with each other in parts of different length further to the configuration of the shift registers of the RDI 7. Obviously different configurations of the RDI 7 will have the possibility to be used so that the bits of the original scan vectors are mixed with each other in parts of identical length. By way of example, if a digital signal at 50 MHz comprising a part of the mixed test vectors, like the one shown in FIG. 23B, is sent by the ATE 4 to the input terminal ExtIn of the interface RDI 7, it is demixed through at least one shift register 16$i$ incorporated in the interface RDI 7 and, subsequently, placed at the internal input terminals or Internal Inputs of the device DUT 1. The signals present, then, on these input terminals of the DUT are at a frequency reduced by a factor N with respect to the signals present on the input terminals ExtIn of the interface RDI 7, where N is equal to the number of flip flops comprised in a shift register 16$i$. Therefore, the flip flops contained in the shift register 16$i$ shown in the example schematized in FIG. 23B being five, the frequency of the digital signal present on an input terminal of the DUT is equal to 10 MHz. Similarly, the signals are processed, the ones that from the internal output terminals or Internal Outputs of the DUT are sent to the output terminals ExtOut of the interface RDI 7, which will be at a frequency higher of a factor N with respect to the signals of the internal output terminals, like the one schematized in FIG. 23A.

Advantageously at least one channel of the tester ATE will work at a higher frequency exploiting as much as possible the available band of the at least one channel being considered.

Advantageously the number can thus be reduced of the channels of the tester ATE that are used for the testing of the single DUT, thus allowing to increase the test parallelism and reducing the costs.

Figure 24:
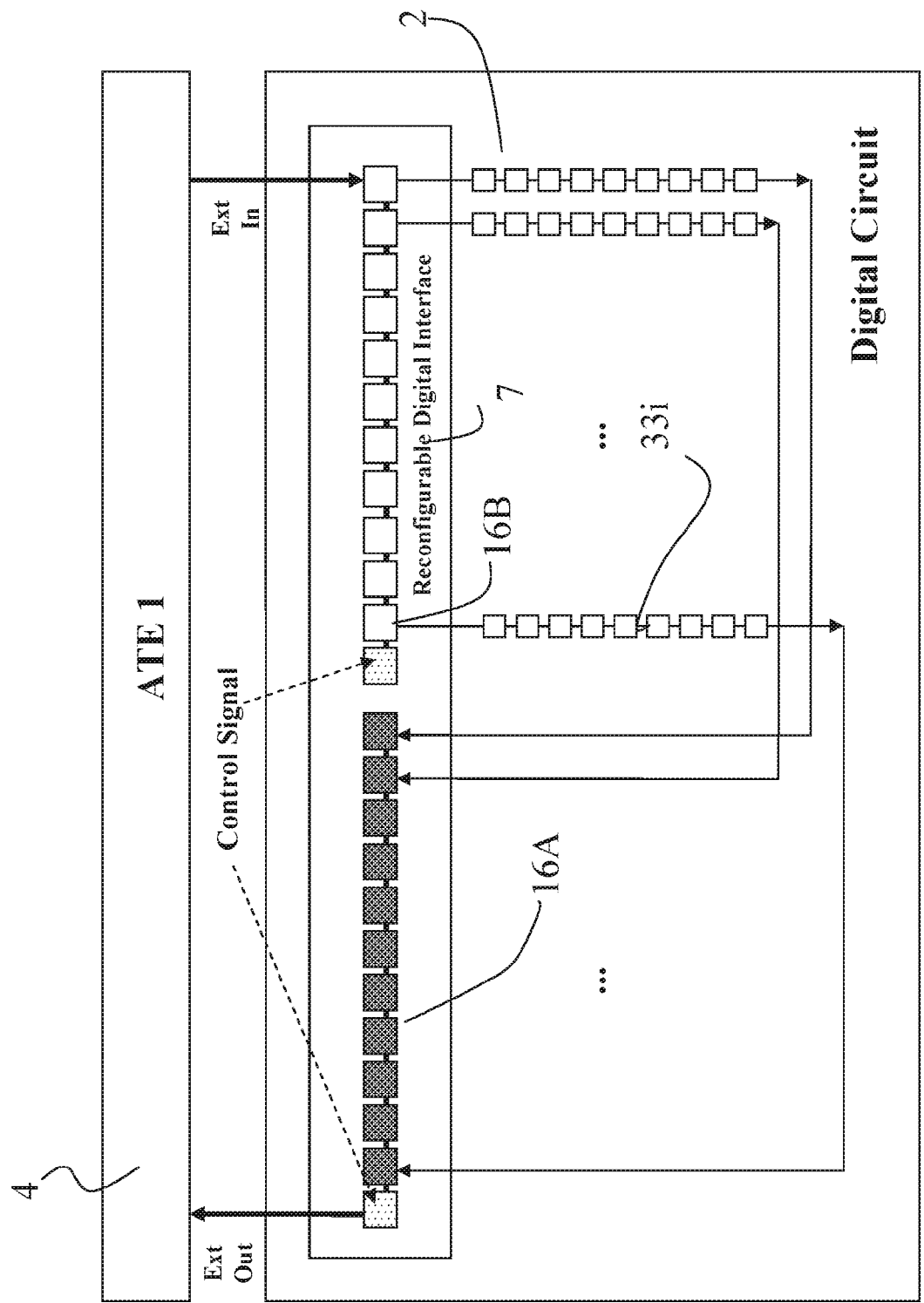
FIGS. 24, 25, 26 and 27 show a second, third, fourth and fifth schematic representations from above of a digital ATE connected to a digital block of a device DUT comprising an interface RDI and scan chains, according to one embodiment.

Advantageously, the interface RDI 7 can comprise shift registers of programmable length. For example, FIG. 24 schematizes the interface RDI 7 with the signals present on the input terminal ExtIn and on the output terminal ExtOut having the same band since the interface RDI 7 has been configured for having shift registers 16A and 16B that have the same length.

Figure 25:
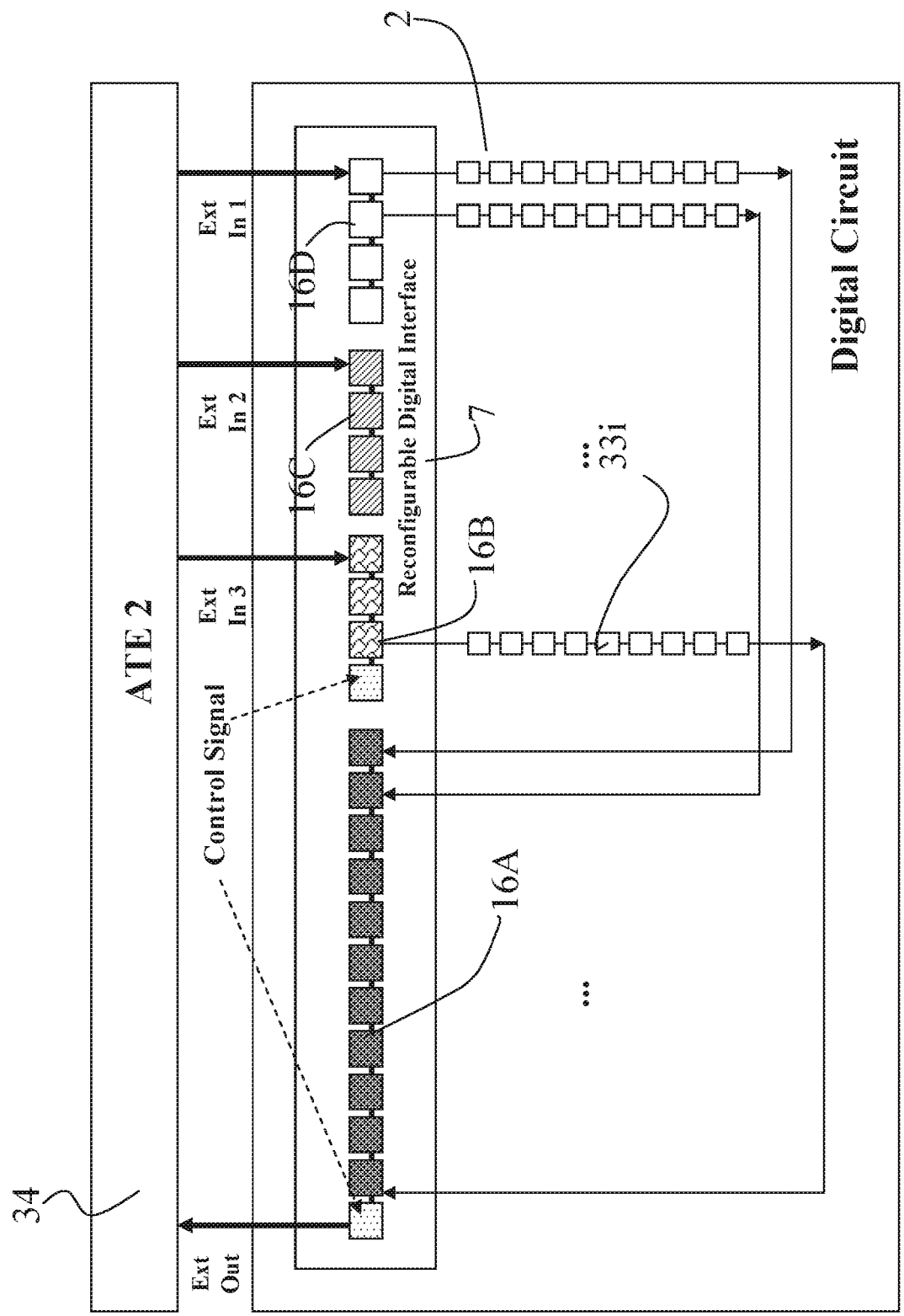

Advantageously it is possible to reconfigure the interface RDI 7 so as to use also the channels of a second tester ATE 34 having different characteristics with respect to the first ATE 4. By way of example, FIG. 25 shows the interface RDI 7, comprising three shift registers 16B, 16C and 16D of a given length and a fourth shift register 16A of treble length with respect to the first three ones. Therefore, the frequency of the signal that is sent, through the output terminal ExtOut, from the interface RDI 7 to the ATE 34 is at least treble with respect to the signals coming from the ATE 34 and received by the interface RDI 7 through the input terminals ExtIn i (with i=1, 2, 3).

Advantageously the RDI allows to use also testers ATE with different characteristics for the testing of the same DUT thus increasing the flexibility and reducing the production costs.

Advantageously, the supervised testing methodology can be applied also in case the scan compression technique is used.

Figure 26:
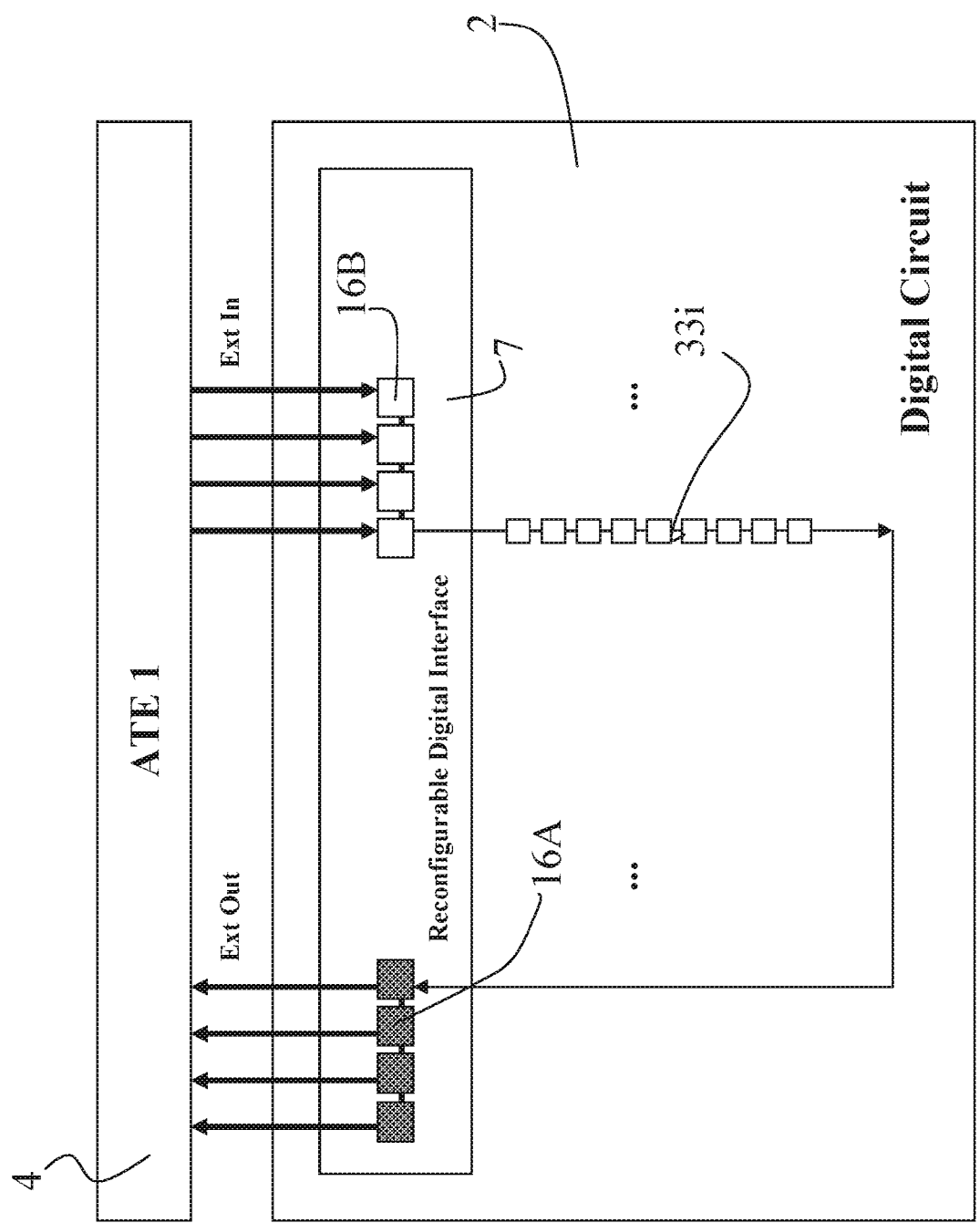

Advantageously, the supervised testing methodology can be applied also in the execution of the testing at-speed of the device DUT. By way of example, FIG. 26 shows the interface RDI 7 configured for comprising a first and a second shift register 16A, 16B of equal length and scan chains 33$i$, in which the scan vectors are charged at a higher speed, for example 120 MHz, with respect to the speed, for example 30 MHz, with which the channels of the tester ATE 4 send and receive signals. Similarly, also the signatures are discharged at 120 MHz.

Figure 27:
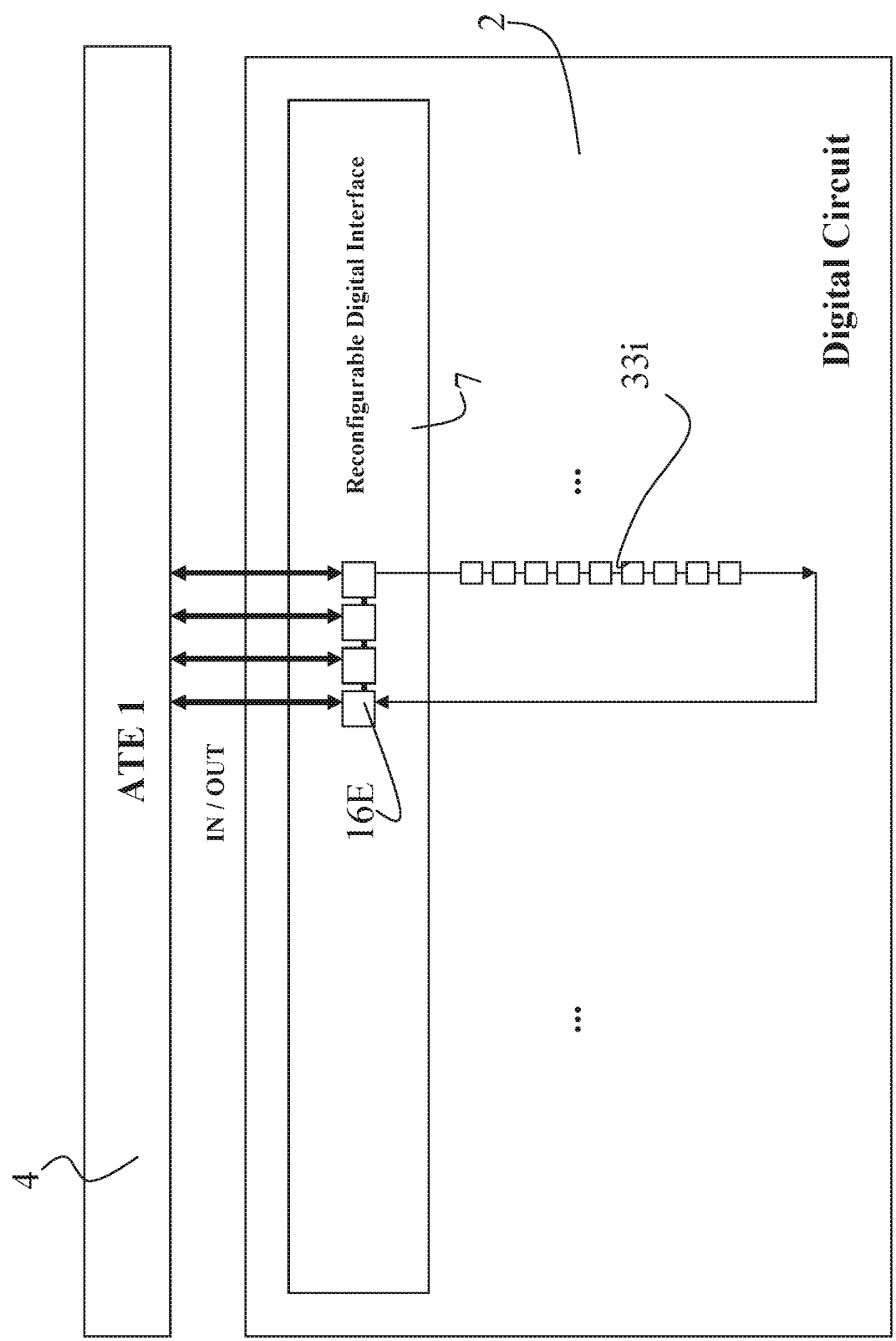

Advantageously, it is possible to reduce the number of shift registers comprised in the interface RDI 7 by using the channels of the tester ATE in a bidirectional way. FIG. 27 shows, for example, the interface RDI 7 being configured in such a way that the single scan chain 33$i$ is part of a circular shift register formed by the same scan chain 33$i$ and by a shift register 16E, where this shift register 16E is suitable for being first read by the ATE 4, that will acquire part of the signature, and then the ATE 4 will write part of the scan vector in the same shift register 16E and then there will be the shift of the data in the circular shift register.

Advantageously the shift frequency of the circular shift register can be higher than the read/write frequency of the ATE 4.

Figure 28B:
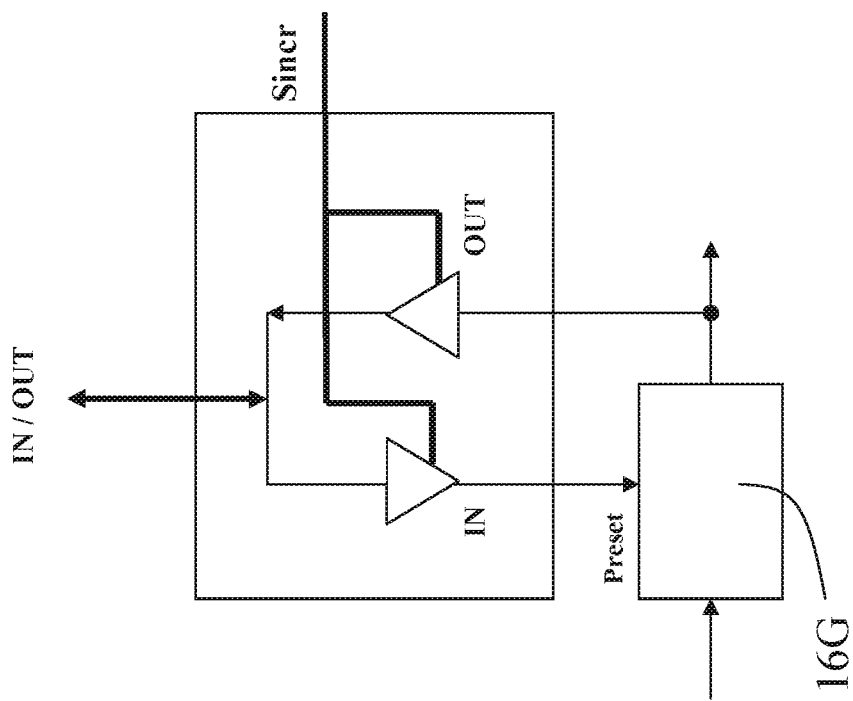
FIGS. 28A-28B show a sixth schematic representation from above of a digital ATE connected to a digital block of a device DUT comprising an interface RDI and scan chains, and a representation of a synchronism signal Sincr suitable for routing the signals coming from the ATE, according to one embodiment.
Figure 28A:
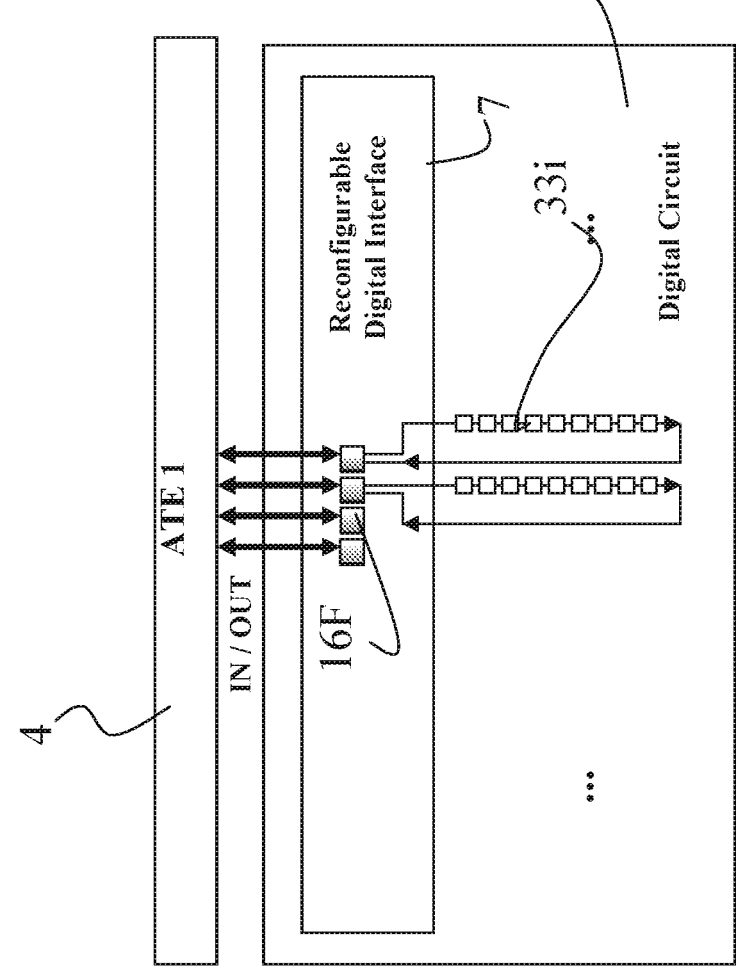

FIG. 28A shows, according to a further aspect of one embodiment, the interface RDI 7 comprising elements 16F, made of a single element of the shift register 16E, and suitable for suitably routing the signals coming, in a bidirectional way, from the channel of the tester ATE 4, through a suitable synchronism signal Sincr, being obtained by processing or modifying the clock signal, that, as shown, for example in FIG. 28B, drives alternatively for example two buffers, or two drivers, or two unidirectional solid state switches, so as to connect through a flip flop both the input and the output of a scan chain 33$i$ to a bidirectional channel of the tester ATE 4. It follows that, whether the signal Sincr has a rise or fall front or a value equal to zero or to one, at least one bit of a signature is taken at the input of the ATE 4 and at least one bit of a scan vector is taken at the input of the interface RDI 7. The flip flop 16G can be omitted, or this flip flop can be also one of the flip flops of the scan chain 33$i$.

Figure 29:
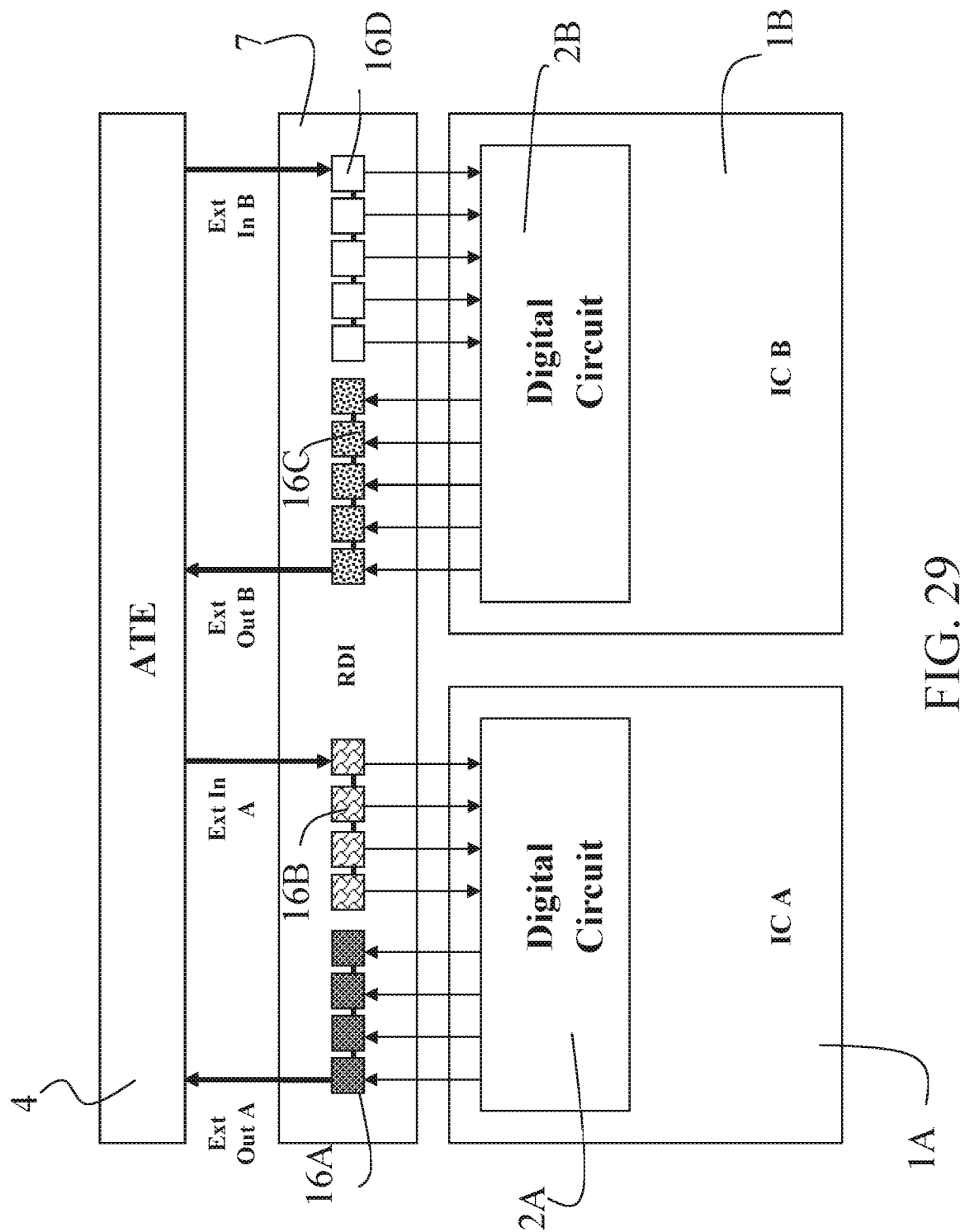
FIGS. 29, 30, 31, 32 and 33 show a first, second, third, fourth and fifth schematic representations from above of a digital ATE connected to a first device DUT 1A and to a second device DUT 1B, each comprising a digital block, through an interface RDI external to the DUT, according to one embodiment.

Advantageously, it is possible to use the interface RDI for making the testing of at least one device DUT if the interface RDI is external to the device DUT. By way of example, FIG. 29 shows the external interface RDI 7 both with respect to a first device DUT 1A and to a second device DUT 1B, respectively comprising a digital block 2A and 2B. A first part of the interface RDI 7 comprising the shift registers 16A and 16B is used for the testing of the first device DUT 1A and a second part comprising the shift registers 16C and 16D for the testing of the second device DUT 1B.

Figure 30:
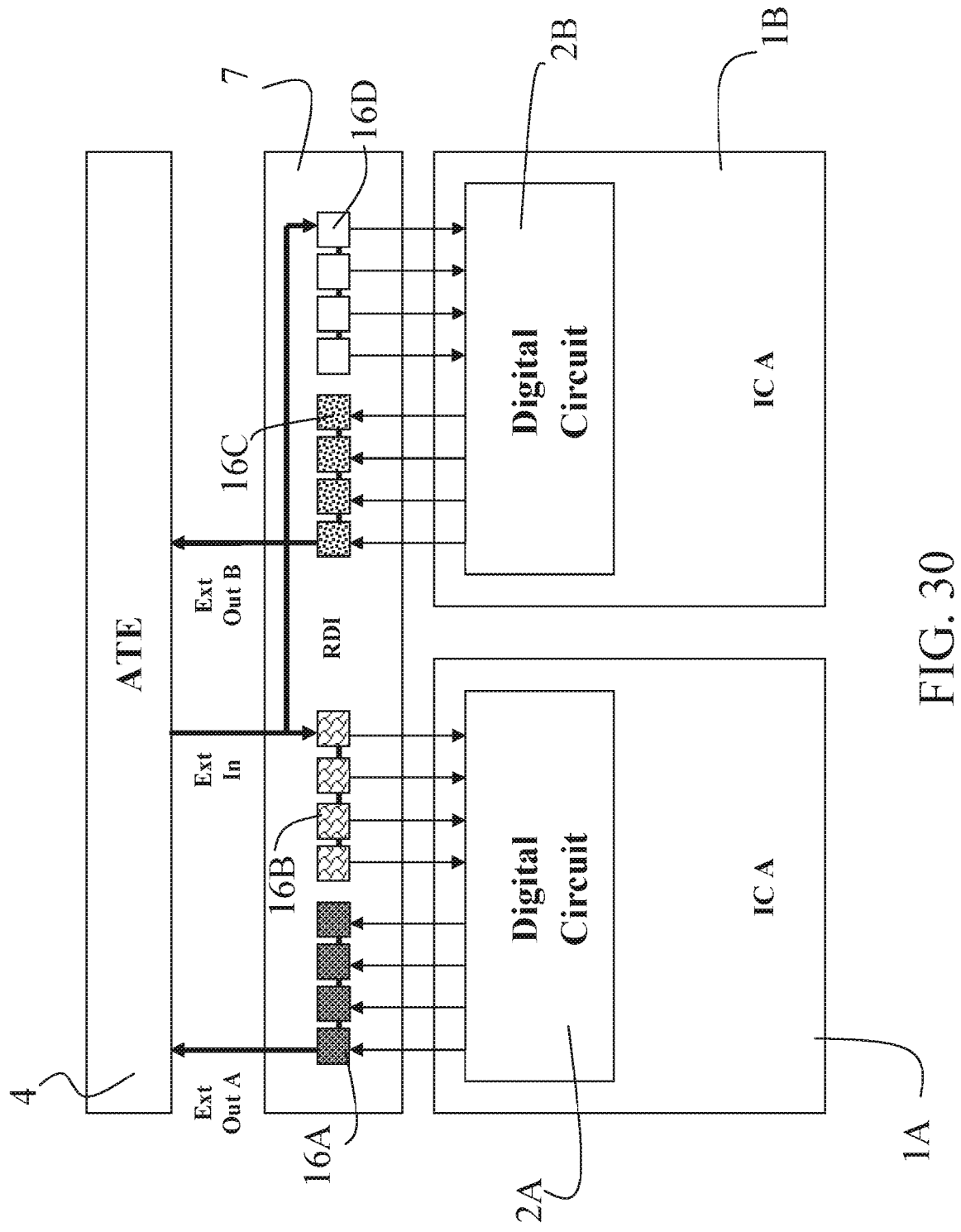

Advantageously, if the two devices DUT 1A and DUT 1B are structurally identical, the number of channels used by the ATE 4 for sending the scan vectors can be reduced. In the example shown in FIG. 30, the number of input terminals ExtIn of reception of signals by the ATE 4 is reduced from two to one which enters the shift registers 16B and 16D.

Figure 31:
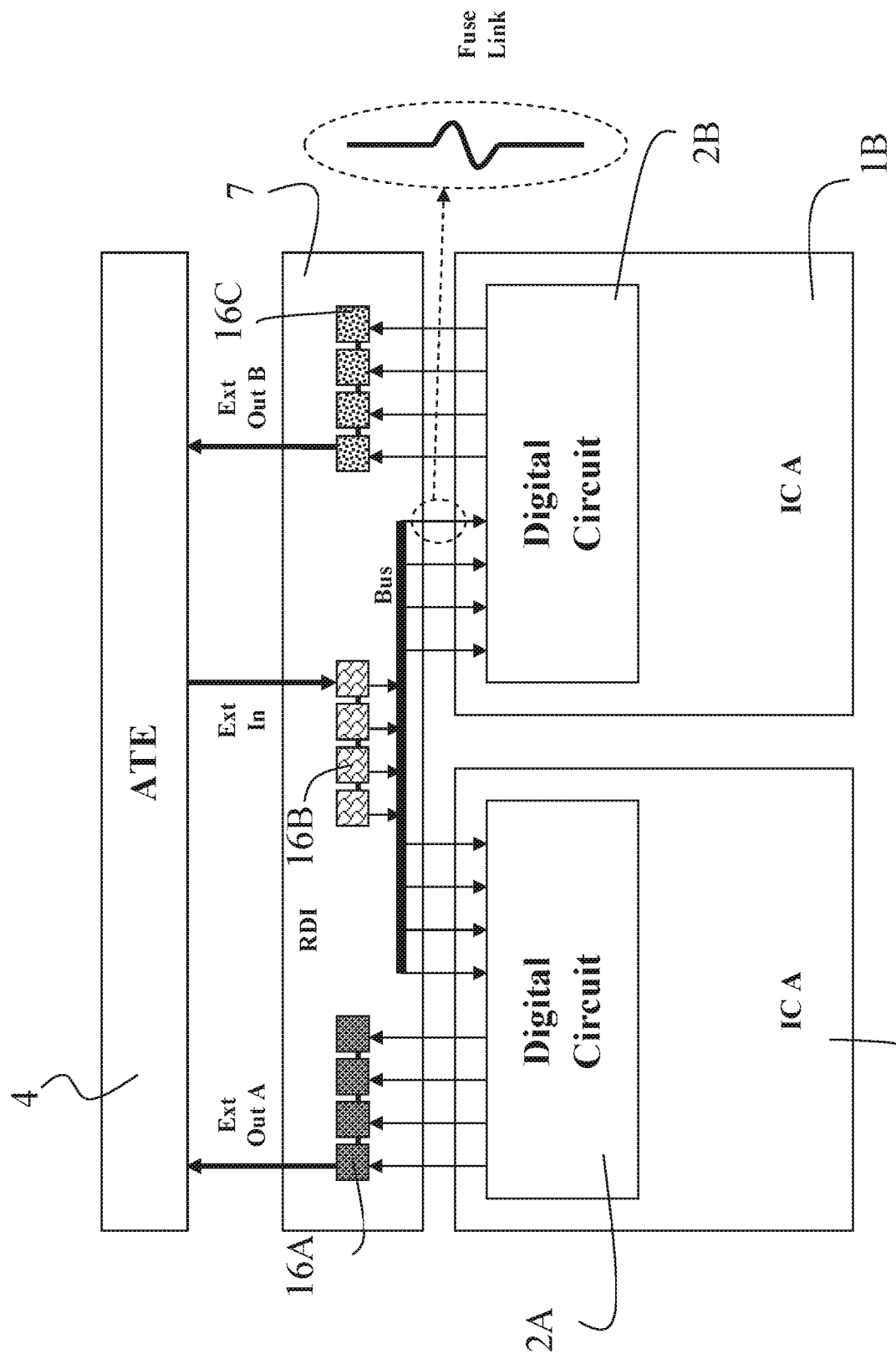

Advantageously, the use of the resources of the interface RDI can be optimized, for example by using the same shift register in a shared way for sending the scan vectors to both the devices DUT to be tested. For example, in FIG. 31 the shift register 16B is shared by the DUT 1A and the DUT 1B, using such suitable protections and suitable connections or fuse link as to avoid that short circuits in the DUT 1A and/or 1B jeopardize the operation of the same interface RDI 7.

Figure 32:
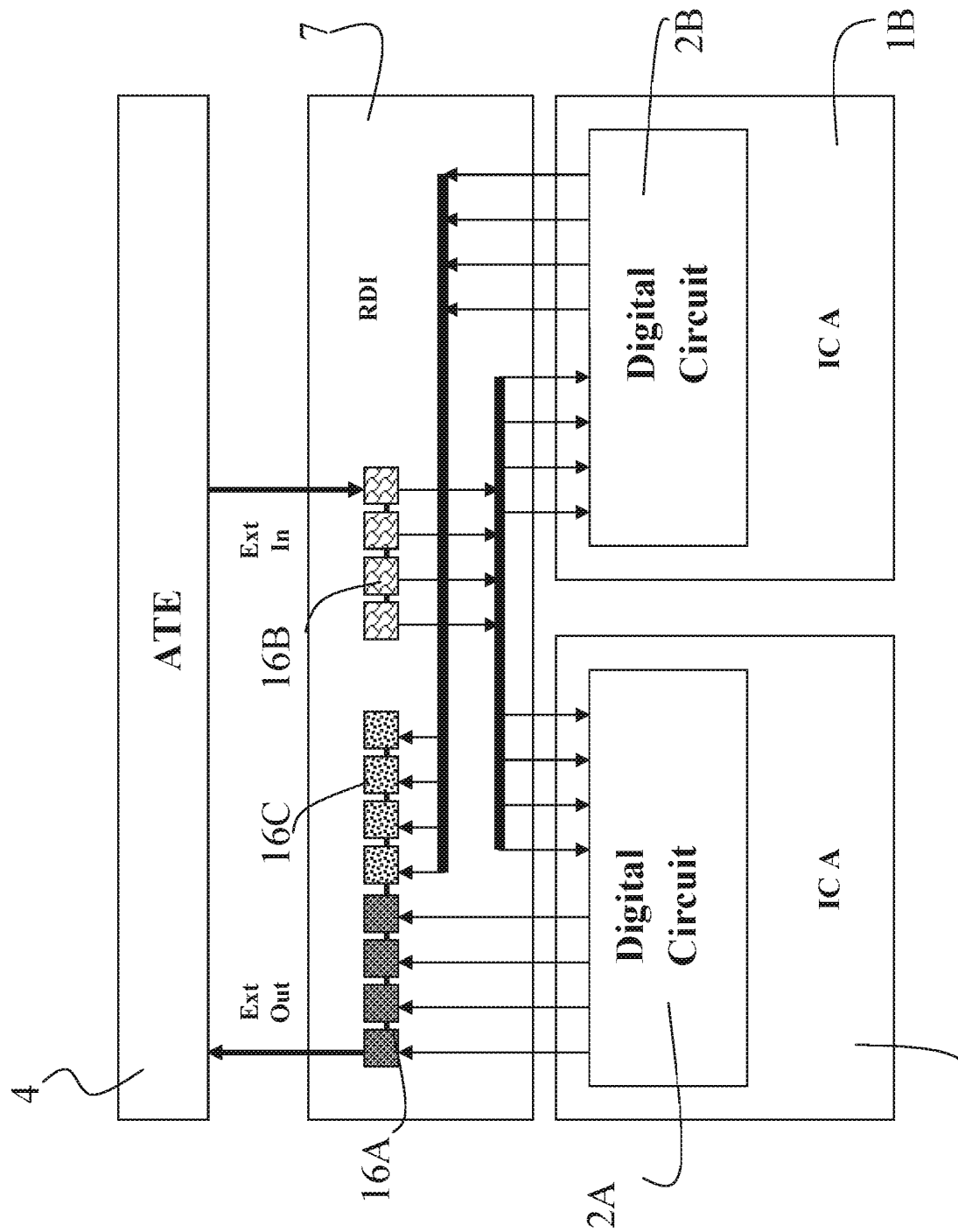

Advantageously, in a similar way, if the two devices DUT 1A and DUT 1B are identical, the number of channels being used by the interface RDI 7 for sending the signatures to the ATE 4 can be reduced. In the case shown in FIG. 32, the number of output terminals OutExt of the interface RDI 7 towards the ATE 4 is reduced from two to one and is common to the shift registers 16A and 16C that are connected to each other to form a single shift register.

Figure 33:
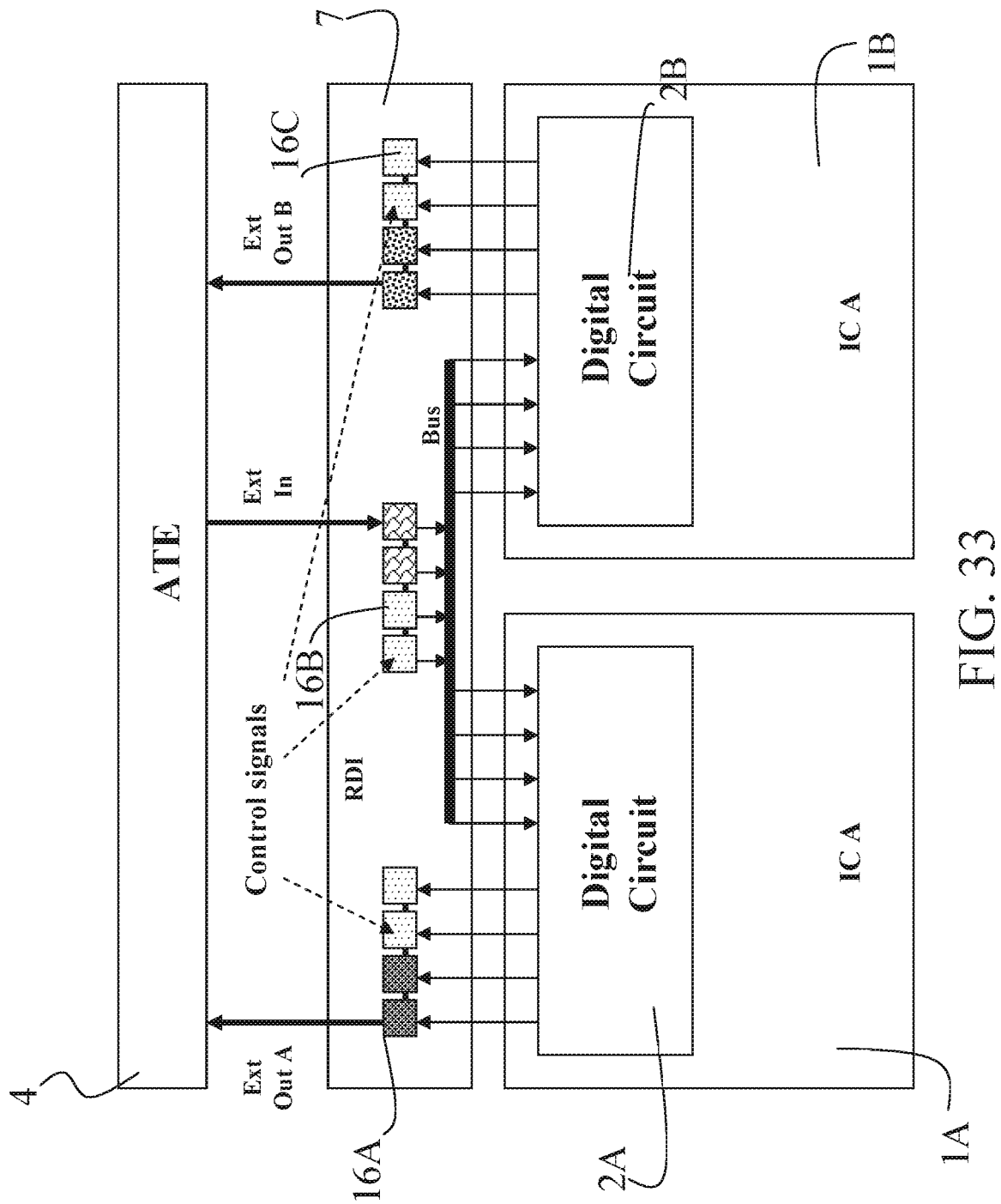

Advantageously, as shown in FIG. 33 the interface RDI 7 can comprise shift registers 16A, 16B and 16C comprising flip flops that transmit control signals useful to ensure the correct operation of the various parts of the system.

According to a further aspect of one embodiment, the interface RDI can be positioned in part inside and in part outside at least one device DUT. In other words, a portion of the interface can be considered incorporated in the device to be tested, while another portion is part of the system external to the device.

Figure 34:
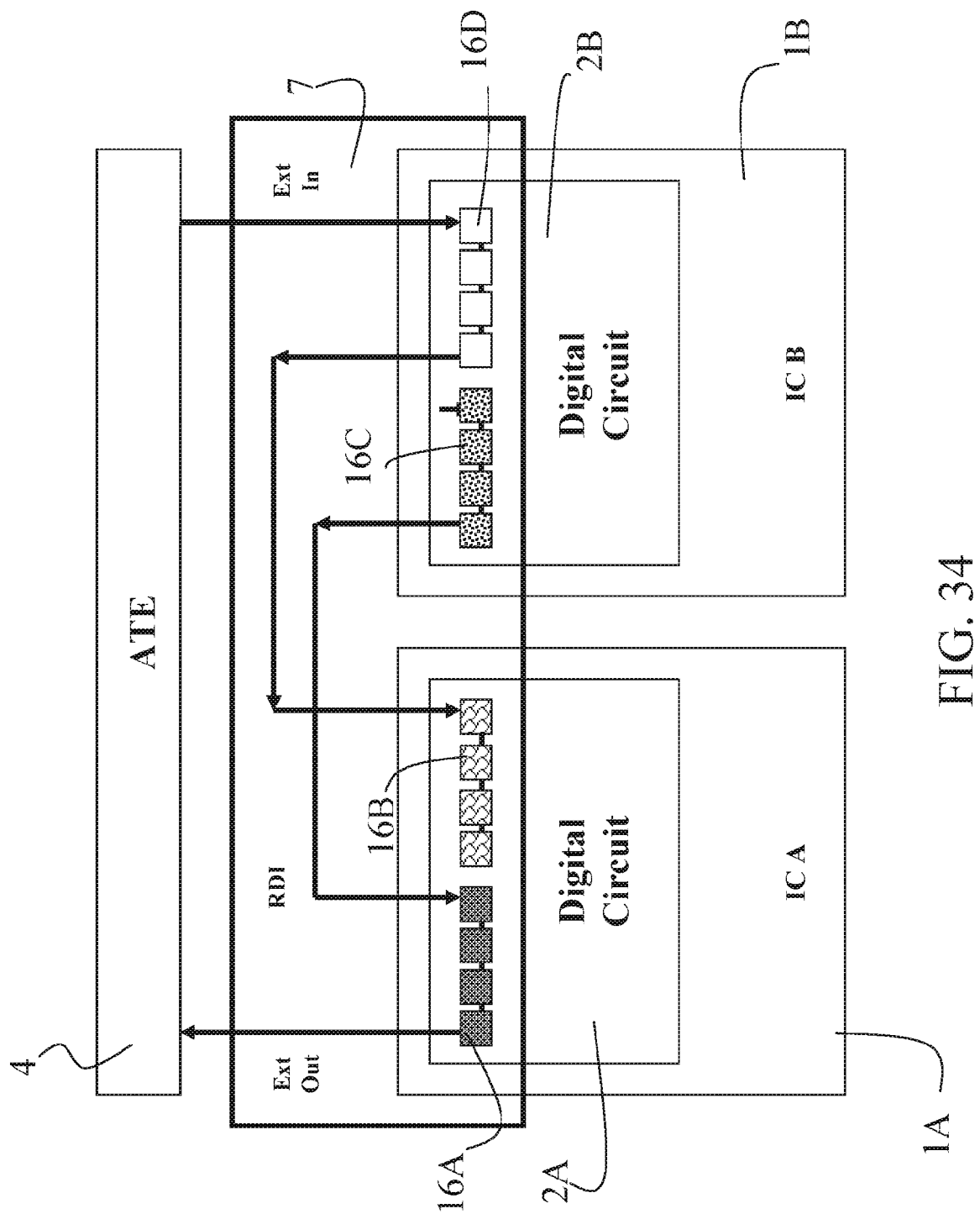
FIGS. 34 and 35A show a first and a second schematic representation from above of a digital ATE connected to a first device DUT 1A and to a second device DUT 1B, each comprising a digital block, through an interface RDI in part external and in part internal external to the devices DUT, according to one embodiment.

FIG. 34 shows, for example, an interface RDI 7 comprising the shift registers 16A and 16B comprised in a first DUT 1A and the shift registers 16C and 16D comprised in a second DUT 1B, with the shift register 16A connected to the shift register 16C and the shift register 16B connected to the shift register 16D. The interface RDI 7 has, thus, a single input terminal ExtIn and a single output terminal ExtOut.

Figure 35A:
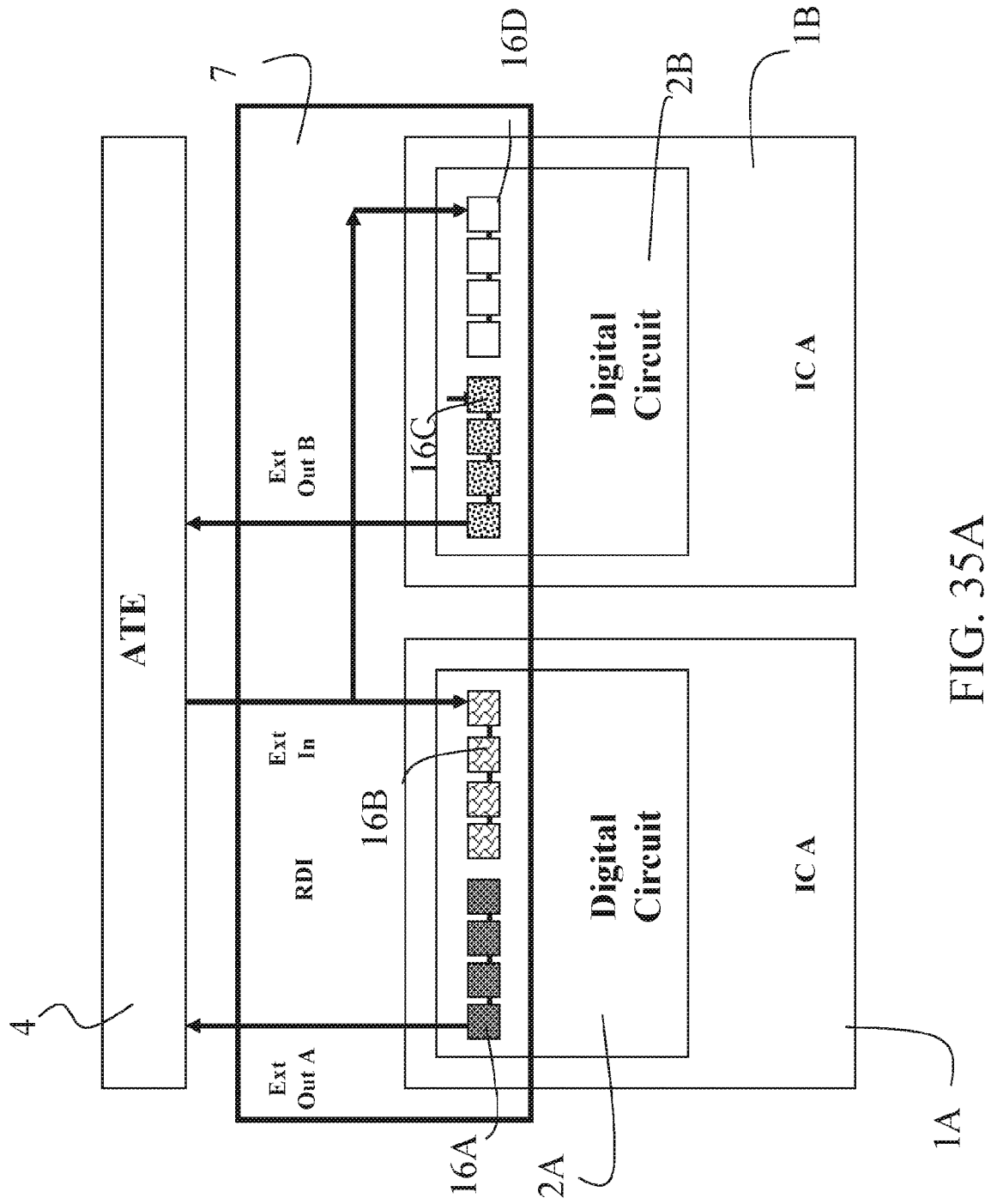

In a further aspect of one embodiment, as shown in FIG. 35A, the interface RDI 7 comprises shift registers 16A and 16B comprised in the digital block 2A of a first DUT 1A and shift registers 16C and 16D comprised in the digital block 2B of a second DUT 1B, with the single shift register 16B connected to the shift register 16D. In this case, the interface RDI 7 has a single input terminal ExtIn and two distinct output terminals ExtOutA and ExtOutB.

Advantageously, some of the internal circuits of the generic DUT can be used for creating the test circuits necessary for the testing of at least part of the same DUT, reducing the area necessary for incorporating these test circuits in the same DUT, reducing the costs.

Figures 35B, 35C:
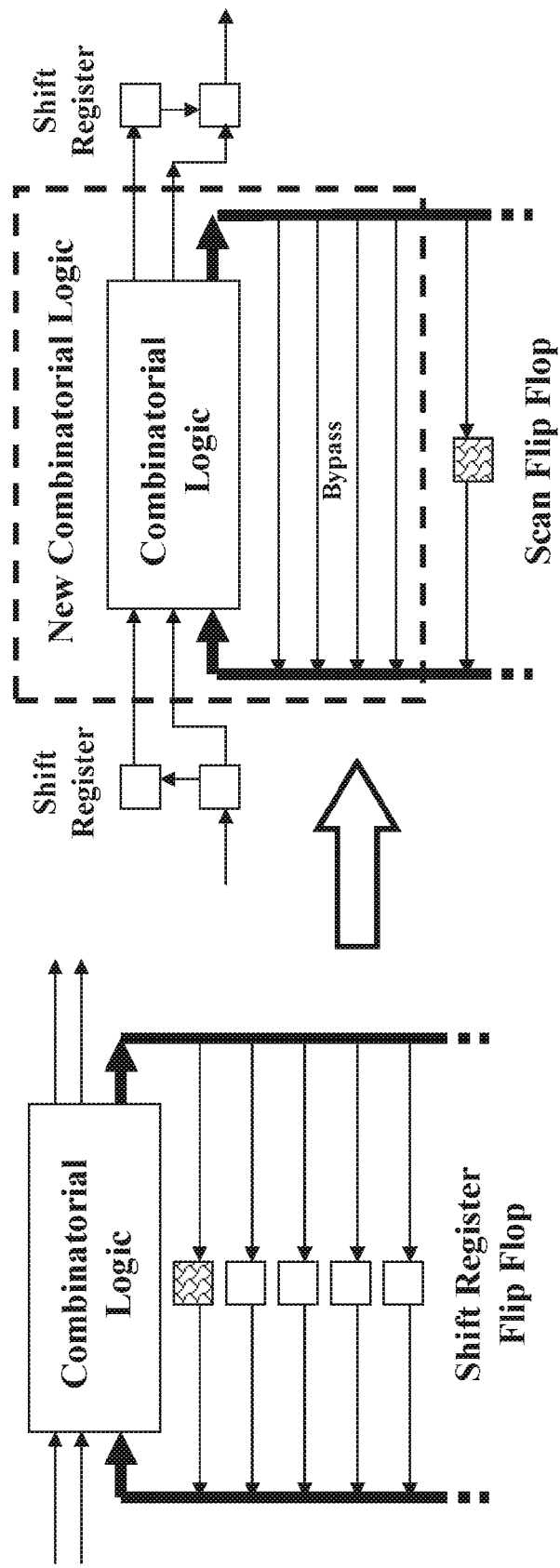
FIGS. 35B and 35C are schematic block views of examples of generic digital networks with flip flops already present in a device to be subjected to test or to be used to form a test circuitry according to the needs or testing modes.
Figure 35D:
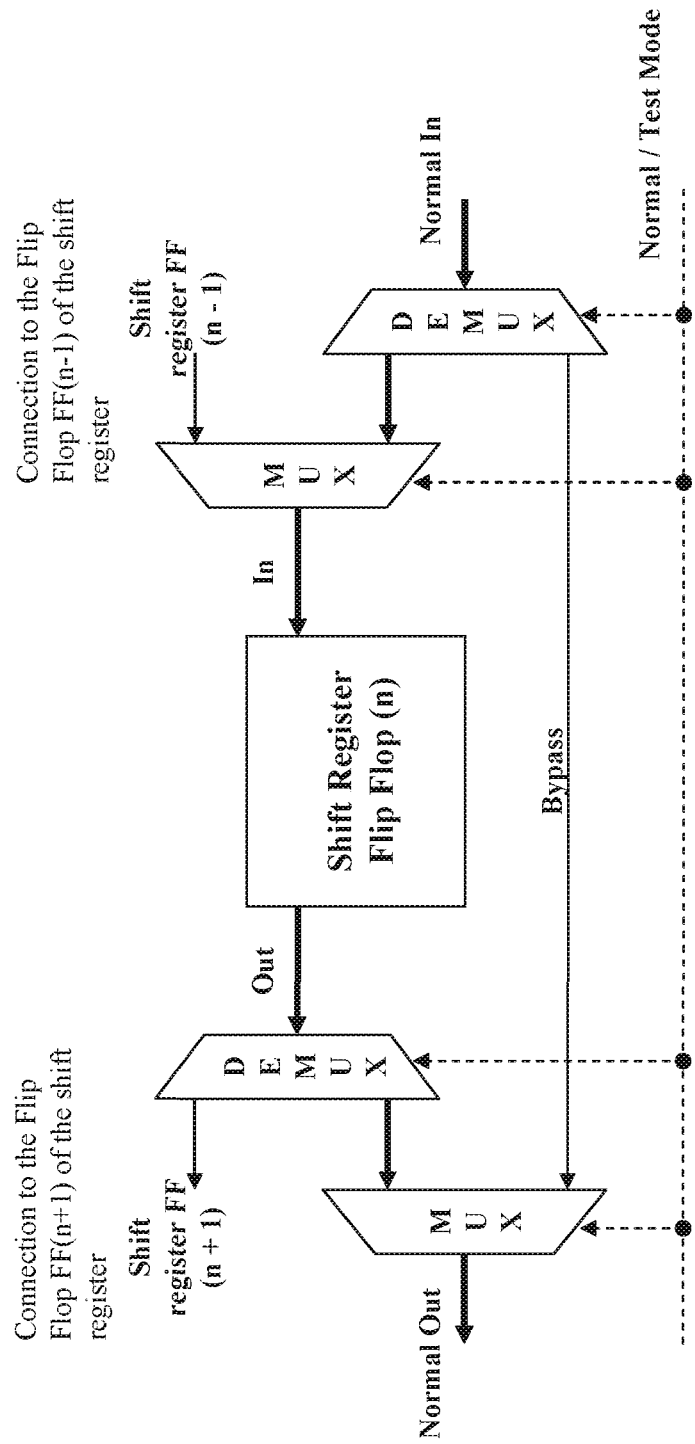
FIG. 35D shows the details of a flip flop already present in a device and that can be used to form a test circuitry and in particular it is part of a shift register.

If we consider a generic digital logic circuit, as the one schematically represented in FIG. 35B, comprising a combinatorial logic circuit and flip flops, some of these flip flops instead of being modified and becoming Scan Flip Flops, can be modified for realizing Test Flip Flops and used for creating circuits for the test of at least part of the DUT. In particular in our case some of the Test Flip Flops are used for realizing Shift Register Flip Flops. In this case for the testing of the digital logic circuits through scanning, the Shift Register Flip Flops will be extracted and replaced with bypass connections. An example of this structure is shown in FIG. 35C that shows a combinatorial logic circuit, modified with respect to the circuit in FIG. 35B by the bypass connections, for which a traditional ATPG will have to find the test vectors, which will then have to be transformed into the test vectors mixed for being compatible with the at least one shift register placed at the input of the combinatorial logic circuit. Similarly, the signatures can be processed. An example of Shift Register Flip Flop is shown in FIG. 35D wherein in the Test Mode the signal Normal In is connected through the Bypass to the signal Normal Out, while in Normal mode the signals Normal In and Normal Out are connected to the N-th Flip Flop. Thus in Test Mode the N-th Flip Flop will have the possibility to be part of a shift register. In a similar way this flip flop will have the possibility to be part also of other circuits, for example of circuits for the test like a LFSR (Linear Feedback Shift Register), or a register BILBO (Built-In Logic Block Observer), or a MISR (Multi Input Signature Register), or a PRPG (Pseudo-Random Pattern Generator), or a circuit BIST (Built-In Self Test) or others. Thus some flip flops are used already present in the DUT for creating suitable test circuits of the remaining part of the same DUT. The multiplexers MUX and the demultiplexers DEMUX will have the possibility to be realized with suitable electronic circuits, that do not limit the idea.

Advantageously the flip flops being used as Test Flip Flops will be chosen among those flip flops of the DUT for which no high speed performances are requested.

Advantageously the Test Flip Flops can be used also as Scan Flip Flops thanks to the presence of the multiplexer MUX at the input of the flip flop, but not vice versa.

In fact they can be part of the interface RDI that is be subjected to electric testing creating at least one scan chain.

Furthermore, hybrid methodologies can be applied with respect to the ones discussed, for example some Test Flip Flops can be aggregated to form shift registers for charging the scan vectors and discharging the signatures in the scan chains formed with the Scan Flip Flops and then the Test Flip Flops can be charged with at least part of a scan vector and aggregated with each other as Scan Flip Flops to form at least part of a scan chain for making the testing of the combinatorial circuits and then after this testing the Test Flip Flops will be aggregated again to form shift registers discharging a first part of the signatures contained therein and then discharging the signatures contained in the other scan chains and charging them simultaneously with other scan vectors.

Figure 36:
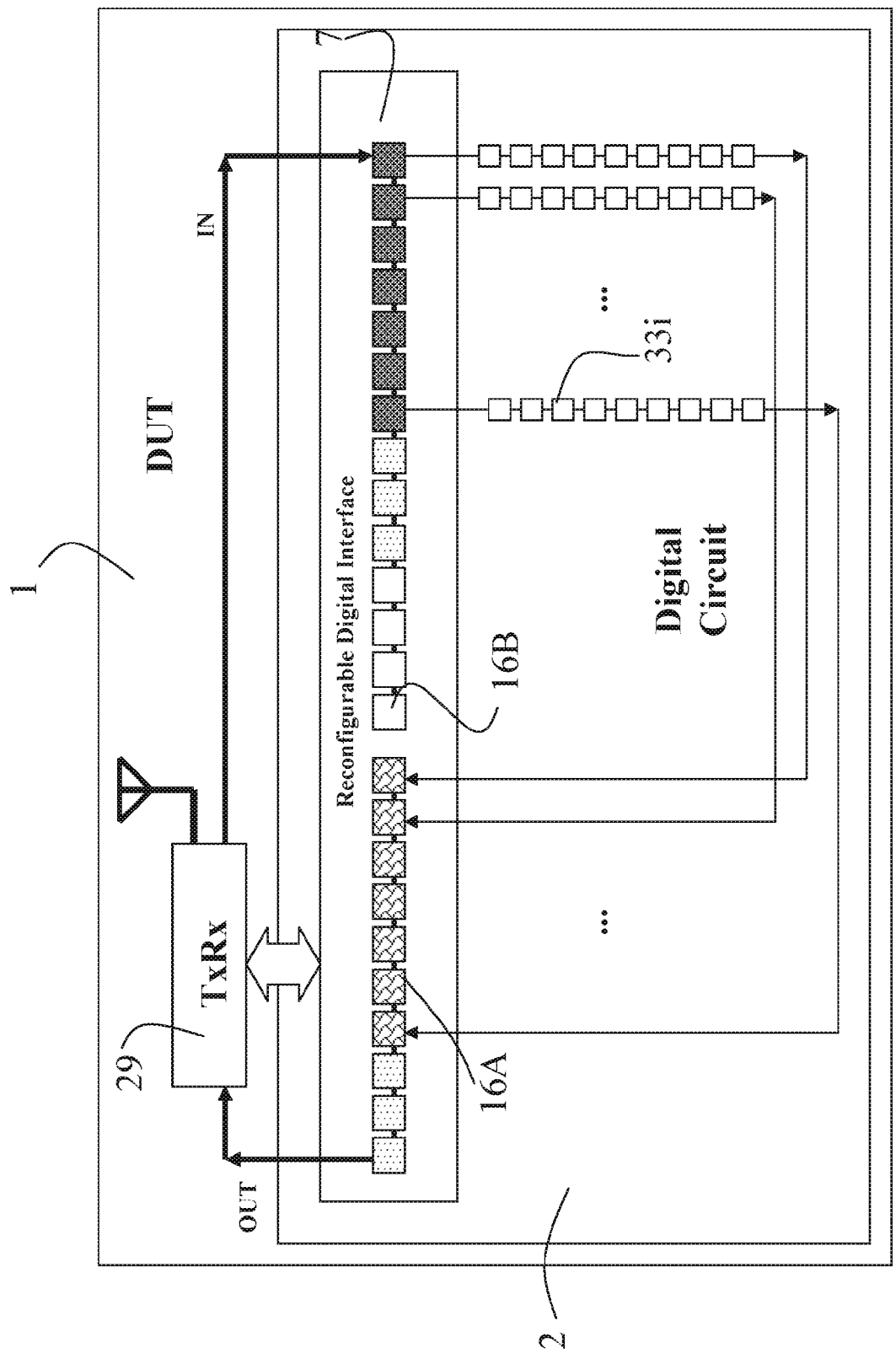
FIG. 36 shows a schematic representation from above of a device DUT 1 comprising a digital block comprising an interface RDI connected to a transceiver/transponder circuit, equipped with an antenna, also incorporated in the DUT 1, according to one embodiment.

According to a further aspect of one embodiment, the interface RDI can be connected to at least one receiving circuit and/or at least one transmitting circuit realized through at least one transceiver and/or at least one transponder connected to at least one antenna through one or more line buses for exchanging messages. By way of example, FIG. 36 shows a DUT, again indicated with 1, comprising an interface RDI 7 comprising a first and a second shift register 16A, 16B and a transceiver/transponder circuit 29 connected to the interface RDI 7 so as to send to this the scan vectors through an input line IN and to receive the signatures from this through an output line OUT. Moreover, as shown more in detail in FIG. 37A, the circuit 29 can exchange with the interface RDI 7 also control signals through at least one flip flop of the first and of the second shift register 16A, 16B. Moreover, the interface RDI 7 can have its own clock signal CKc, generated in its interior or made by the carrying wave of the electromagnetic signal thanks to a suitable circuit. For example a Schmitt trigger circuit can make, from the carrying wave of the electromagnetic signal, a digital signal of a given frequency, as schematized in FIG. 37C, that can be reduced through a suitable divider circuit or counter. Moreover, for making a testing of the system, it can be necessary to modulate the shape of the clock signal CK for generating a clock signal CKdut useful for making the testing of the generic device DUT. The specific shape of the clock signal CKdut can be transmitted by the ATE to the interface RDI 7 and FIG. 37B shows some examples. Advantageously by modifying the shape of the clock signal CKdut there will also be the possibility to increase or decrease its frequency. For example, FIG. 37C schematizes a circuit comprising a counter 30 and a circular shift register 16H, that can be incorporated in the interface RDI 7, suitable for generating the clock of the DUT CKdut.

Advantageously the clock signal can be transmitted from the ATE to the DUT, or it can be generated inside the DUT.

Advantageously, a PLL circuit internal to the chip can be used for synchronizing the DUT and the ATE.

Figure 38:
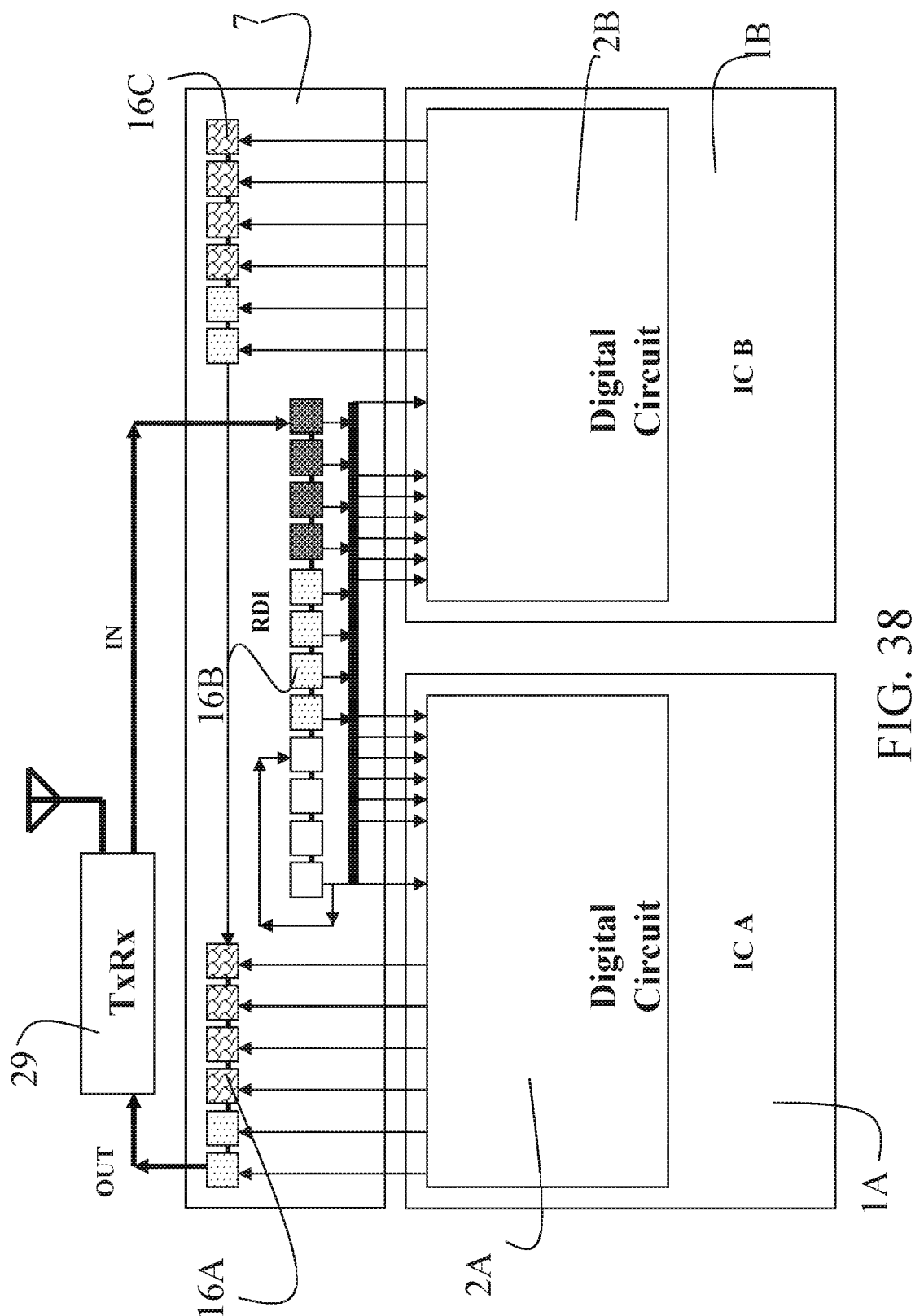
FIG. 38 shows a schematic representation from above of a first device DUT 1A and of a second device DUT 1B, each comprising a digital block, connected to an external interface RDI connected to a transceiver/transponder circuit, equipped with an antenna and external to said DUT, according to one embodiment.

According to another aspect of one embodiment, an interface RDI 7, comprising three shift registers 16A, 16B and 16C, and the transceiver/transponder circuit 29 can be external to the generic device DUT, or to a first device DUT 1A and to a second device DUT 1B and connected to them through the output terminals of the interface RDI 7, as shown, by way of example, in FIG. 38.

Figure 39:
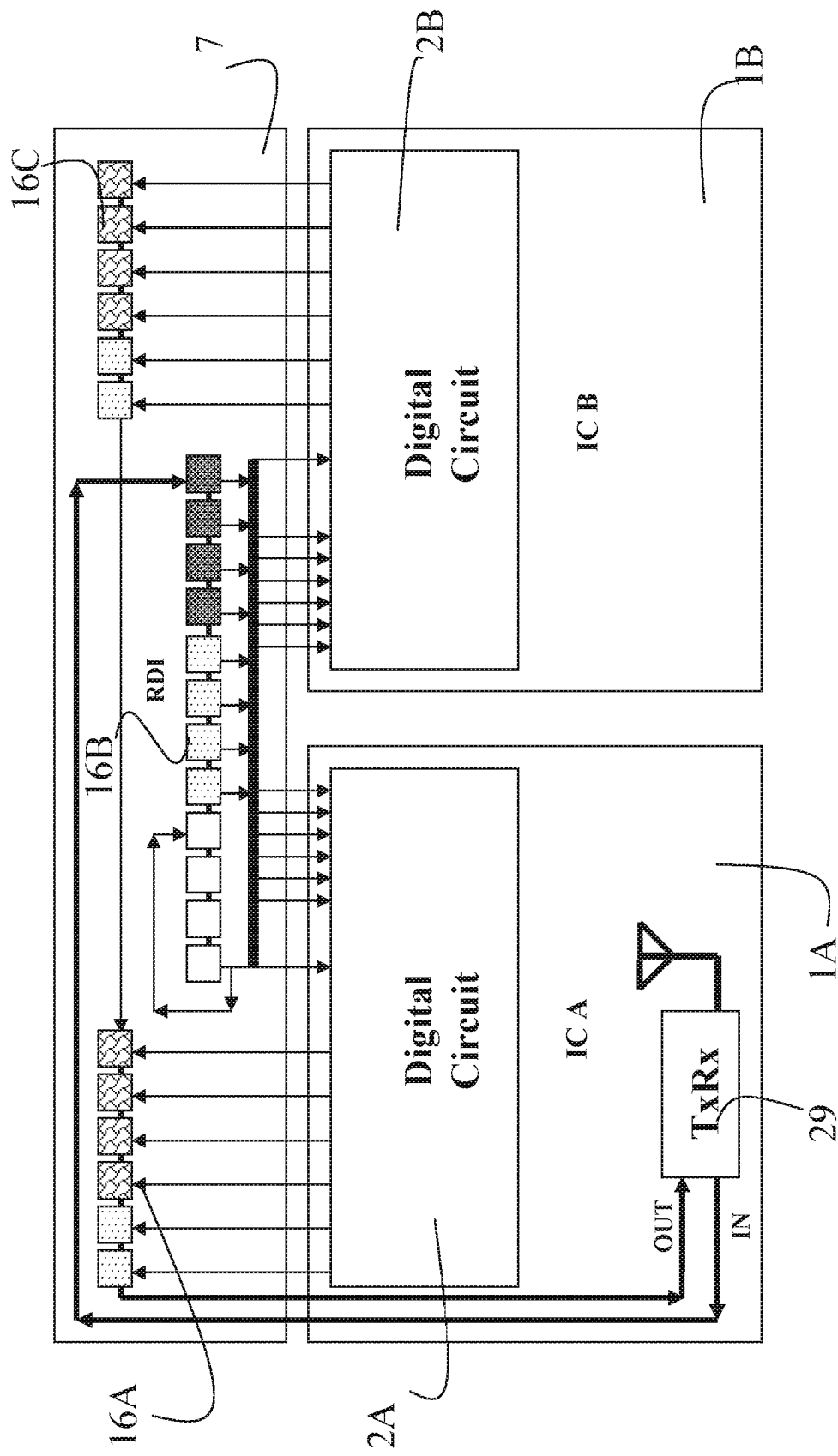
FIG. 39 shows a schematic representation from above of a first and of a second device DUT 1A and DUT 1B, each comprising a digital block, connected to an external interface RDI connected also to a transceiver/transponder circuit equipped with an antenna and internal to the first device DUT 1A, according to one embodiment.

Advantageously, according to a further aspect of one embodiment, the transceiver/transponder circuit 29 can be internal to a device DUT, for example to the first device DUT 1A, as shown in FIG. 39.

Advantageously, a generic shift register of the interface RDI can contain at least one part of at least one scan vector; or at least one part of at least one signature; or at least one part of a control signal; or at least one part of the shape of the clock CKdut; or at least one part of a message sent by the tester ATE to the interface RDI; or at least one part of a message sent by the interface RDI to the tester ATE; or at least one part of a message sent by the interface RDI to at least one DUT; or at least one part of a message sent by at least one DUT to the interface RDI; or at least one part of the configuration of the RDI; or at least one part of a datum; or other information.

Advantageously, the process according to one embodiment is also applied to devices DUT to be tested on wafer.

Figure 40:
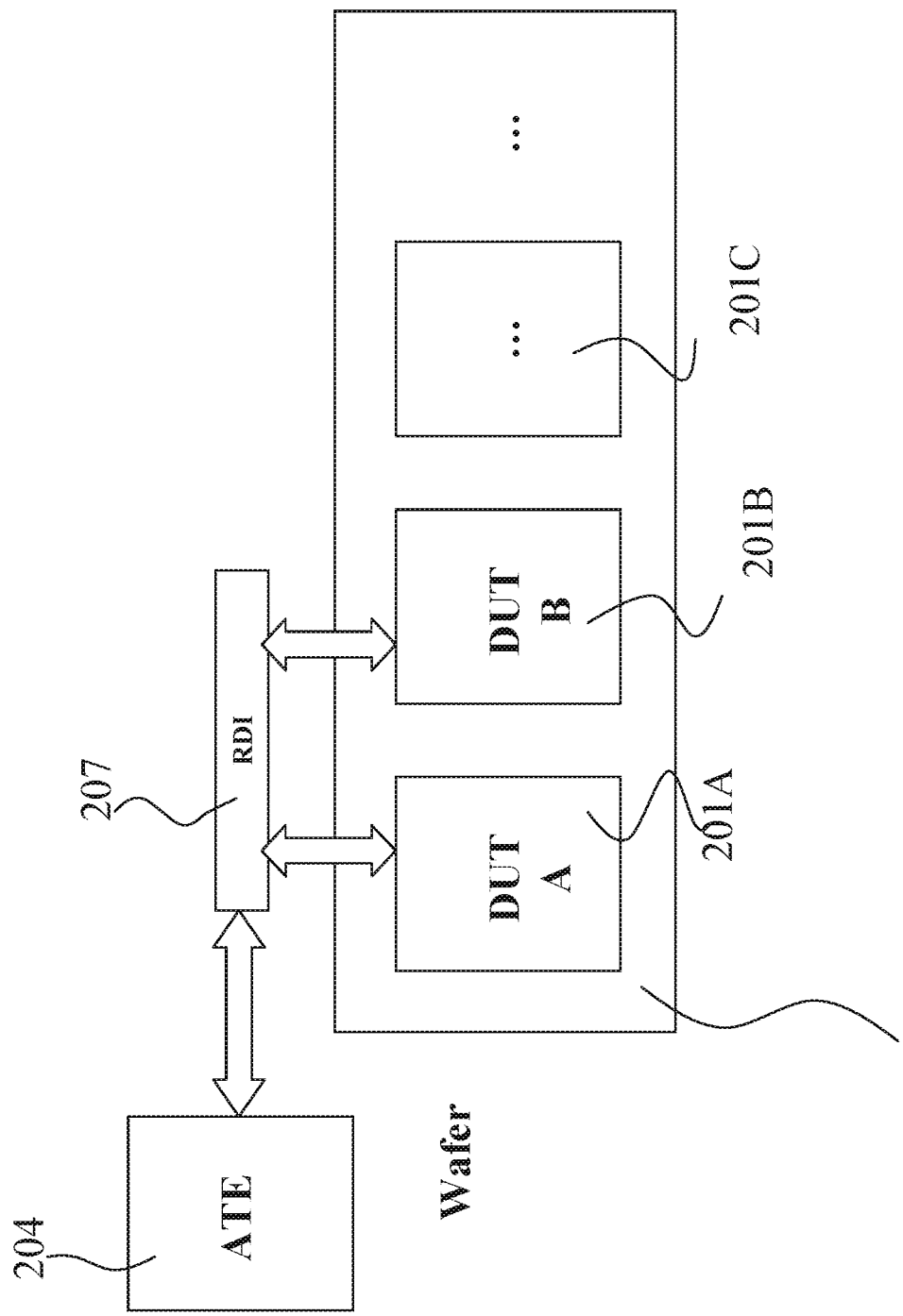
FIG. 40 shows a schematic representation from above of a digital ATE connected to a plurality of devices DUT on wafer through an interface RDI external to the wafer, according to one embodiment.
Figure 41:
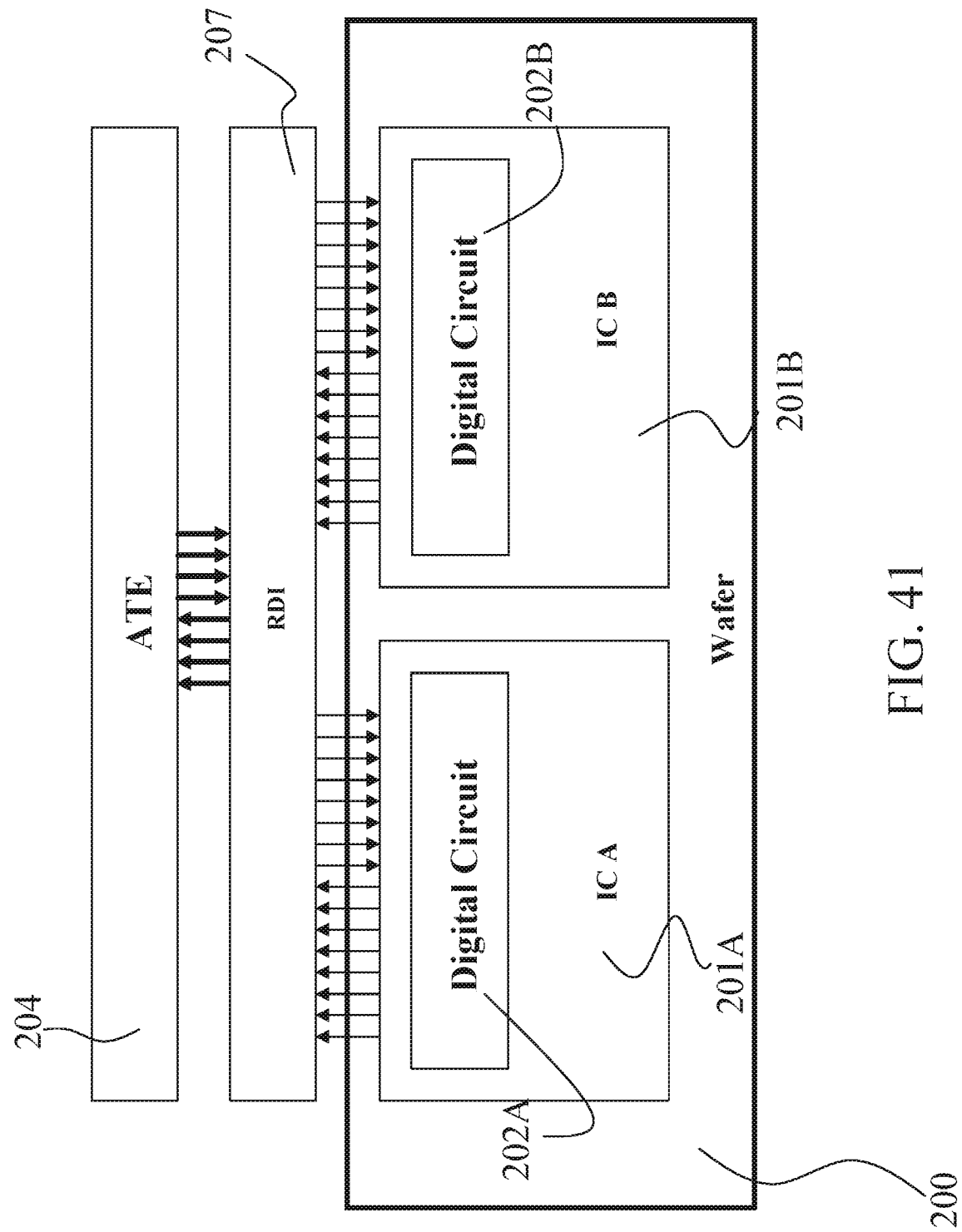
FIG. 41 shows a schematic representation from above of a digital ATE connected to a first and a second device DUT 1A and 1B on wafer each comprising a digital block through an interface RDI external to the wafer, according to one embodiment.

Advantageously, the interface RDI can be external to the wafer and can be used for the testing of a plurality of devices. By way of example, FIG. 40 shows an interface 207 external to a wafer 200 comprising a DUT 201A, a second DUT 201B, a third device DUT 201C, and connected to an ATE 204. In this way, the number of resources being used by the ATE 204 for the testing of the generic DUT is reduced and the testing parallelism is increased. FIG. 41 shows the same interface 207 connected to two devices DUT 201A and 201B comprising respectively a digital block 202A and 202B.

Figures 42A, 42B:
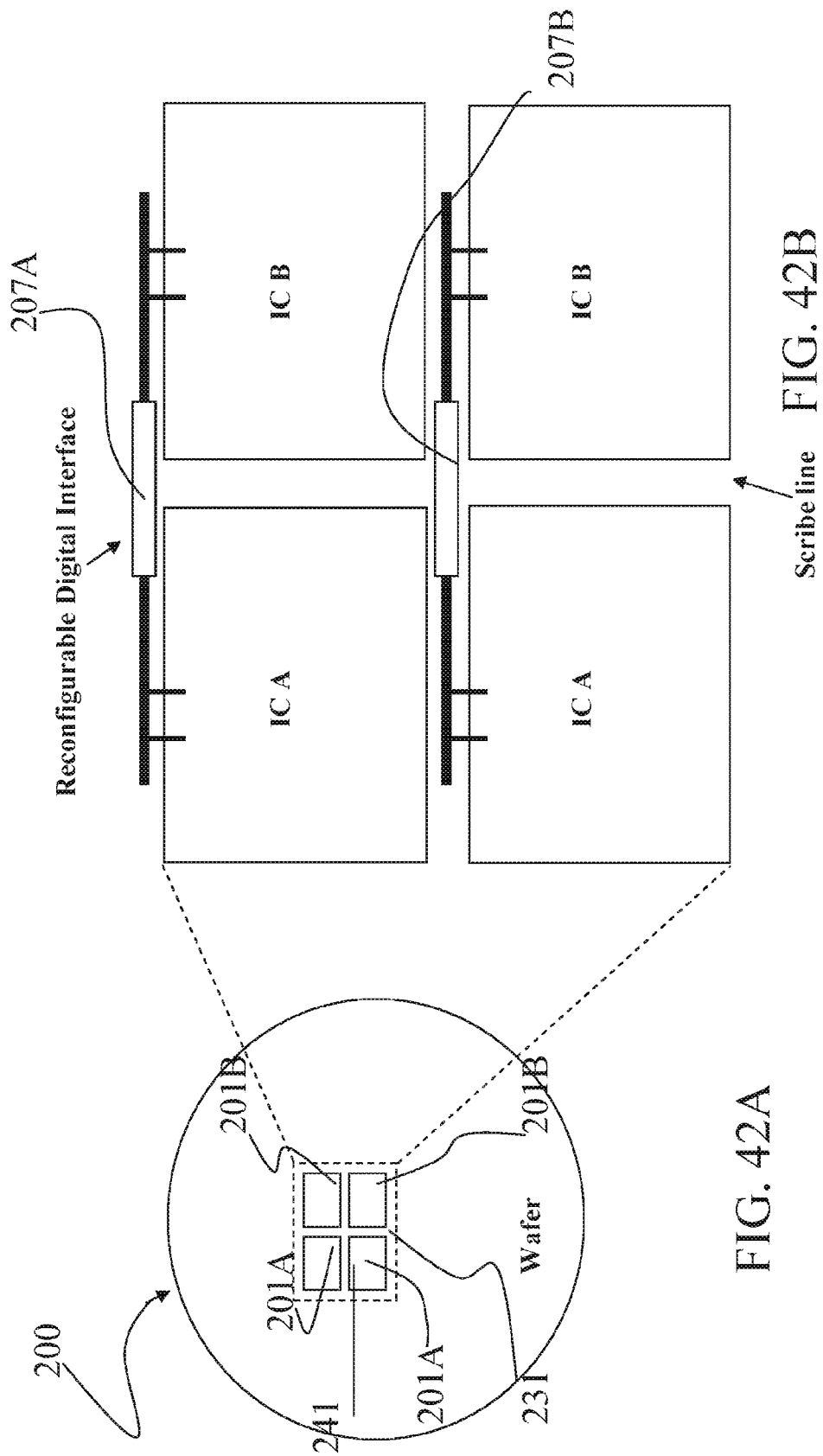

Advantageously, the interface RDI can be positioned in the areas of the wafer wherein no active circuitry is present, i.e., in the scribe lines of the wafer, and can be connected to at least two chips on the same row and/or on the same column. In particular, FIG. 42A shows a view from above of a wafer 200 comprising four devices and, in particular, a first and a second device DUT 201A and a first and a second device DUT 201B. The DUTs 201A are separated from each other, just as like the DUTs 201B from each other, by a scribe line 241.

The DUTs 201A are instead separated from the DUTs 201B by a scribe line 231.

FIG. 42B shows the enlargement of the four devices wherein, for example, a first digital interface RDI 207A external to the devices is positioned, on the edge of the wafer, above the first device DUT 201A and the first device 201B and connected to both and a second digital interface RDI 207B is positioned, inside the scribe line 241, above the second device DUT 201A and the second device DUT 201B.

Advantageously, if the devices DUT 201A and the devices DUT 201B have different size, the first digital interface RDI 207A and the second digital interface RDI 207B are positioned in the wafer regions left free in correspondence with the devices DUT 201B, as shown, by way of example, in FIG. 43B. Moreover, in this case, the first and second interfaces RDI 207A and 207B are connected to each other, so that, in case of malfunction of one of the digital interfaces RDI, it is possible to reconfigure the other in such a way as to use the non faulty parts of the malfunctioning interface RDI and make the testing of at least one device DUT.

Figures 44A, 44B:
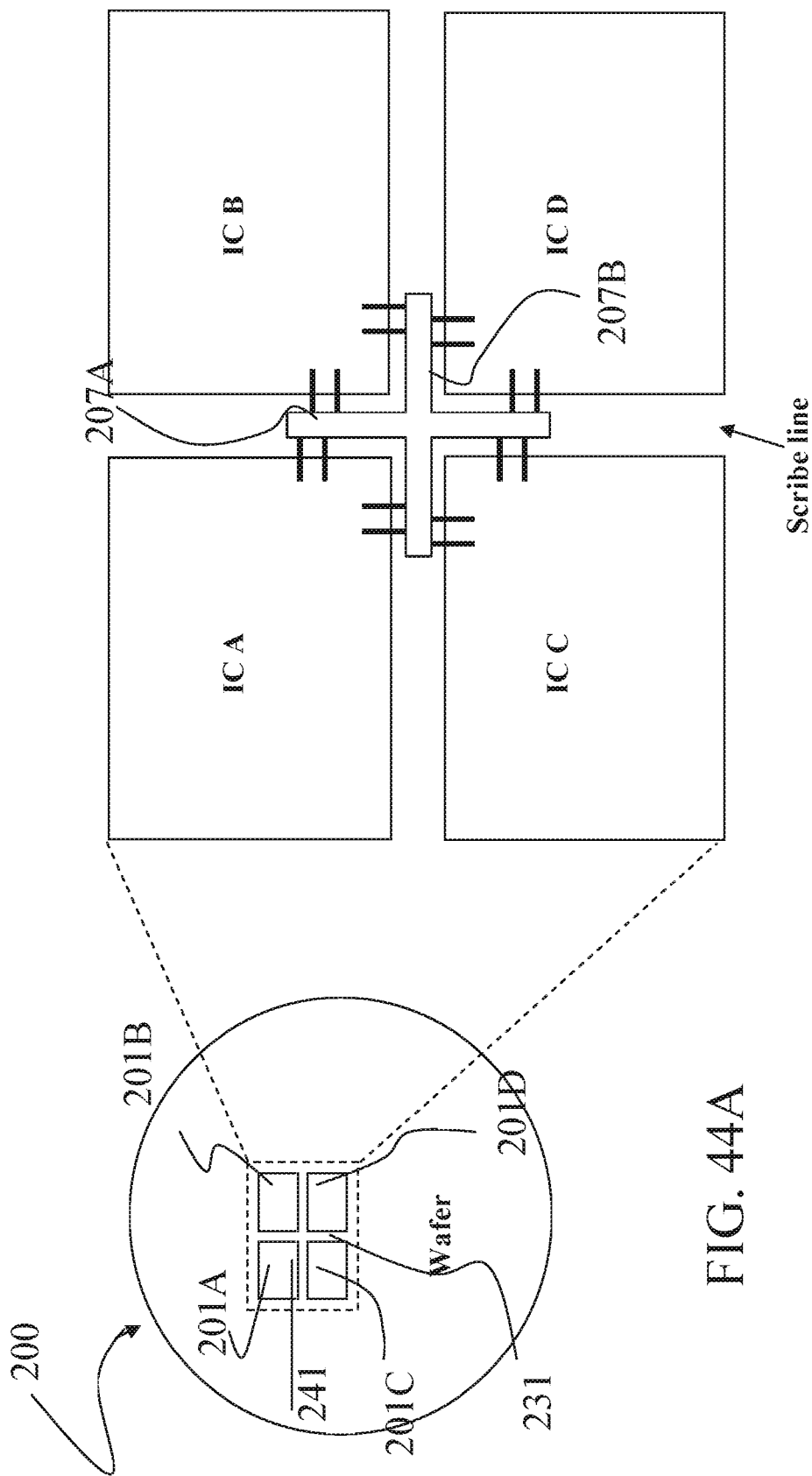

Advantageously, in case the wafer 200 comprises four different devices DUT 201A, 201B, 201C, 201D, as shown in FIG. 44, the first digital interface RDI 207A and the second digital interface RDI 206B are positioned respectively in the scribe line 231 and in the scribe line 241, interconnecting in correspondence with the crossing of the two scribe lines and each being connected to all the four devices DUT.

Figures 45A, 45B:
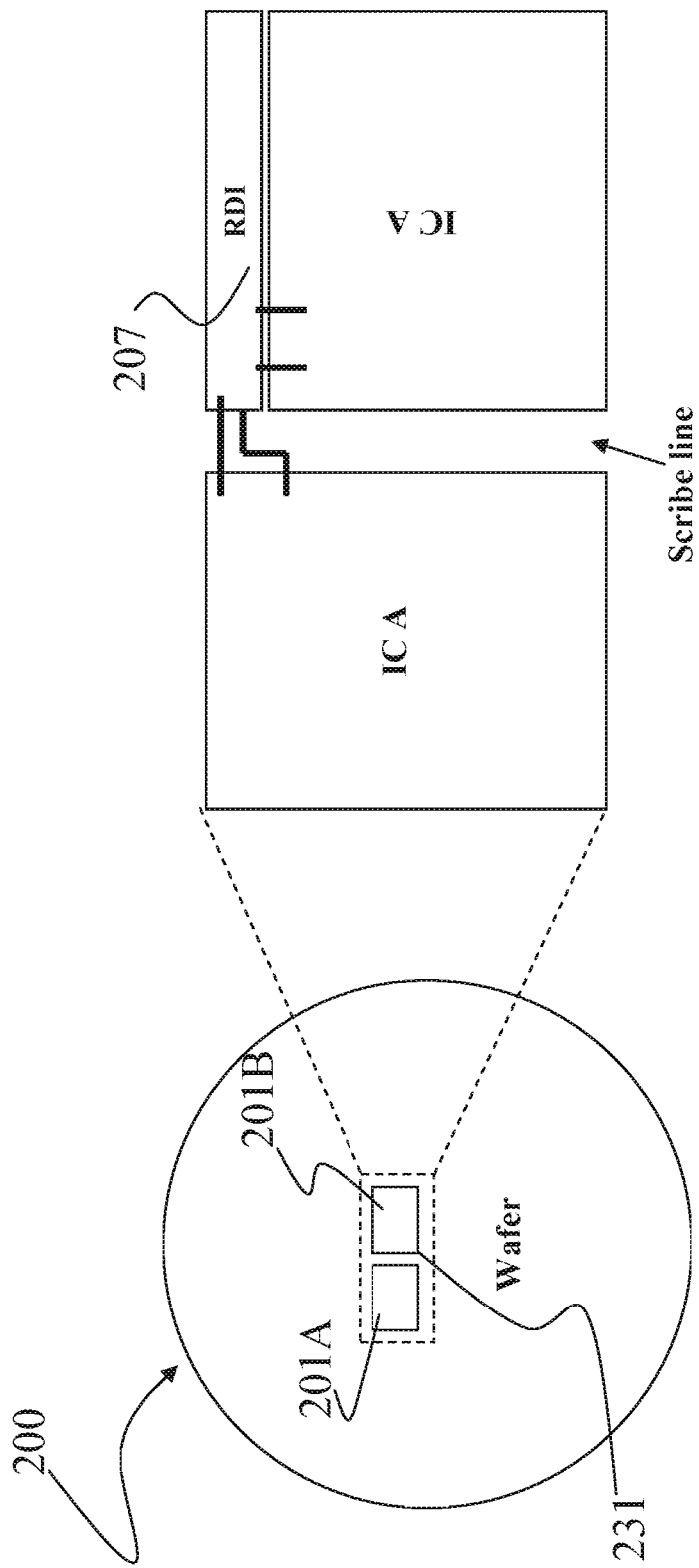

According to another aspect of one embodiment, by way of example, FIG. 45 shows a wafer 200 comprising a first device DUT 201A and a second device 201B, being equal but rotated by 90° with respect to the device DUT 201A. In this case, the interface RDI 207 can be external, positioned in the wafer region left free in correspondence with the device DUT 201B, and connected to both the devices DUT.

Figures 46A, 46B:
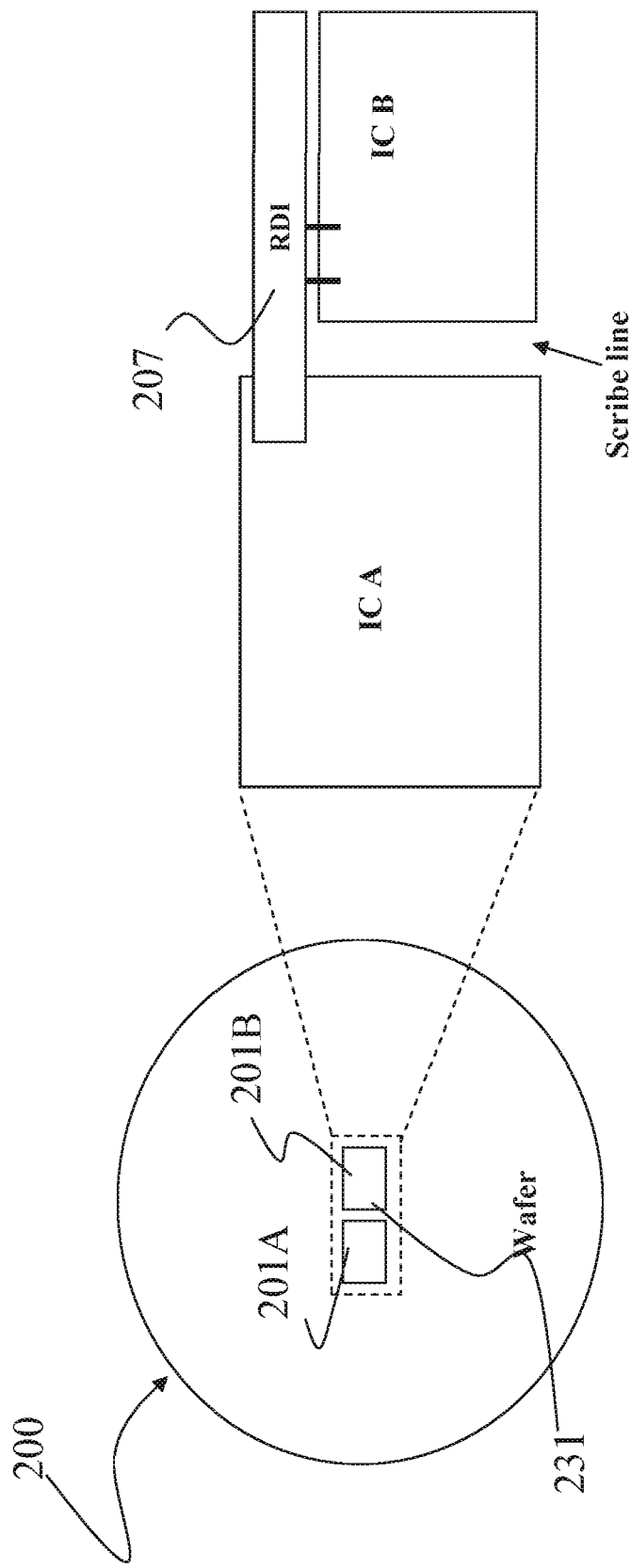

Advantageously, in case the wafer 200 comprises a first device DUT 201A and a second device 201B of smaller size with respect to the device DUT 201A, the interface RDI 207 can be totally internal to at least one of the devices DUT, or, alternatively, partially internal, for example, to the DUT 201A and external to the DUT 201B, as shown in FIG. 46B.

Advantageously the interface RDI can be used also in the final application for interfacing with each other at least two systems, for example two different chips.

Advantageously, the supervised testing methodology can be applied also to encapsulated systems or System in Package (SiP) or to electronic systems comprising different types of circuits, for which, generally, it is difficult to make a testing that values both the system as a whole and the interactions among the different parts of the system itself.

Figure 47A:
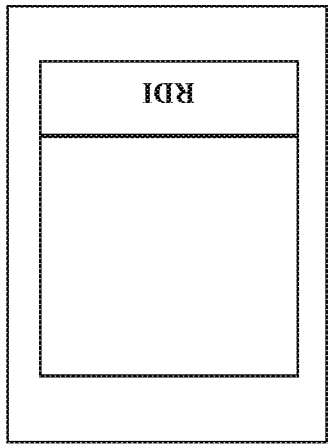
Figure 47B:
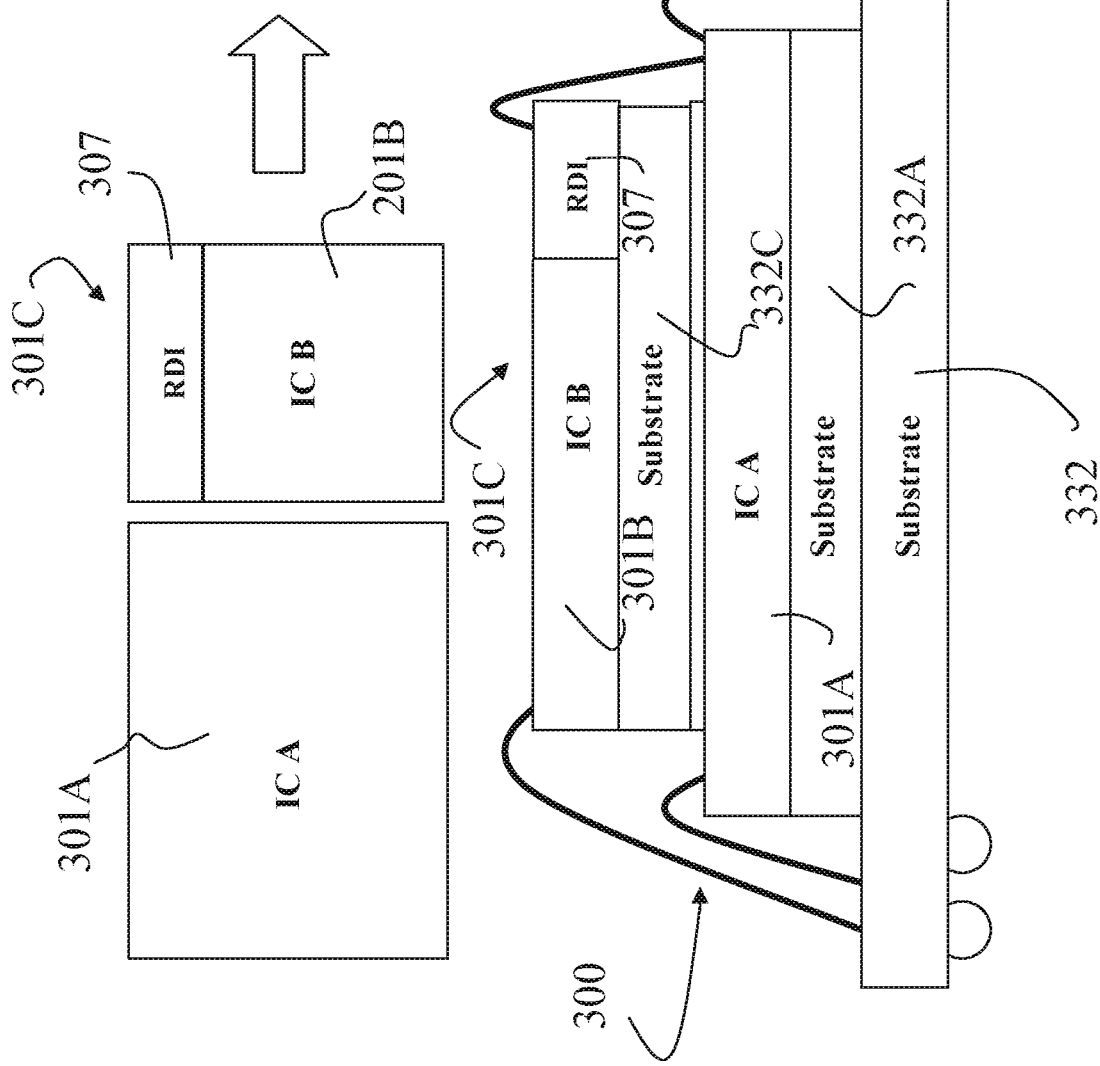

By way of example, FIG. 47B shows the section of a SiP 300 realized by assembling, on a substrate or frame 332, a first device DUT 301A positioned on a substrate 332A, that can be of semiconductor material, and a third device DUT 301C, comprising the second device DUT 301B and a digital interface RDI 307 positioned on a substrate 332C, that can be of semiconductor material.

Advantageously, according to a further aspect of one embodiment, it is possible to assemble, on a substrate 332, a device DUT 301C comprising a first device DUT 301A and an interface RDI 307, positioned on a substrate 332C, and a second device DUT 301B, positioned on a substrate 332B, as shown in FIG. 48B.

Advantageously, it is possible to assemble a first device DUT 301A, a DUT 301B and a digital interface RDI 307, obtaining a third complex device DUT 301C.

Figure 49B:
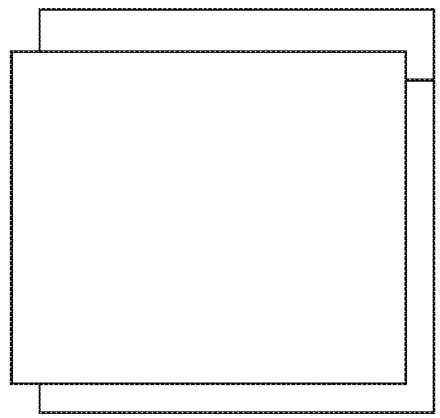
Figure 49A:
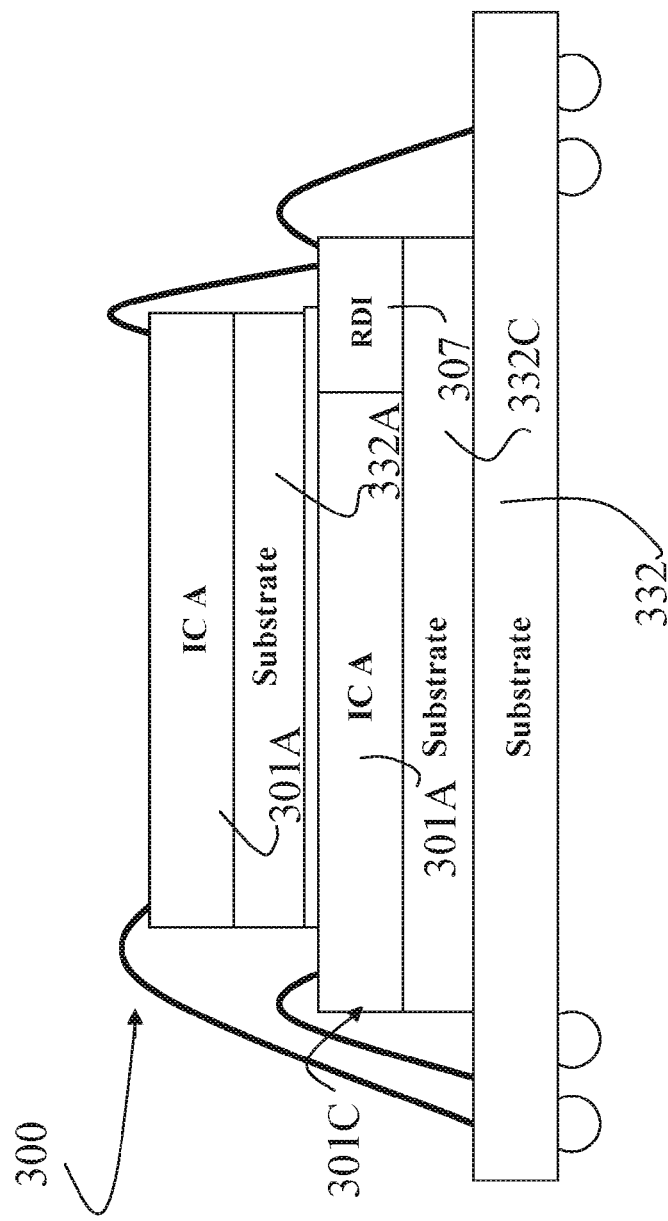

Advantageously, it is possible to assemble, on a substrate 332, a device DUT 301C comprising a first device DUT 301A and an interface RDI 307, positioned on a substrate 332C, and a second device DUT 301B, identical to the first device DUT 301A, as shown in FIG. 49A.

Advantageously, it is possible to assemble a first device DUT 301A and a second device DUT 301B, identical to the first device DUT 301A, and the interface RDI 307.

Advantageously, it is possible to assemble a device DUT 301C comprising a first device DUT 301A, a second device DUT 301B, identical to the first device DUT 301A, and the interface RDI 307.

Advantageously the interconnections internal to the SiP, shown in FIGS. 47-49, can be realized through wire bonding, or, alternatively, through bumps, or, alternatively, by means of Through Silicon Vias (TSV), or, alternatively, through Magnetic TSV.

Figure 50B:
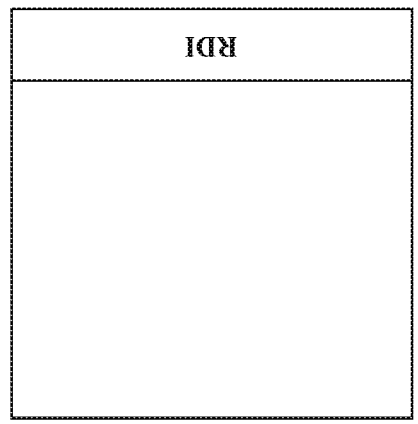
Figure 50A:
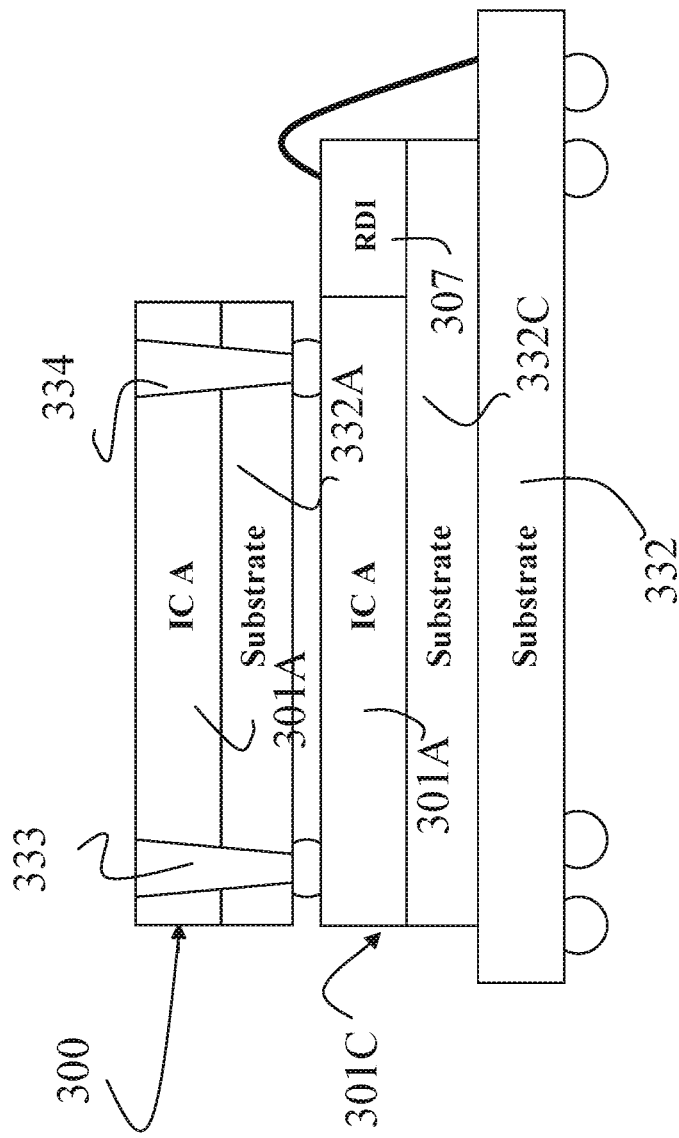

By way of example, FIG. 50 shows the SiP 300, in which the connection between the device DUT 301C and the device DUT 301A is realized through a first and a second Through Silicon Vias (TSV) 333 and 334, the interface RDI 307 remaining connected to the substrate 332 through wire bonding.

Figure 51:
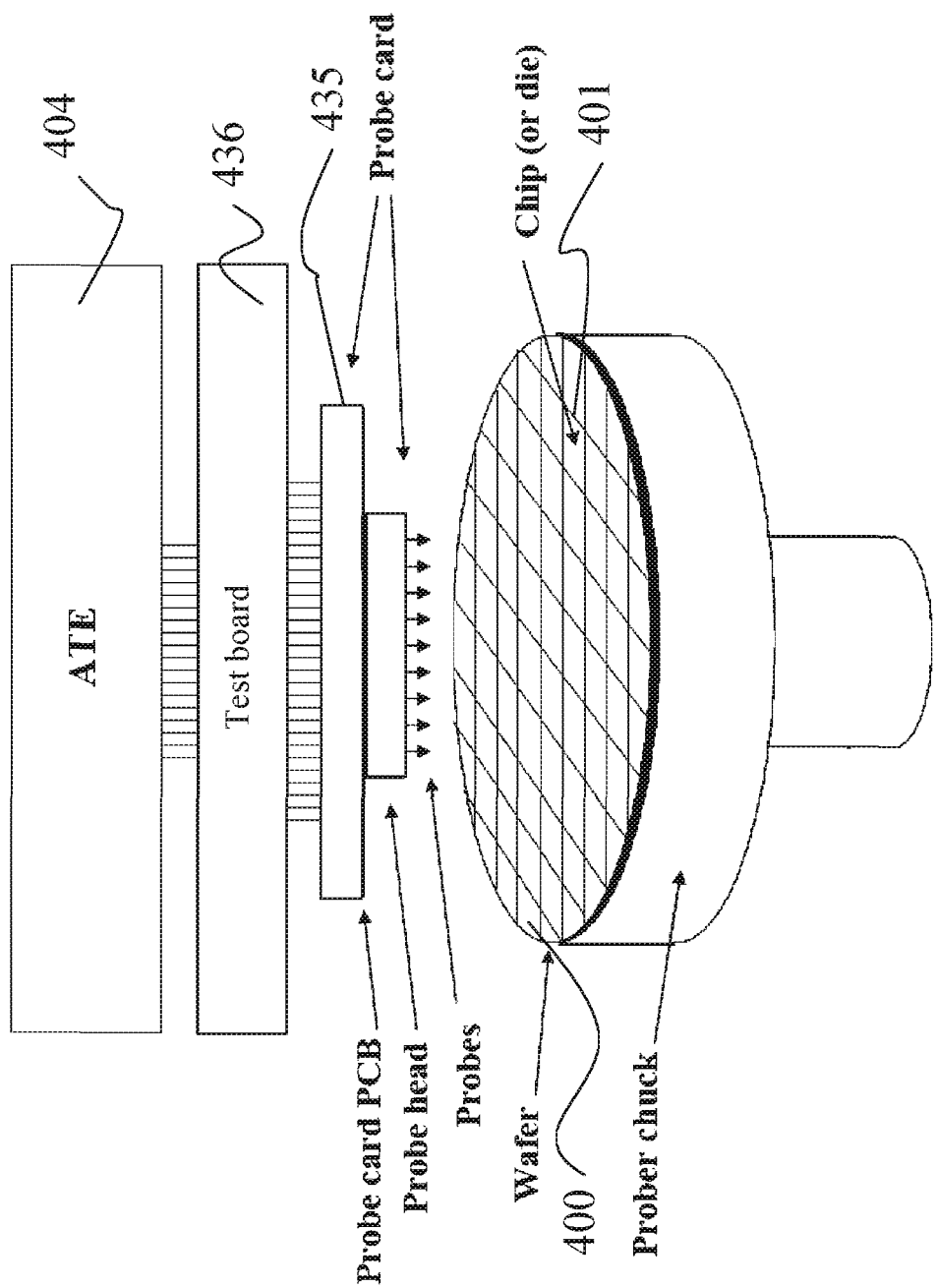
FIG. 51 shows a schematic view of a wafer comprising a DUT tested through a probe card connected to a Test Board being interfaced with a digital ATE and comprising a digital interface RDI, according to one embodiment.

According to another aspect of one embodiment, the interface RDI can be realized in part on the probe card and/or in part on the test board. By way of example, FIG. 51 shows a wafer 400 comprising at least one chip 401, whereon a probe card 435 is applied connected to a Test Board 436. This comprises the digital interface RDI 407 and it is in turn interfaced with an ATE 404.

Advantageously, a test board comprising an interface RDI can be used for testing various devices, with a subsequent economic advantage.

In conclusion, the process according to one embodiment allows, then, to make easily the testing (EWS or other) of a device DUT through a mainly digital communication channel between a digital ATE and the same DUT, using a reduced number of connection lines thanks to a digital interface of the RDI type. In this way the number of connections of the DUT necessarily to be connected to the resources of the ATE for the testing of the same DUT is reduced and, thus, the number of resources of the ATE to be used is reduced as well. In consequence, the cost of the testing is remarkably reduced, while the testing parallelism is increased.

An advantage of the supervised testing process that uses a programmable Test Controller, for example a system of the firmware type, consists in the flexibility of the testing strategy.

The fact of using a digital interface of the RDI type allows, moreover, to raise the testing parallelism, with consequent reduction of the test costs and times. Therefore, for the testing of DUTs on wafer the problems linked to the bonding step during the assembly are reduced, problems which are caused by the damaging of the pads caused by the probes that come in contact with the same pads for making the electric testing. By using the process above described, it is also possible to globally reduce the area occupied by the pads on the device.

In this way, a high standardization is thus obtained in the process of testing of chips, of SiP and, more in general, of more or less complex electronic systems.

Moreover, the communication internal network that is created in the SiP and in the electronic systems can be used also by an external user in the application and for the testing of the overall system.

It is finally to be underlined the fact that the process according to one embodiment can be advantageously used also for the SiP and however for a generic system comprising a plurality of DUT and however complex.

In this sense the various chips or DUTs of the SiP can also be realized on the same wafer, and through the RDI the testing on wafer can be made singularly for the various chips and for the system that will be then assembled as a whole.

Moreover the methodologies shown have been discussed considering particular test architectures through scan chain, that are not however to be considered as restrictive. The methodologies can be also applied to other test architectures, where instead of scan vectors and signatures other digital information are used. For example the RDI can exchange information between the ATE and the DUT so as to make BIST circuits internal to the same DUT operate. In fact it is not to be forgotten that, as it has been said, the RDI can be configured for being used on the final application.

Moreover there can be various clock domains in the single device and these clock signals can be made from circuits in the RDI by using possibly programmable counter or divider circuits in a similar way as what has been previously said.

Moreover, the specific communication/modulation/coding mode of the transceiver and/or transponder circuits is not to be considered as restrictive of the idea.

Moreover it will be clear, for a technician of the field, that the Encoder and the Decoder will be used more when the RDI is connected to a wireless or wireline interface, while they will only be used the bare minimum when the RDI is connected directly to the tester ATE, allowing for example to exchange in a quicker way the scan vectors and the signatures without requesting the Encoder and Decoder the creation of specific messages that will be used for example to exchange messages suitable for the configuration of the RDI and for talking with the Test Controller and with at least one device DUT.

Naturally, a technician of the field will be allowed to apply several modifications to the solutions previously described. It should be clear that various omissions, substitutions and modifications in the form and in the details, as well as other embodiments are possible; it is also expressly intended that the specific elements and/or process steps described in relation to any embodiment as described can be incorporated in any other embodiment as general aspects of design choices.

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for electrically testing an electronic device, the process comprising:
coupling the electronic device to an automatic testing apparatus suitable for testing digital circuits;
sending control signals through said automatic testing apparatus to electrically test said electronic device;
coupling a reconfigurable digital interface to said automatic testing apparatus and to said electronic device through a dedicated digital communication channel having a limited number of communication lines configured to exchange test information between the automatic testing apparatus and the electronic device;
testing said electronic device through said reconfigurable digital interface; and
sending from said electronic device to said automatic testing apparatus response messages containing test result data in response to said control signals, the response messages being sent through said dedicated digital communication channel.

2. The process according to claim 1, wherein at least a portion of said dedicated digital communication channel is coupled to a wireless or wireline interface.

3. The process according to claim 1, wherein said reconfigurable digital interface is one of:
a reconfigurable digital interface totally incorporated in said electronic device DUT;
a reconfigurable digital interface partially incorporated in said electronic device DUT;
a reconfigurable digital interface totally external to said electronic device DUT; and
a reconfigurable digital interface comprising a wireless interface or wireline.

4. The process according to claim 1, wherein said reconfigurable digital interface comprises a state machine comprising:

a coding circuit;
a decoding circuit;
a control circuit;
a configuration register;
a shift register of programmable and configurable length; and
a counter circuit or frequency divider.

5. The process according to claim 1, wherein said reconfigurable digital interface is configured to simultaneously test a first device and a second device comprised in said electronic device.

6. The process according to claim 5, further comprising:
resetting said reconfigurable digital interface;
programming a configuration of said reconfigurable digital interface to test the reconfigurable digital interface;
testing the reconfigurable digital interface;
programming the configuration of said reconfigurable digital interface for testing said electronic device;
testing said first device coupled to said reconfigurable digital interface RDI;
programming the configuration of said interface RDI for the testing of the second device; and
testing said second device coupled to said reconfigurable digital interface through said test control circuit.

7. An electronic device comprising:
a first circuit configured to be tested by an automatic testing apparatus;
a communication interface coupled to the first circuit and having a communication line, the communication interface being configured to receive control signals from the automatic testing apparatus for testing the first circuit, the communication interface being further configured to communicate test response messages from the first circuit to the automatic testing apparatus;
a reconfigurable digital interface RDI coupled to the first circuit and to the communication interface, the communication interface being configured to communicatively couple the reconfigurable digital interface to the automatic testing apparatus, the reconfigurable digital interface being configured to digitally interface with the automatic testing apparatus through the communication interface and to couple the first circuit to the automatic testing apparatus to facilitate testing of the first circuit by the automatic testing apparatus.

8. An electronic device according to claim 7, wherein the first circuit and the reconfigurable digital interface are formed in a first semiconductor die.

9. An electronic device according to claim 7 comprising a second circuit coupled to the reconfigurable digital interface, the reconfigurable digital interface being configured to couple the second circuit to the automatic testing apparatus to facilitate testing of the second circuit by the automatic testing apparatus.

10. An electronic device according to claim 9, wherein said reconfigurable digital interface is partially incorporated in both the first circuit and the second circuit.

11. An electronic device according to claim 9, wherein the reconfigurable digital interface includes the second circuit.

12. The device according to claim 9, wherein said first circuit and the second circuit each comprise a digital circuit block coupled to said reconfigurable digital interface.

13. An electronic device according to claim 7, wherein the first circuit comprises a digital circuit block, said reconfigurable digital interface RDI being formed in the digital circuit block.

14. An electronic device according to claim 7, wherein said reconfigurable digital interface comprises a Low Pin Count interface, configured to transmit the control signals and the test response messages, the control signals having scan vectors and signatures, the Low Pin Count interface being further configured to exchange programming signals between the automatic testing apparatus and the reconfigurable digital interface to enable the automatic testing apparatus to program the reconfigurable digital interface.

15. An electronic device according to claim 7, wherein said reconfigurable digital interface comprises a shift register configured to store data sent by any of the first circuit, the reconfigurable digital interface, and the automatic testing apparatus.

16. An electronic device according to claim 7, wherein the first circuit, the communication interface, and the reconfigurable digital interface are incorporated on a semiconductor wafer.

17. An electronic device according to claim 16, wherein a second circuit is incorporated in the semiconductor wafer, the first and the second circuits being separated from each other by scribe lines.

18. An electronic device according to claim 17, wherein said interface RDI is positioned in an area of the wafer not occupied by the first or the second circuits.

19. An electronic device according to claim 7, wherein the reconfigurable digital interface can be configured by the automatic testing apparatus according to characteristics of the automatic testing apparatus to facilitate testing of the first circuit by more than one type of automatic testing apparatus.

20. An electronic device according to claim 7, wherein the reconfigurable digital interface comprises Test Flip Flops configured to form test circuits for testing the first circuit.

21. An electronic device according to claim 7 comprising:
a second circuit, the first and second circuits being formed in respective semiconductor dies; and
a system in package structure housing the first circuit, the test circuit, and the reconfigurable digital interface.

22. A system comprising:
a first circuit;
an automatic testing apparatus configured to test a functionality of the first circuit; and
a reconfigurable digital interface coupled to the first circuit and configured to interface with the automatic testing apparatus, to receive configuration signals from the automatic testing apparatus to reconfigure the reconfigurable digital interface to enable the automatic testing apparatus to test the functionality first circuit, to communicate test signals from the automatic testing apparatus to the first circuit, and to communicate test response signals from the first circuit to the automatic testing apparatus.

23. The system of claim 22 comprising:
a semiconductor wafer, the first circuit and the reconfigurable digital interface being formed in the semiconductor wafer;
a test board; and
a probe card coupled to the test board and having probes in contact with terminations of the first circuit.

24. The system of claim 22 wherein the automatic testing apparatus sends the test signals and the configuration signals to the reconfigurable digital interface wirelessly.

25. The system of claim 24 wherein the reconfigurable digital interface sends the test response signals to the automatic testing apparatus wirelessly.

26. The system of claim 22 comprising:
a first semiconductor die housing the first circuit and the reconfigurable digital interface; and a second semiconductor die housing a second circuit and coupled to the reconfigurable digital interface, the reconfigurable digital interface configured to enable the automatic testing apparatus to test a functionality of the second circuit.

* * * * *